(12) United States Patent
Zhao et al.

(10) Patent No.: US 7,719,110 B2
(45) Date of Patent: May 18, 2010

(54) FLIP CHIP PACKAGE INCLUDING A NON-PLANAR HEAT SPREADER AND METHOD OF MAKING THE SAME

(75) Inventors: Sam Ziqun Zhao, Irvine, CA (US); Reza-ur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 38 days.

(21) Appl. No.: 11/857,274

(22) Filed: Sep. 18, 2007

(65) Prior Publication Data
US 2008/0006934 A1    Jan. 10, 2008

Related U.S. Application Data

(62) Division of application No. 10/979,155, filed on Nov. 3, 2004, now Pat. No. 7,271,479.

(51) Int. Cl.
*H01L 23/10* (2006.01)
*H01L 23/34* (2006.01)

(52) U.S. Cl. .................. 257/707; 257/704; 257/713; 257/778; 257/23.101

(58) Field of Classification Search .................. 257/707, 257/704, 713, 778, E23.101
See application file for complete search history.

(56) References Cited

U.S. PATENT DOCUMENTS

| | | | |
|---|---|---|---|
| 5,371,404 A | | 12/1994 | Juskey et al. |
| 5,891,753 A | | 4/1999 | Akram |
| 5,898,571 A | | 4/1999 | Mertol |
| 5,926,371 A | * | 7/1999 | Dolbear .................. 361/704 |
| 5,933,323 A | * | 8/1999 | Bhatia et al. .............. 361/700 |
| 5,956,576 A | * | 9/1999 | Toy et al. .................. 438/125 |
| 5,990,418 A | | 11/1999 | Bivona et al. |
| 6,008,536 A | * | 12/1999 | Mertol .................. 257/704 |
| 6,057,601 A | | 5/2000 | Lau et al. |
| 6,075,289 A | * | 6/2000 | Distefano .................. 257/732 |
| 6,084,297 A | * | 7/2000 | Brooks et al. .............. 257/698 |

(Continued)

OTHER PUBLICATIONS

Office Action and Notice of References Cited for U.S. Appl. No. 10/979,180, filed Nov. 3, 2004, Office Action mailing date of Jun. 23, 2009.

(Continued)

*Primary Examiner*—Nitin Parekh
(74) *Attorney, Agent, or Firm*—Sterne, Kessler, Goldstein & Fox, PLLC.

(57) ABSTRACT

A flip chip package generally includes a substrate, a flip chip die, and a heat spreader. The flip chip die is coupled to the substrate. The heat spreader is coupled to the flip chip die. The heat spreader can include one or more walls. Generally, the one or more walls at least partially laterally surround the flip chip die and/or the substrate. The walls can completely laterally surround the flip chip die to define a cavity in the heat spreader. The flip chip package can further include an encapsulate. For example, the encapsulate can be injected between the one or more walls of the heat spreader and the flip chip die and/or other components of the flip chip package. The encapsulate and/or the one or more walls of the heat spreader can protect one or more components of the flip chip package against moisture, corrosives, heat, or radiation, to provide some examples.

15 Claims, 53 Drawing Sheets

U.S. PATENT DOCUMENTS

| | | | |
|---|---|---|---|
| 6,118,177 | A | 9/2000 | Lischner et al. |
| 6,246,115 | B1 | 6/2001 | Tang et al. |
| 6,347,037 | B2 * | 2/2002 | Iijima et al. .................. 361/704 |
| 6,410,988 | B1 | 6/2002 | Caletka et al. |
| 6,444,498 | B1 | 9/2002 | Huang et al. |
| 6,515,870 | B1 | 2/2003 | Skinner et al. |
| 6,639,324 | B1 * | 10/2003 | Chien ......................... 257/778 |
| 6,653,730 | B2 | 11/2003 | Chrysler et al. |
| 6,819,566 | B1 | 11/2004 | Danovitch et al. |
| 6,825,108 | B2 | 11/2004 | Khan et al. |
| 6,848,912 | B2 | 2/2005 | Zhang |
| 6,849,942 | B2 | 2/2005 | Lin et al. |
| 6,853,070 | B2 | 2/2005 | Khan et al. |
| 6,861,750 | B2 | 3/2005 | Zhao et al. |
| 6,876,553 | B2 | 4/2005 | Zhao et al. |
| 6,879,039 | B2 | 4/2005 | Khan et al. |
| 6,882,041 | B1 | 4/2005 | Cheah et al. |
| 6,882,042 | B2 | 4/2005 | Zhao et al. |
| 6,887,741 | B2 | 5/2005 | Zhao et al. |
| 6,906,414 | B2 | 6/2005 | Zhao et al. |
| 6,989,593 | B2 | 1/2006 | Khan et al. |
| 7,005,737 | B2 | 2/2006 | Zhao et al. |
| 7,038,312 | B2 | 5/2006 | Khan et al. |
| 7,078,806 | B2 | 7/2006 | Khan et al. |
| 7,094,060 | B2 | 8/2006 | Zhang |
| 7,102,225 | B2 | 9/2006 | Khan et al. |
| 7,132,744 | B2 | 11/2006 | Zhao et al. |
| 7,161,239 | B2 | 1/2007 | Zhao et al. |
| 7,168,957 | B2 | 1/2007 | Zhang |
| 7,196,415 | B2 | 3/2007 | Zhong et al. |
| 7,202,559 | B2 | 4/2007 | Zhao et al. |
| 7,227,256 | B2 | 6/2007 | Zhao et al. |
| 7,241,645 | B2 | 7/2007 | Zhao et al. |
| 7,245,500 | B2 | 7/2007 | Khan et al. |
| 7,259,448 | B2 | 8/2007 | Zhang et al. |
| 7,259,456 | B2 * | 8/2007 | Wang .......................... 257/707 |
| 7,259,457 | B2 | 8/2007 | Zhang et al. |
| 7,271,479 | B2 | 9/2007 | Zhao et al. |
| 7,312,108 | B2 | 12/2007 | Zhao et al. |
| 7,326,061 | B2 | 2/2008 | Zhang |
| 2002/0012099 | A1 | 1/2002 | Miwa et al. |
| 2002/0079572 | A1 | 6/2002 | Khan et al. |
| 2002/0113306 | A1 | 8/2002 | Kwon et al. |
| 2002/0190361 | A1 | 12/2002 | Zhao et al. |
| 2002/0195701 | A1 | 12/2002 | Bemmeri et al. |
| 2003/0025180 | A1 | 2/2003 | Alcoe et al. |
| 2003/0067070 | A1 | 4/2003 | Kwon et al. |
| 2003/0146509 | A1 | 8/2003 | Zhao et al. |
| 2004/0012099 | A1 | 1/2004 | Nakayama |
| 2004/0095727 | A1 | 5/2004 | Houle |
| 2004/0238947 | A1 | 12/2004 | Rumer et al. |
| 2004/0241912 | A1 | 12/2004 | Chiu |
| 2004/0262766 | A1 | 12/2004 | Houle |
| 2005/0012203 | A1 | 1/2005 | Rahman et al. |
| 2005/0029657 | A1 | 2/2005 | Khan et al. |
| 2005/0035452 | A1 | 2/2005 | Zhang et al. |
| 2005/0040519 | A1 | 2/2005 | Huang et al. |
| 2005/0056926 | A1 | 3/2005 | Chen et al. |
| 2005/0077545 | A1 | 4/2005 | Zhao et al. |
| 2005/0127501 | A1 | 6/2005 | Khan et al. |
| 2005/0280127 | A1 | 12/2005 | Zhao et al. |
| 2005/0280139 | A1 | 12/2005 | Zhao et al. |
| 2005/0280141 | A1 | 12/2005 | Zhang |
| 2006/0065972 | A1 | 3/2006 | Khan et al. |
| 2006/0091509 | A1 | 5/2006 | Zhao et al. |
| 2006/0091542 | A1 | 5/2006 | Zhao et al. |
| 2007/0007644 | A1 | 1/2007 | Zhao et al. |
| 2007/0040267 | A1 | 2/2007 | Zhao et al. |
| 2007/0045824 | A1 | 3/2007 | Zhao et al. |
| 2007/0090502 | A1 | 4/2007 | Zhao et al. |
| 2007/0108598 | A1 | 5/2007 | Zhong et al. |
| 2007/0200210 | A1 | 8/2007 | Zhao et al. |
| 2007/0267734 | A1 | 11/2007 | Zhao et al. |
| 2007/0267740 | A1 | 11/2007 | Khan et al. |
| 2007/0273023 | A1 | 11/2007 | Zhao et al. |
| 2007/0273049 | A1 | 11/2007 | Khan et al. |
| 2007/0278632 | A1 | 12/2007 | Zhao et al. |
| 2007/0290322 | A1 | 12/2007 | Zhao et al. |
| 2007/0290376 | A1 | 12/2007 | Zhao et al. |
| 2008/0006934 | A1 | 1/2008 | Zhao et al. |

OTHER PUBLICATIONS

Advisory Action Cited for U.S. Appl. No. 10/979,180, filed Nov. 3, 2004, Advisory Action mailing date of Apr. 13, 2007.

Office Action and Notice of References Cited for U.S. Appl. No. 10/979,180, filed Nov. 3, 2004, Office Action mailing date of Jan. 6, 2009.

Final Office Action and Notice of References Cited for U.S. Appl. No. 10/979,180, filed Nov. 3, 2004, Office Action mailing date of Jul. 25, 2008.

Final Office Action and Notice of References Cited for U.S. Appl. No. 10/979,180, filed Nov. 3, 2004, Office Action mailing date of Sep. 14, 2007.

Final Office Action and Notice of References Cited for U.S. Appl. No. 10/979,180, filed Nov. 3, 2004, Office Action mailing date of Dec. 6, 2006.

Office Action and Notice of References Cited for U.S. Appl. No. 10/979,180, filed Nov. 3, 2004, Office Action mailing date of Jun. 19, 2006.

Siliconware Precision Industries, "Flip Chip Package", 5 pages, copyright Siliconware Precision Industries Co., Ltd., 2000-05.

Office Action and Notice of References Cited for U.S. Appl. No. 10/979,180, filed Nov. 3, 2004, Office Action mailing date of Jan. 5, 2010.

* cited by examiner

FLIP CHIP PACKAGE INCLUDING A NON-PLANAR HEAT SPREADER AND METHOD OF MAKING THE SAME

CROSS-REFERENCE TO RELATED APPLICATIONS

This application is a Divisional of U.S. Non-Provisional application Ser. No. 10/979,155, filed Nov. 3, 2004, now U.S. Pat. No. 7,271,479, Issue Date Sep. 18, 2007, which is herein incorporated by reference in its entirety.

BACKGROUND OF THE INVENTION

1. Field of the Invention

The present invention relates generally to integrated circuit (IC) device packaging, and more specifically to flip chip package configurations.

2. Background

An IC die is typically mounted in or on a package that is attached to a printed circuit board (PCB) or a printed wire board (PWB). One such type of IC die package is a flip chip package. Flip chip is a technology in which electrically conductive elements, such as solder bumps, connect the IC die or the IC die package to a substrate, a PCB, or a PWB. The solder bumps are formed on the bond pads of the IC die. The IC die is flipped over, so that the solder bumps are aligned with corresponding connection sites on the substrate. The solder bumps are reflow soldered to the corresponding connection sites. A flip chip IC die has pads on the active surface of the die, rather than the peripheral bond pads generally associated with a wirebond IC die. The pads on the active face of the flip chip IC die can connect to input/output (I/O), power, or ground.

A heat spreader often is attached to the non-active surface of the flip chip IC die to facilitate dissipation of heat from the flip chip IC die. The heat spreader can be adhered to the non-active surface of the flip chip IC die using a thermally conductive adhesive, for example. However, such heat spreaders rely on dissipation of heat into the ambient air, which can be inefficient.

What is needed is a flip chip package and method of making the same that addresses one or more of the aforementioned shortcomings of conventional flip chip IC dice and methods.

BRIEF SUMMARY OF THE INVENTION

The present invention provides a flip chip package including a heat spreader and method of making the same. The flip chip package further includes a substrate and an integrated circuit (IC) die. The IC die is flip chip mounted to the substrate. The substrate includes contact pads on a first surface electrically coupled through the substrate to solder ball pads on a second surface of the substrate. The IC die has first and second opposing surfaces. The second surface of the IC die is electrically coupled to the first surface of the substrate via electrically conductive elements. The substrate can have a first width. The IC die can have a second width. According to an embodiment, the second width is less than or equal to the first width.

The heat spreader is coupled to the IC die. For instance, a first surface of the heat spreader can be coupled to the first surface of the IC die. The heat spreader can have at least one wall. The at least one wall extends substantially perpendicular to the first surface of the heat spreader. A portion of the heat spreader (e.g., the at least one wall) can at least partially laterally surround the IC die and/or the substrate.

The at least one wall can define a cavity in which one or more components (e.g., the IC die, the substrate, etc.) of the flip chip package can be enclosed. For instance, the at least one wall can protect the one or more components of the flip chip package from the environment.

The flip chip package can include means to electrically and/or thermally couple the at least one wall of the heat spreader to a printed circuit board or a printed wire board, to provide some examples. The at least one wall can have a surface that is exposed. For instance, the at least one wall may not include the means to electrically and/or thermally couple the at least one wall to a printed circuit board or a printed wire board.

The heat spreader can be in contact with the first surface of the substrate. For instance, the at least one wall can be coupled to the first surface of the substrate. The heat spreader can include a securing feature, such as a tab or an indentation. For example, the securing feature can secure encapsulate in the cavity defined by the heat spreader.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE INVENTION 1.0 Overview

The present invention is directed to a flip chip package including a heat spreader and method of making the same. A flip chip package has many advantages, as compared to a die-up package. A flip chip package generally requires fewer or no wirebonds extending from the flip chip die to the substrate of the package. The flip chip package can often accommodate a larger die. The flip chip package can have a lower on-chip inductive voltage (IR) drop. An online tutorial of flip chip technology can be found at http://www.flipchips.com/tutorials.html and is incorporated herein by reference in its entirety.

Although the embodiments of the invention described herein refer specifically, and by way of example, to flip chip ball grid array (BGA) packages, it will be readily apparent to persons skilled in the relevant art(s) that the invention is equally applicable to other flip chip packages, including but not limited to pin grid array (PGA) packages and land grid array (LGA) packages. It will also be readily apparent to persons skilled in the relevant art(s) that the invention is applicable to flip chip packages having any suitable type of substrate, including but not limited to Bismalemide Triazine (BT), ceramic, FR4, glass, organic, plastic, tape (flex), and Teflon substrates. The substrate can be a buildup substrate or a high density substrate, to provide some other examples. The substrate can have one routing layer or two or more routing layers. Furthermore, features of the present invention may be implemented in non-flip chip package configurations and in any package, die, or cavity orientation, including die-up, die-down, cavity-up, and cavity-down configurations.

Furthermore, note that elements of the packages described herein can be combined in any manner to form further package configurations.

2.0 Flip Chip Package

Figure 1:
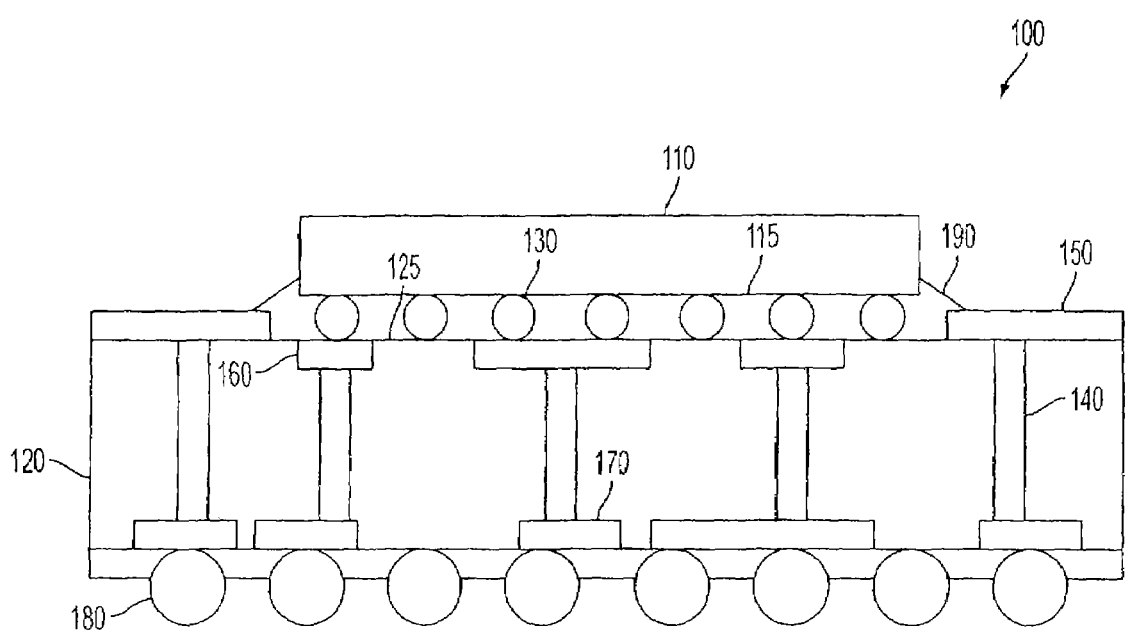
FIG. 1 illustrates a cross-sectional view of an exemplary flip chip ball grid array (BGA) package.

FIG. 1 illustrates a cross-sectional view of an exemplary flip chip ball grid array (BGA) package 100. Flip chip BGA package 100 includes a flip chip die 110 coupled to a first surface 125 of a substrate 120 via solder bumps 130. For example, flip chip BGA package 100 can be a plastic BGA (PBGA) package having a solder bumped flip chip die on a BT resin substrate, as described in J. H. Lau, "Ball Grid Array Technology", McGraw-Hill, New York, 1995, pp. 31-33.

The surface of flip chip die 110 that is in contact with solder bumps 130 can be referred to as a circuitized surface 115 of flip chip die 110. Circuitized surface 115 often includes power and ground distribution rails. At least one of solder bumps 130 can be connected to a power distribution rail or a ground distribution rail of circuitized surface 115, though the scope of the invention is not limited in this respect. According to an embodiment, at least one of solder bumps 130 is directly connected to a power/ground distribution rail.

A plurality of solder bumps 130 can be distributed across circuitized surface 115 of flip chip die 110 to respectively connect the power and ground distribution rails of flip chip die 110 to power and ground connections of a printed circuit board (PCB), for example. In this example, an IR (i.e., current×resistance) drop associated with wirebonding power/ground distribution rails of a die to power/ground connections of the PCB, for instance, can be reduced or eliminated. Solder bumps 130 can allow more power/ground connections between flip chip die 110 and substrate 120, as compared to the number of power/ground connections available in a wirebond package, to reduce the package-level inductive voltage drop.

A wirebond typically has an inductance of approximately 1-4 nH. A solder bump 130 can have an inductance of approximately 0.1-0.2 nH. The lower inductance of solder bumps 130 as compared to wirebonds can improve the integrity of a signal passing from flip chip die 110 to substrate 120, or vice versa.

In the embodiment of FIG. 1, vias 140 connect solder bumps 130, traces, and/or pads 150 at first surface 125 of substrate 120 to solder balls 180 at a second surface of substrate 120. As shown in FIG. 1, substrate 120 can include a first plurality of contact pads 160 and a second plurality of contact pads 170. First plurality of contact pads 160 is connected to solder bumps 130 at first surface 125 of substrate 120. Second plurality of pads 170 is connected to solder balls 180 at the second surface of substrate 120. Solder balls 180 can electrically connect flip chip BGA package 100 to any suitable surface having electrically conductive connections, such as a PCB.

A mismatch can occur between the coefficient of thermal expansion (CTE) of flip chip die 110 and substrate 120. For example, flip chip die 110 can be made of silicon (Si) having a CTE of $2.5 \times 10^{-6}/°$ C. Substrate 120 can be made of BT having a CTE of $15 \times 10^{-6}/°$ C. An underfill encapsulant 190 can reduce the stress and/or strain associated with the mismatch between the CTEs of flip chip die 110 and substrate 120. For example, underfill encapsulant 190 can distribute stresses and/or strains across the entire volume of underfill encapsulant 190 that otherwise might be concentrated entirely at solder bumps 130. Underfill encapsulant 190 can relieve stress or strain at solder bumps 130 near the corners of flip chip die 110, for instance. Underfill encapsulant 190 can reduce an amount of moisture that contacts circuitized surface 115 of flip chip die 110.

Referring to FIG. 1, flip chip die 110 is mostly exposed to the environment (i.e., to the ambient). The backside, edges, and corners of flip chip die 110 can be damaged during handling or during assembly of flip chip BGA package 100. In the embodiment of FIG. 1, flip chip die 110 and substrate 120 are susceptible to electromagnetic interference (EMI). Environmental factors, such as moisture, corrosives, heat, and radiation, can negatively impact the interface between underfill encapsulant 190 and flip chip die 110 or the interface between underfill encapsulant 190 and substrate 120.

Because the exposed surface of flip chip die 110 is relatively small as compared to the size of flip chip BGA package 100, convective and radiative heat transfer from flip chip die 110 to the ambient may not be effective. For instance, the limited surface area that is available for heat dissipation may not sufficiently dissipate heat from flip chip die 110. Thermal performance of flip chip BGA package 100 can be similar to that of a conventional wire bond PBGA package.

Figure 2:
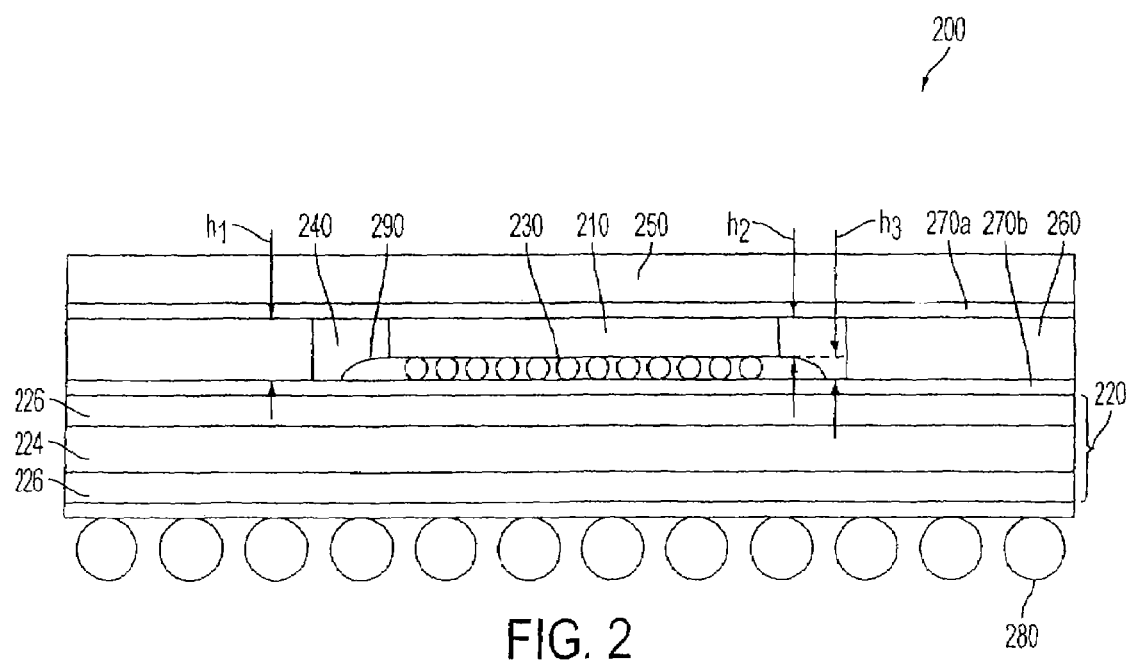
FIG. 2 illustrates a cross-sectional view of an exemplary flip chip BGA package that includes a heat spreader and a stiffener.

Thermal performance of flip chip BGA package 100 can be improved by connecting a heat spreader to the backside of flip chip die 110. FIG. 2 illustrates a cross-sectional view of an exemplary flip chip BGA package 200 that includes a heat spreader 250 and a stiffener 260. Referring to FIG. 2, flip chip BGA package 200 includes a flip chip die 210 that is electrically coupled to a substrate 220 through electrically conductive elements 230, such as solder bumps. In the embodiment of FIG. 2, substrate 220 is a buildup high-density substrate for illustrative purposes. Substrate 220 includes a core substrate layer 224 disposed between first and second buildup layers 226.

In FIG. 2, flip chip die 210 is encapsulated in a cavity 240 defined by substrate 220, heat spreader 250, and stiffener 260. Cavity 240 generally surrounds/houses flip chip die 210, electrically conductive elements 230, and an underfill resin 290. Heat spreader 250 is coupled to the backside of flip chip die 210. An adhesive 270a typically adheres heat spreader 250 to flip chip die 210. Adhesive 270a can be a pliable, thermally conductive material, such as thermal grease.

Stiffener 260 is coupled between heat spreader 250 and substrate 220. For instance, adhesive 270a or another adhesive can adhere stiffener 260 to heat spreader 250. Adhesive 270b adheres stiffener 260 to substrate 220. Adhesives 270a and 270b can be the same or different.

Underfill resin 290 can be injected between flip chip die 210 and substrate 220 before heat spreader 250 is attached to stiffener 260 and flip chip die 210, though the scope of the invention is not limited in this respect. For instance, underfill resin 290 can be injected between flip chip die 210 and/or substrate 220 in response to heat spreader 250 being attached to stiffener 260 and/or flip chip die 210.

Although stiffener 260 appears as two separate stiffeners in the cross-sectional representation of FIG. 2, stiffener 260 generally represents a single, concentric stiffener. Flip chip BGA package 200 can include any suitable number of stiffeners. The thickness of stiffener 260, $h_1$, is generally slightly greater than the thickness of flip chip die 220, $h_2$, plus the thickness of a solder bump 230, $h_3$, as described in C. Cohn and M. T. Shih, Chapter 7 of "Electronic Packaging and Interconnection Handbook", $3^{rd}$ ed. by C. A. Harpper, McGraw-Hill, New York, 2000, pp. 7.58-7.59, which is incorporated herein by reference in its entirety. For instance, the slightly greater thickness of stiffener 260 can reduce the likelihood of forces associated with heat spreader 250 or substrate 220 damaging flip chip die 210.

Heat generated by flip chip die 210 is conducted through adhesive 270 to heat spreader 250. The heat spreads through the volume of heat spreader 250 and transfers to the surrounding ambient.

Figure 3:
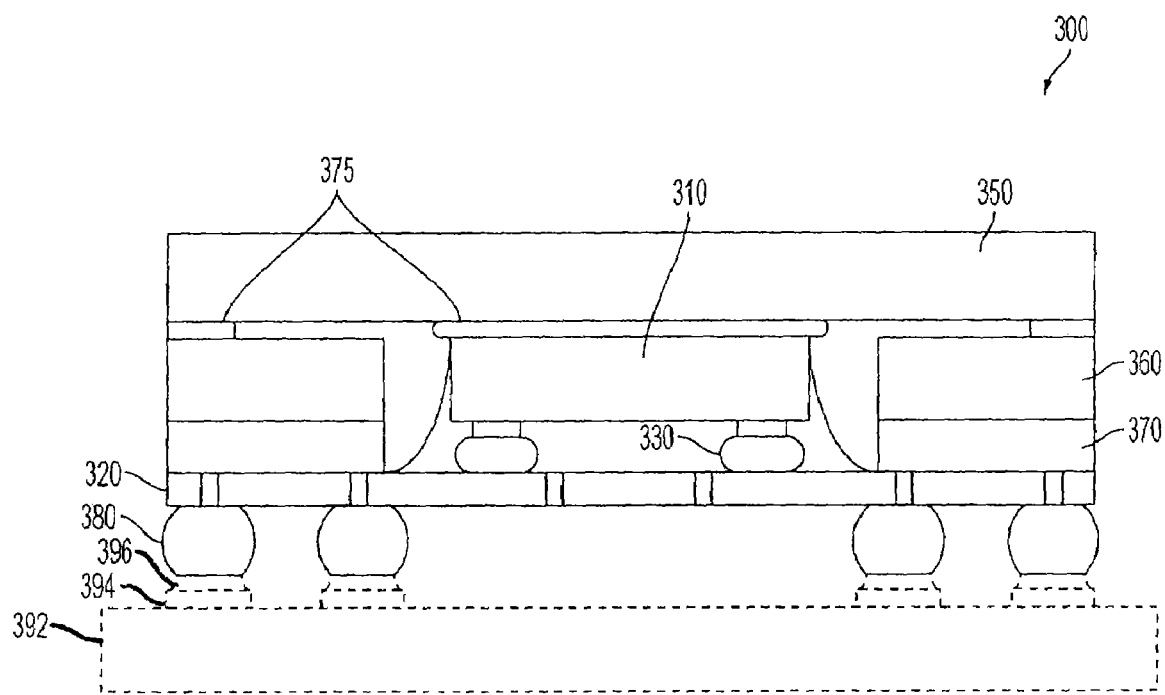
FIG. 3 illustrates a cross-sectional view of an exemplary flip chip BGA package having a tape substrate.

FIG. 3 illustrates a cross-sectional view of an exemplary flip chip BGA package 300 having a tape substrate 320. Flip chip BGA package 300 is mounted to a PCB 392 for illustrative purposes. Solder balls 380 of flip chip BGA package 300 are coupled to pads 394 of PCB 392 via solder plating 396. Any solder composition types can be used. For instance, solder balls 380 can have a composition of approximately 90% lead (Pb) and 10% tin (Sn). Solder plating 396 can have a composition of approximately 37% Pb and 63% Sn. Solder bumps 330 that couple flip chip die 310 to a tape substrate 320 can have a composition of approximately 95% Pb and 5% Sn. The exemplary compositions of solder balls 380, solder plating 396, and solder bumps 330 are provided for illustrative purposes and are not intended to limit the scope of the present invention.

In FIG. 3, tape substrate 320 can be a copper/Upilex/copper (Cu/Upilex/Cu) substrate, for example. A stiffener adhesive 370 couples a stiffener ring 360 to tape substrate 320. Stiffener ring 360 can physically support tape substrate 320 and heat spreader 350. A thermal adhesive 375 couples stiffener ring 360 and flip chip die 310 to heat spreader 350.

By coupling heat spreaders 250 and 350 to their respective flip chip BGA packages 200 and 300, the ability of flip chip BGA packages 200 and 300 to dissipate heat is substantially improved. Using stiffener 260 or stiffener ring 360 to support respective heat spreader 250 or 350 can introduce multiple interfaces into respective flip chip BGA package 200 or 300. For instance, an electrical interface exists between substrate 220, 320 and respective solder balls 280, 380. Epoxy adhesive 270a provides a first adhesive interface between heat spreader 250, 350 and stiffener 260 or stiffener ring 360. Adhesive 270b provides a second adhesive interface between stiffener 260 or stiffener ring 360 and respective substrate 220, 320. According to an embodiment, epoxy adhesive 270a and/or adhesive 270b are thermally conductive. For instance, epoxy adhesive 270a and/or adhesive 270b can facilitate the transfer of heat from flip chip die 210. A thermal interface can exist between heat spreader 250, 350 and the backside surface of respective flip chip die 210, 310. For example, flip chip BGA package 200, 300 can include multiple pieces, such as the two-piece heat spreader flip chip package, as described in Amkor package data sheet, "Super FC®", http://www.amkor.com/Products/all_datasheets/superfc.pdf, January 2003.

A flip chip package having more interfaces and different adhesives can require more steps during the manufacturing process than a flip chip package having a single interface and a single adhesive, for example. An increase in the number of processing steps required to assemble flip chip BGA packages 200, 300 can increase assembly cost and lead time. Assembly yield generally is inversely proportional to assembly complexity and to the number of steps required to assemble BGA packages. The number of field failures typically is directly proportional to the structural complexity of the BGA package and to the number of interfaces between structural components of the BGA package.

Adhesive 270, 375 between heat spreader 250, 350 and stiffener 260 or stiffener ring 360 may not be strong enough to support the attachment of an external heat sink to heat spreader 250, 350 using an adhesive thermal interface material. The contact area between the external heat sink and heat spreader 250, 350 is usually greater than the contact area between heat spreader 250, 350 and stiffener 260 or stiffener ring 360. If adhesive 270, 375 between heat spreader 250, 350 and stiffener 260 or stiffener ring 375 and the adhesive between the external heat sink and heat spreader 250, 350 are the same, for example, the bonding force between the external heat sink and heat spreader 250, 350 can be greater than the bonding force between heat spreader 250, 350 and stiffener 260 or stiffener ring 360. The interface between the external heat sink and heat spreader 250, 350 can be stronger than the interface between heat spreader 250, 350 and stiffener 260 or stiffener ring 360. Thus, adhesive 270, 375 can have a stronger adhesion than the adhesive between the external heat sink and heat spreader 250, 350 to compensate for the greater contact area between the external heat sink and heat spreader 250, 350, as compared to the contact area between heat spreader 250, 350 and stiffener 260 or stiffener ring 360.

If an external heat sink is glued to heat spreader 250, 350, tensile and shear stresses induced on the external heat sink can be transferred to the interface between heat spreader 250, 350 and stiffener 260 or stiffener ring 360. These stresses can be in response to a shock or vibration imposed upon flip chip BGA package 200, 300 while reworking a component of flip chip BGA package 200, 300, during a field test, or during operation of flip chip BGA package 200, 300, to provide some examples. The induced stresses can break the interface bond between heat spreader 250, 350 and stiffener 260 or stiffener ring 360, for example, which is sometimes referred to as delamination of heat spreader 250, 350. Heat spreader 250, 350 can decouple from stiffener 260 or stiffener ring 360 before the external heat sink can be separated from heat spreader 250, 350. A heat spreader having a larger surface area (e.g., 35 mm×35 mm) is generally more likely to delaminate from stiffener 260 or stiffener ring 360 than a heat spreader having a smaller surface area (e.g., 30 mm×30 mm).

Interfaces of a flip chip BGA package 100, 200, 300 described above with respect to FIGS. 1-3, respectively, can be exposed to the environment. Moisture, radiation, heat, or corrosives from the environment can weaken the interfaces, compromising the structural integrity of flip chip BGA package 100, 200, 300. For instance, exposure of the interfaces to the environment can lead to delamination of heat spreader 250, 350 as described with respect to FIGS. 2 and 3, respectively.

Figure 4:
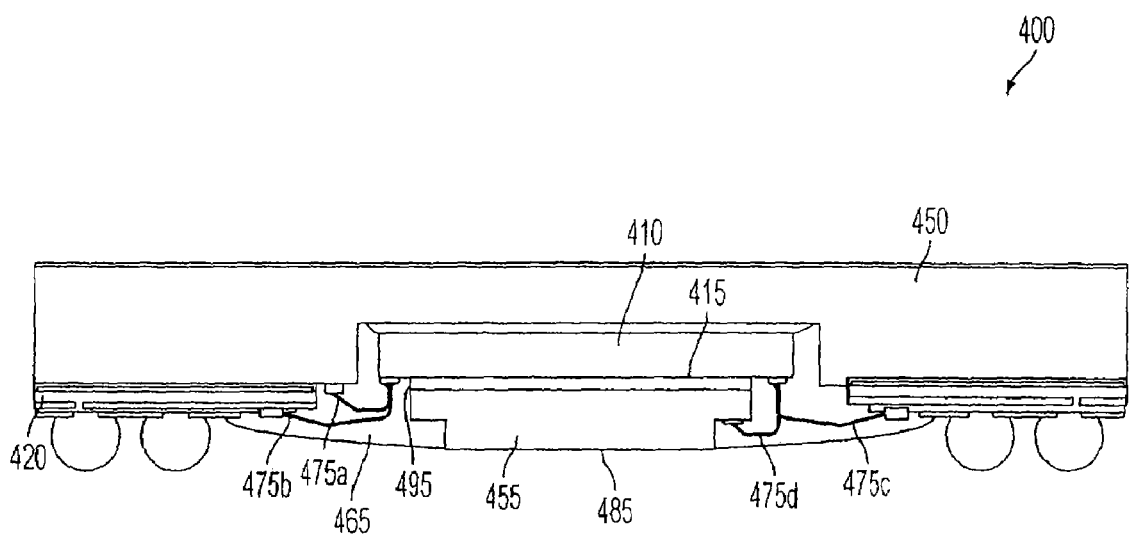
FIG. 4 illustrates a cross-sectional view of an exemplary flip chip BGA package having a drop-in heat spreader.

FIG. 4 illustrates a cross-sectional view of an exemplary flip chip BGA package 400 having a drop-in heat spreader 455. In the embodiment of FIG. 4, a heat spreader 450 includes a cavity in which a flip chip die 410 is coupled to heat spreader 450. A substrate 420 is attached to heat spreader 450 on the same surface of heat spreader 450 as the cavity. Substrate 420 has a central opening that coincides with the cavity. Drop-in heat spreader 455 is coupled to a circuitized surface 415 of die 410. Flip chip BGA package 400 having heat spreader 450 and drop-in heat spreader 455 typically dissipates heat more effectively than a flip chip BGA package that does not include drop-in heat spreader 455.

A drop-in heat spreader can be incorporated into a die-up BGA package, as described in U.S. Pat. No. 6,552,428 to Huang et al., which is incorporated herein by reference in its entirety. For instance, utilizing a drop-in heat spreader in a die-up BGA package can improve the thermal performance of the die-up BGA package.

Drop-in heat spreader 455 can be encapsulated in an encapsulate 465, as described in U.S. Patent App. No. 2002/0109226 to Khan et al., which is incorporated herein by reference in its entirety. An encapsulate 465 can be applied using a glob top, injection molding, strip molding, or panel molding operation, to provide some examples. Encapsulate 465 is often used in non-hermetic packages, for example, to protect a flip chip die from the environment. Drop-in heat spreader 455 can promote spreading of heat within encapsulate 465.

Referring to FIG. 4, a wirebond 475a electrically couples die 410 to heat spreader 450. Wirebonds 475b and 475c couple die 410 to substrate 420. A wirebond 475d couples die 410 to drop-in heat spreader 455. For example, drop-in heat spreader 455 can be used as a power plane or a ground plane of flip chip BGA package 400 by coupling power or ground pads of die 410 to drop-in heap spreader 455.

In the embodiment of FIG. 4, the periphery of die 410 is connected to the periphery of drop-in heat spreader 455 using wirebonds, though the scope of the invention is not limited in this respect. For instance, drop-in heat spreader 455 can include an opening through which a central region of die 410 can be electrically connected to drop-in heat spreader 455.

As shown in FIG. 4, a surface 485 of drop-in heat spreader 455 can be exposed to the environment (i.e., not covered by an encapsulate 465). Surface 485 can be soldered to a PCB, for example. Solder can be used to couple a power or ground connection of drop-in heat spreader 455 to a power or ground connection, respectively, of the PCB. Surface 485 of drop-in heat spreader 455 can be soldered to the PCB during or after a surface mount operation that electrically couples substrate 420 to the PCB, though the scope of the present invention is not limited in this respect.

Direct contact between flip chip die 400 and drop-in heat spreader 455 can damage circuitized surface 415 of die 410 and/or wirebonds coupled to die 410. Such direct contact can short conductive lines of circuitized surface 415 with each other or with a wirebond 475. U.S. Pat. No. 5,977,626 to Wang et al., which is incorporated herein by reference in its entirety, describes embodiments that address such issues.

Referring to FIG. 4, a direct electrical connection between drop-in heat spreader 455 and a power/ground pad of die 410 may not be desirable. For instance, such an electrical connection can damage or short-circuit circuitized surface 415 of die 410. Drop-in heat spreader 455 and die 410 may be separated by an electrically insulating material, such as encapsulate 465, and/or an organic substrate 495. Heat dissipated from die 410 typically penetrates encapsulate 465 and/or organic substrate 495 to reach drop-in heat spreader 455. The thermal conductivity of encapsulate 465 can be in a range of approximately 0.5-0.9 W/m·° C., for example. The thermal conductivity of organic substrate 495 can be in a range of approximately 0.2-2.0 W/m·° C., for example. These exemplary thermal conductivity values are substantially less than the thermal conductivity value of copper (approximately 400 W/m·° C.) or aluminum (approximately 180 W/m·° C.). Heat from die 410 can accumulate more quickly than the heat can transfer through encapsulate 465 and/or organic substrate 495 to drop-in heat spreader 455. Thus, die 410 may undesirably overheat, adversely affecting performance.

Figure 5:
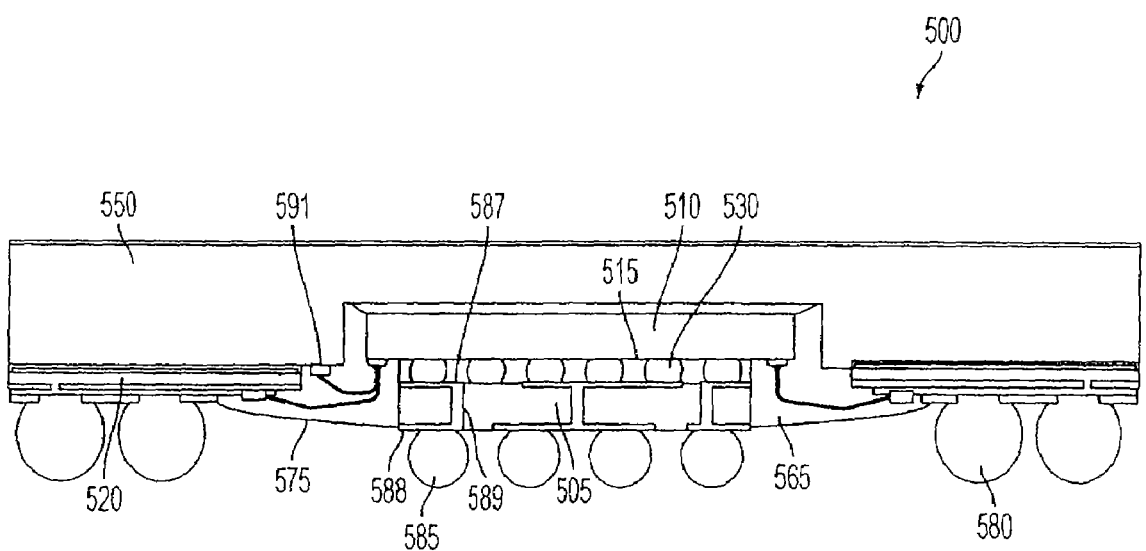
FIG. 5 illustrates a cross-sectional view of an exemplary cavity down array package having an interposer substrate.

FIG. 5 illustrates a cross-sectional view of an exemplary cavity down array package 500 having an interposer substrate 505 according to an embodiment of the present invention. Cavity down array package 500 can be a BGA, a PGA, or a LGA, to provide some examples. Package 500 is generally similar to package 400 of FIG. 4, with some differences described in the following paragraphs.

Referring to FIG. 5, cavity down array package 500 surrounds/houses a flip chip die 510 coupled through electrically conductive elements 530, such as solder bumps, to interposer substrate 505. Package 500 is more fully described in U.S. patent application Ser. No. 10/952,172 to Khan et al., which is incorporated herein by reference in its entirety. For instance, electrically conductive elements 530 can be disposed on a first surface of interposer substrate 505. Interposer substrate 505 can be made from a planar PCB, a tape, or an electrically conductive plate, to provide some examples. For instance, interposer substrate 505 can be a copper plate.

An encapsulate compound 565 usually covers flip chip die 510 and wirebonds 575. An encapsulate compound 565 can at least partially cover interposer substrate 505, as shown in FIG. 5. Encapsulate compound 565 can protect flip chip die 510, interposer substrate 505, and/or wirebonds 575 from the environment. A second surface of interposer substrate 505 can be partially or entirely exposed (i.e., not covered by encapsulate compound 565) to connect package 500 to a PWB or a PCB. For instance, at least one of solder pads 588 can be exposed.

Electrically conductive elements 530 are coupled to contact pads 587 at the first surface of interposer substrate 505. Contact pads 587 are electrically coupled to metal pads 588 at the second surface of interposer substrate 505 through vias 589. Solder balls 585 can connect metal pads 588 to a printed wire board (PWB), for example. Any suitable electrically conductive means can be used to connect metal pads 588 to the PWB. For example, electrically conductive columns or pins can couple metal pads 588 of interposer substrate 505 to the PWB. In another example, metal pads 588 can be directly soldered to the PWB. Solder paste can be printed at corresponding locations/pads of the PWB.

Interposer substrate 505 can deliver power to a center portion of flip chip die 510. In the embodiment of FIG. 5, circuitized surface 515 of flip chip die 510 has an area that is greater than the area of the first surface of interposer substrate 505. One or more bond pads 591 can be disposed along the periphery of circuitized surface 515 of flip chip die 510. A wirebond can connect a bond pad 591 to another component of package 500, such as substrate 520 or heat spreader 550. Substrate 520 can be coupled to the PWB through peripheral solder balls 580. For example, solder balls 585 and peripheral solder balls 580 can be attached simultaneously. In another example, solder balls 585 and peripheral solder balls 580 can be attached separately.

Figure 6:
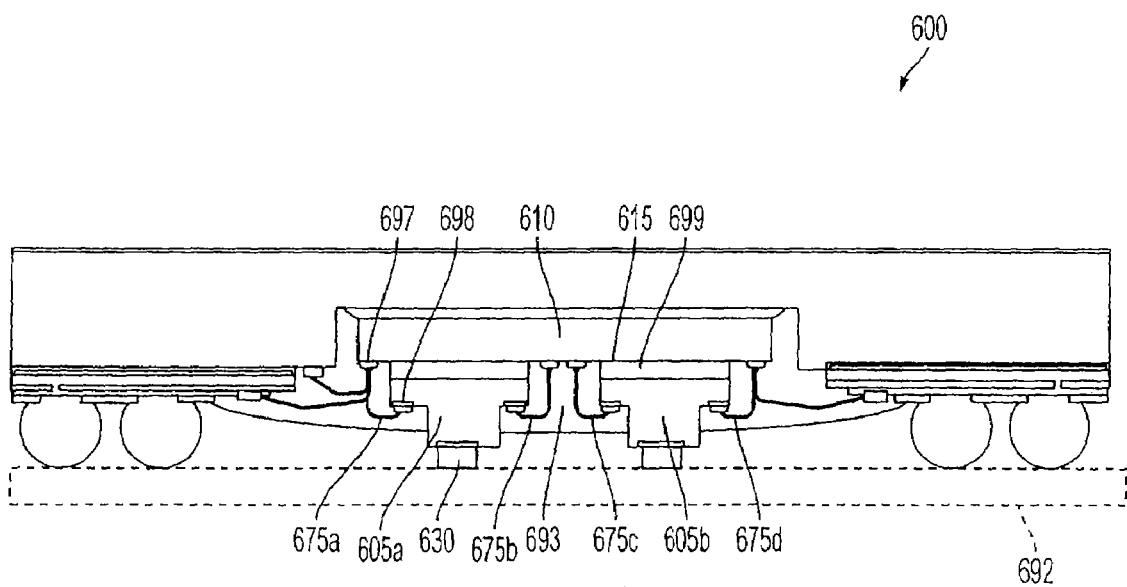
FIG. 6 illustrates a cross-sectional view of an exemplary cavity down array package having an interposer substrate wirebonded to a flip chip die.

FIG. 6 shows an example package 600 generally similar to package 500 shown in FIG. 5, with some differences described as follows. In FIG. 6, wirebonds 675a, 675b, 675c, and 675d (hereinafter 675) electrically couple an interposer substrate 605a and 605b (hereinafter 605) to an integrated circuit (IC) die 610, as described in U.S. patent application Ser. No. 10/952,172 to Khan et al. Interposer substrate 605 has a centrally located opening 693. For instance, wirebonds 675b and 675c extend through an opening 693 from IC die 610 to be coupled to interposer substrate 605.

Bond pads can be disposed at the surface of interposer substrate 605 to facilitate electrically coupling interposer substrate 605 to other components of package 600. For instance, wirebond 675a can connect contact pad 698 at a surface of interposer substrate 605 to contact pad 697 at a circuitized surface 615 of IC die 610. A thermal interface material 699 typically is disposed between IC die 610 and interposer substrate 605. Thermal interface material 699 can be an adhesive tape, an adhesive film, or an epoxy, to provide some examples. A solder paste 630 can electrically couple interposer substrate 605 to a PWB, for example.

3.0 Example Embodiments for Improved Integrated Circuit Packages

Described below are embodiments for integrated circuit packages having improved thermal and/or electrical capabilities. These embodiments are provided for illustrative purposes and are not intended to limit the scope of the present invention.

Figure 7:
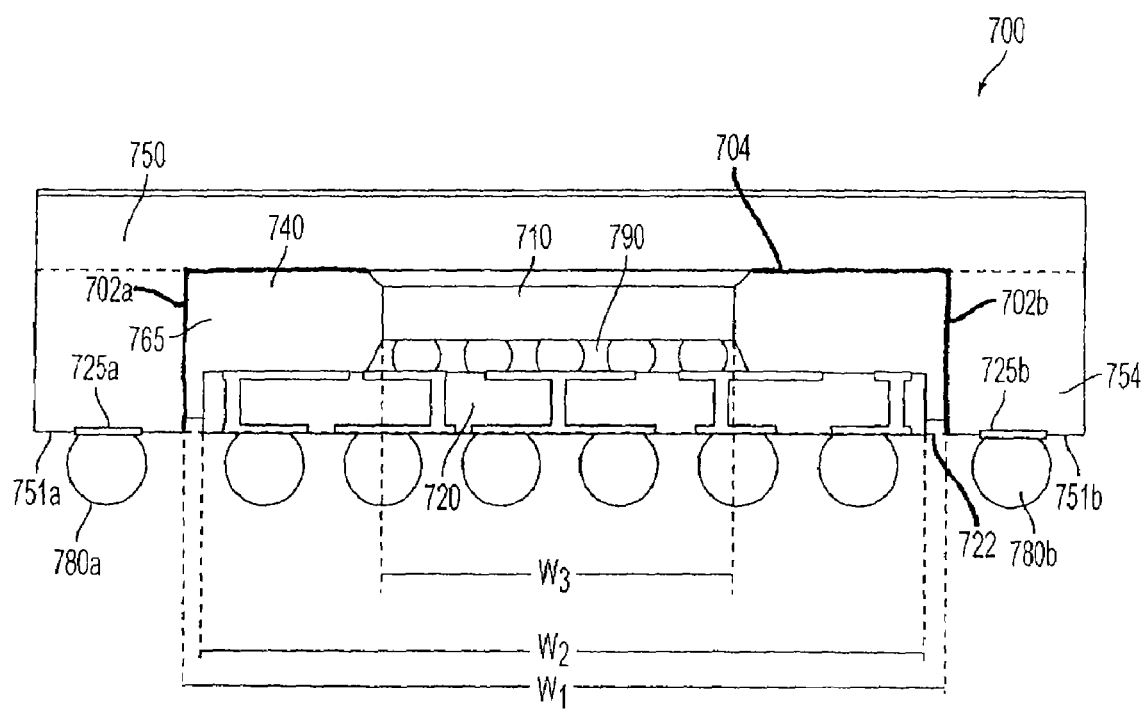
FIG. 7 illustrates a cross-sectional view of an exemplary flip chip BGA package that includes a heat spreader having a cavity according to an embodiment of the present invention.

3.1 Integrated Circuit Package Having Cavity at Least Partially Filled with Encapsulate FIG. 7 illustrates a cross-sectional view of an exemplary flip chip BGA package 700 that is similar to package 100 in FIG. 1, with at least the following differences. Package 700 includes a heat spreader 750 having a cavity 740 according to an embodiment of the present invention. In the embodiment of FIG. 7, width $W_1$ of cavity 740 is greater than the width $W_2$ of a substrate 720 and greater than the width $W_3$ of a flip chip die 710, though the scope of the invention is not limited in this respect. Thus, cavity 740 encloses die 710 and substrate 720 of package 700.

Heat spreader 750 is a one-piece heat spreader for illustrative purposes. Heat spreader 750 can alternatively have any suitable number of pieces. Heat spreader 750 is wider than substrate 720 to provide a greater surface area for heat dissipation, for example, as compared to a BGA package having a substrate that is at least as wide as the heat spreader. Having a heat spreader 750 that is wider than substrate 720 can reduce thermal stress in package 700.

Heat spreader 750 can reduce environmental stress imposed upon package 700. For instance, heat spreader 750 can protect die 710 from an impact or a vibration. Heat spreader 750 can reduce the number of times die 710 provides an erroneous signal or fails to operate based on interference, such as microphonics. Metal traces on die 710 have electrical characteristics, such as resistance, capacitance, and inductance. Vibration, mechanical shock, or change of temperature (sometimes referred to as thermal shock) can change the distribution of stresses within package 700. This change can alter the capacitance and/or resistance of the traces, such that a vibration or a drift occurs with respect to a voltage or a current at one or more of the traces. Heat spreader 750 can reduce the effect of a vibration, mechanical shock, or change of temperature on the electrical characteristics of the traces, for example.

In FIG. 7, heat spreader 750 includes a rim 754 having bottom surfaces 751a and 751b. For instance, rim 754 can be a ring that surrounds components (e.g., die 710, substrate 720, etc.) of package 700. According to an embodiment, cavity 740 is defined by laterally opposed surfaces 702a and 702b, an upper surface 704, and a plane 722 that extends between the intersection of surfaces 702a and 751a and the intersection of surfaces 702b and 751b of heat spreader 750. In an embodiment, cavity 740 is further defined as excluding those spaces occupied by a component of package 700, such as die 710, substrate 720, an underfill 790, etc. Two other lateral surfaces of cavity 740 are not shown in FIG. 7.

Referring to FIG. 7, an encapsulate 765 at least partially fills cavity 740. Encapsulate 765 is defined as a material that seals and/or covers a component or circuit to provide mechanical and/or environmental protection. Encapsulate 765 can protect die 710, substrate 720, and/or the interconnections of package 700, to provide some examples. Encapsulate 765 can be epoxy, molding compound, or any other encapsulating material.

Heat spreader 750 can be electrically, thermally, and/or mechanically coupled to a PCB or a PWB. For instance, heat spreader 750 can be coupled to a PCB through at least one electrically conductive element, such as solder ball 780a or 780b or an electrically conductive epoxy. The electrically conductive element can reduce electrical impedance and/or thermal resistance between heat spreader 750 and the PCB. In FIG. 7, solder ball 780a is coupled to pad 725a at surface 751a of heat spreader 750, and solder ball 780b is coupled to pad 725b at surface 751b of heat spreader 750.

Figure 8:
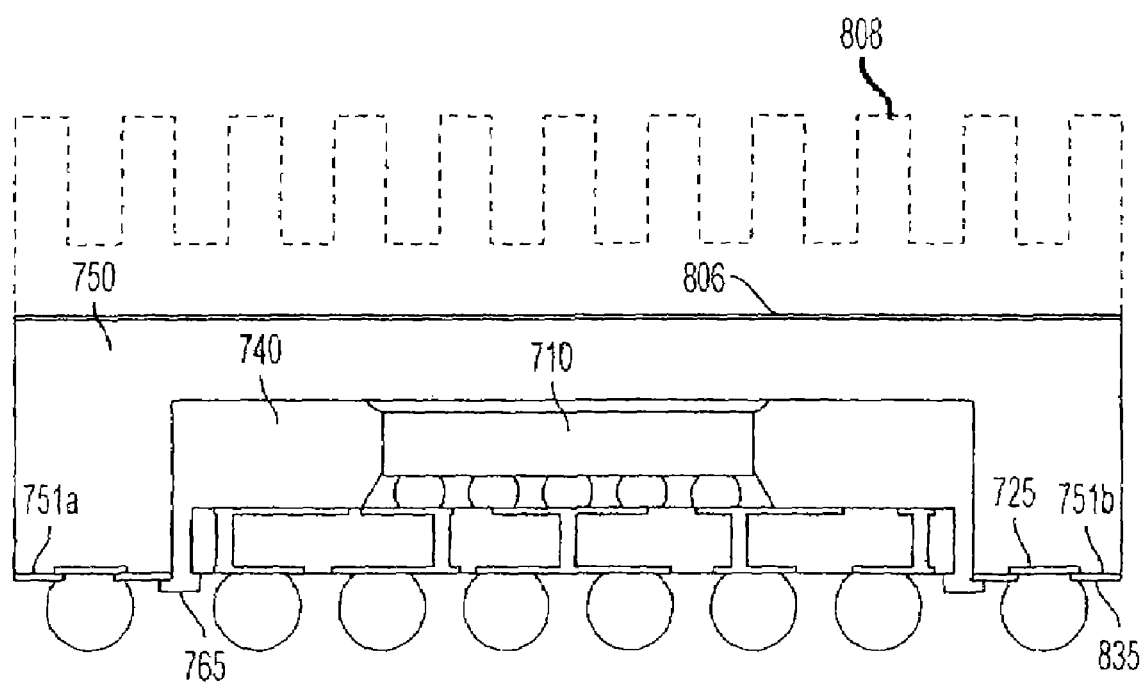
FIG. 8 illustrates a cross-sectional view of an exemplary flip chip BGA package that includes a solder mask according to an embodiment of the present invention.

Heat spreader 750 can be fabricated from any suitable metal, such as copper, aluminum, an alloy thereof, or other metal. A pad, such as pad 725a or 725b, can be provided on heat spreader 750 using a metal plating process, for example. Any other suitable means can be used to provide the pad on heat spreader 750. The pad can be gold, nickel, silver, solder, or other metal applied directly to surface 751 of heat spreader 750. The pad can be defined using a solder mask 835, as shown in FIG. 8. Solder mask 835 generally covers surface 751 of heat spreader 750, except those areas at which pads, such as pads 725a and 725b (hereinafter 725), are located. In FIG. 8, solder mask 835 includes openings to accommodate pads 725. Any number of pads may be formed on surface 751. Solder or silver can be used to facilitate wetting of solder on the pad.

Heat spreader 750 having a cavity 740 generally provides structural integrity to package 700. Attaching heat spreader 750 to a PCB or a PWB, for example, can provide further structural integrity to package 700. Typical values of modulus of elasticity are approximately 20 gigapascals (GPa) for a cured encapsulate compound, 15 GPa for a BT high-density substrate, and 125 GPa for copper, to provide some examples. Thus, heat spreader 750 has a higher modulus of elasticity than at least some other components of package 700.

Support provided by heat spreader 750 and/or encapsulate 765 can improve the planarity of substrate 720. For example, including heat spreader 750 and/or encapsulate 765 in package 700 can reduce warping of substrate 720. In another example, the rigidity of heat spreader 750 and/or the support of encapsulate 765 can reduce cracking of die 710 or delamination of heat spreader 750 from die 710.

Referring to FIG. 8, encapsulate 765 completely fills cavity 740. In an embodiment, a surface 806 of heat spreader 750 is substantially planar to facilitate attachment of an external heat sink 808. External heat sink 808 can be any suitable shape to facilitate heat dissipation from die 710.

Figure 9:
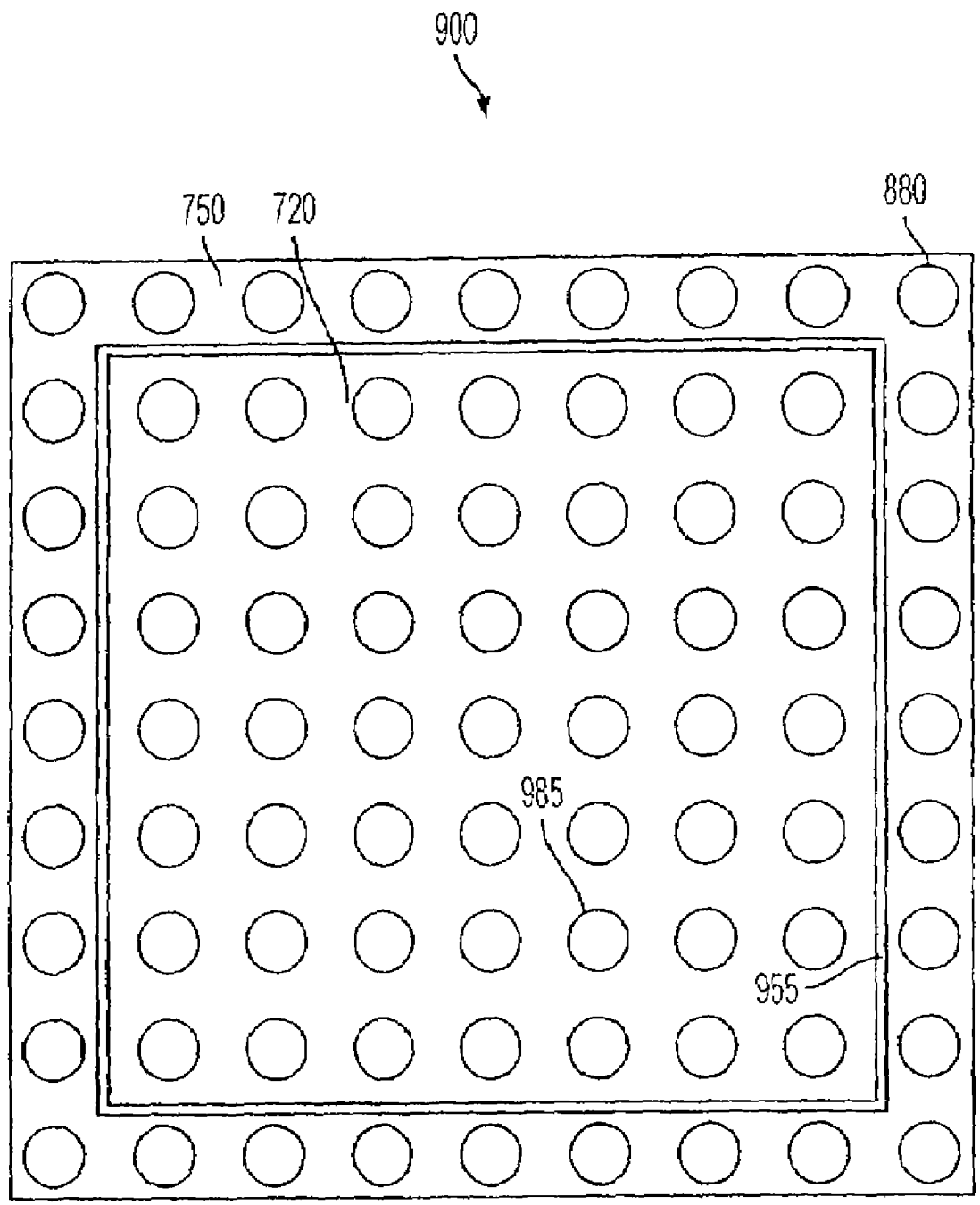
FIG. 9 illustrates a bottom view of an exemplary flip chip BGA package in which a gap extends along four edges of a substrate according to an embodiment of the present invention.

FIGS. 9-15 illustrate bottom views of an exemplary flip chip BGA packages according to embodiments of the present invention. Package 900 includes peripheral solder balls 880 disposed along periphery surface 751 of heat spreader 750 to provide an electrical connection between heat spreader 750 and a PWB when package 900 is mounted to the PWB, for example. In FIG. 9, peripheral solder balls 880 are linearly disposed along all four edges of surface 751 of heat spreader 750. Solder balls 985 couple substrate 720 to the PWB when mounted thereto.

Figure 10:
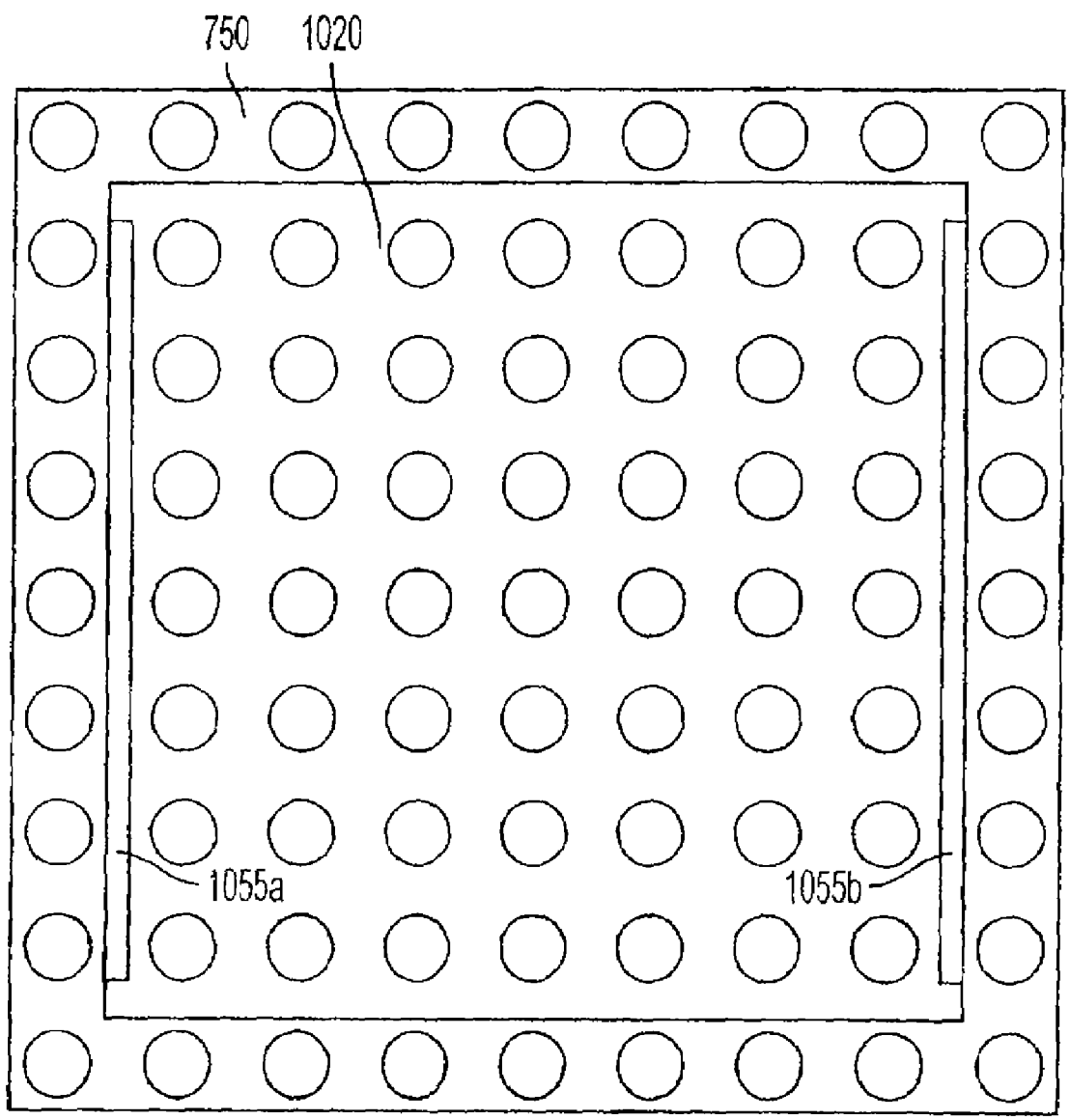
FIG. 10 illustrates a bottom view of an exemplary flip chip BGA package in which gaps extend along two opposing edges of a substrate according to an embodiment of the present invention.

In FIG. 9, a gap 955 between substrate 720 and heat spreader 750 extends along all four edges of substrate 720. Gap 955 can be partially or entirely filled with encapsulate. In FIG. 10, gaps 1055a and 1055b extend along two opposing edges of a substrate 1020. The other two edges of substrate 1020 are closely adjacent to, or in contact with, heat spreader 750. Encapsulate can be injected into gaps 1055a and 1055b.

Figure 11:
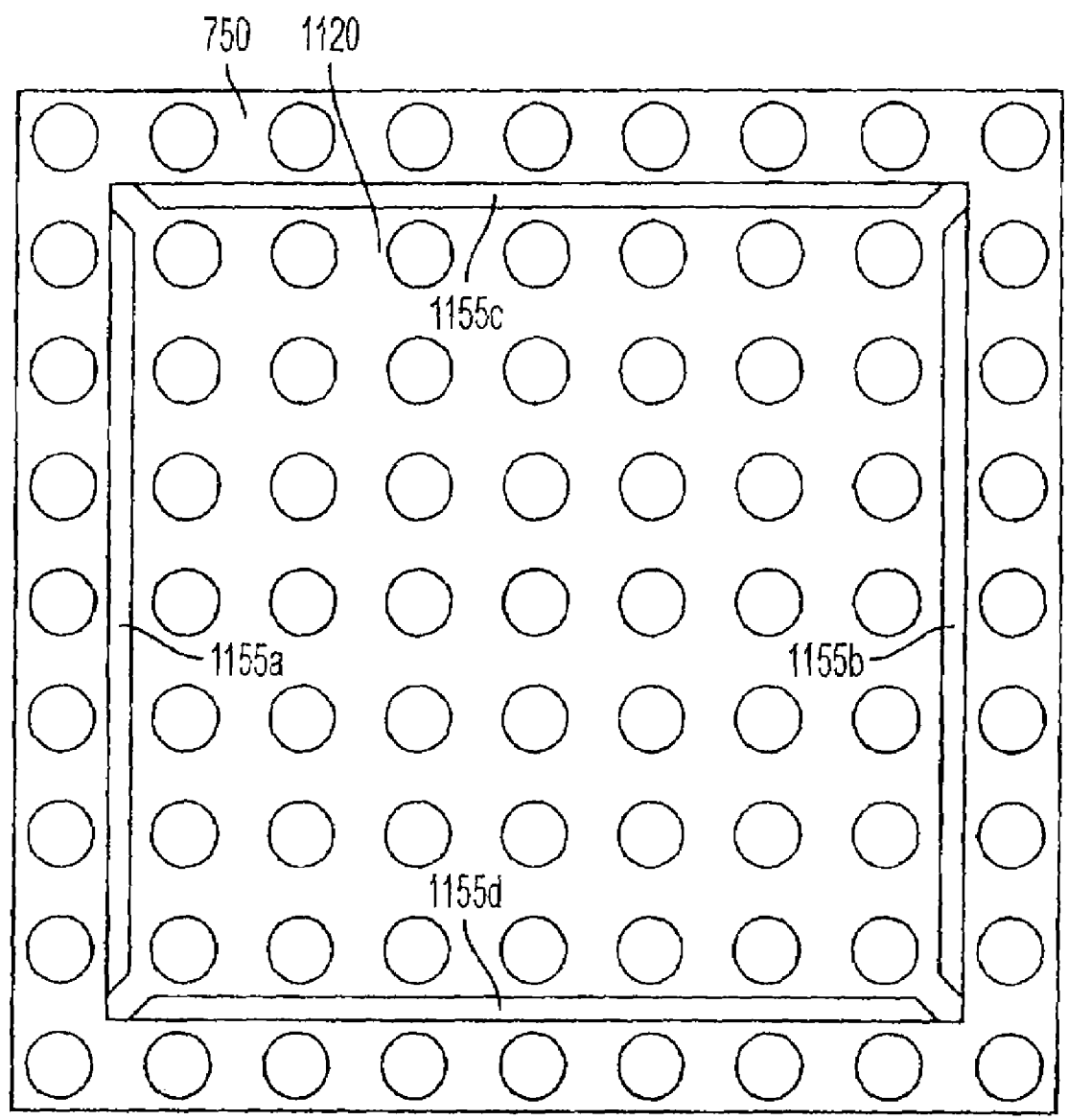
FIG. 11 illustrates a bottom view of an exemplary flip chip BGA package in which four corners of a substrate are in contact with a heat spreader according to an embodiment of the present invention.
Figure 12:
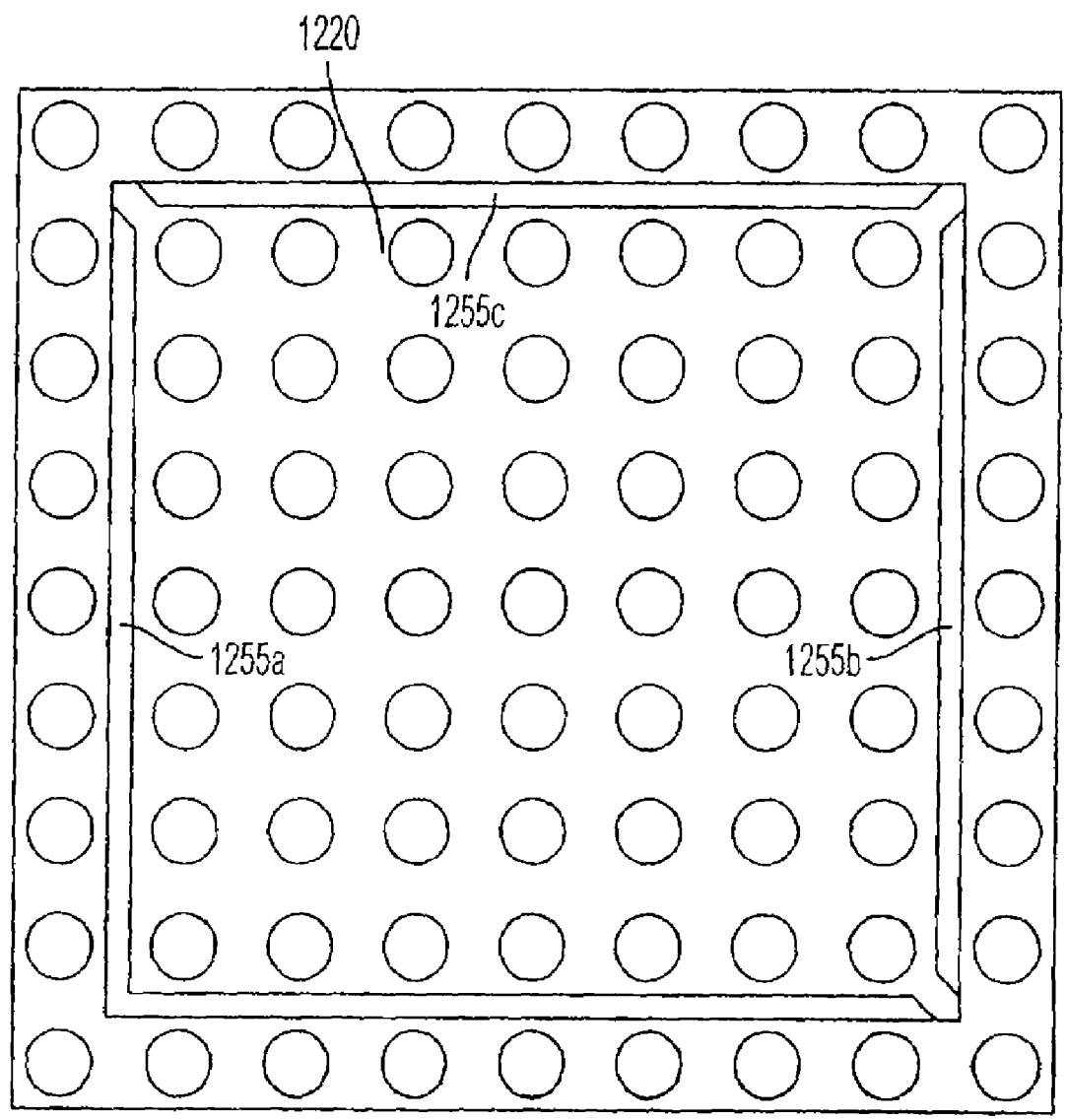
FIG. 12 illustrates a bottom view of a second exemplary flip chip BGA package in which three corners of a substrate are in contact with a heat spreader according to an embodiment of the present invention.

Referring to FIGS. 11 and 12, a respective substrate 1120, 1220 may touch heat spreader 750 at one or more corners of substrate 1120, 1220. In the embodiment of FIG. 11, all four corners of substrate 1120 are in contact with heat spreader 750 via corresponding corner tabs. In the embodiment of FIG. 12, three corners of substrate 1220 are in contact with heat spreader 750 via corresponding corner tabs. For instance, gap 1255a extends along two adjacent edges of substrate 1220, gap 1255b extends along a third edge, and gap 1255c extends along a fourth edge.

Figure 13:
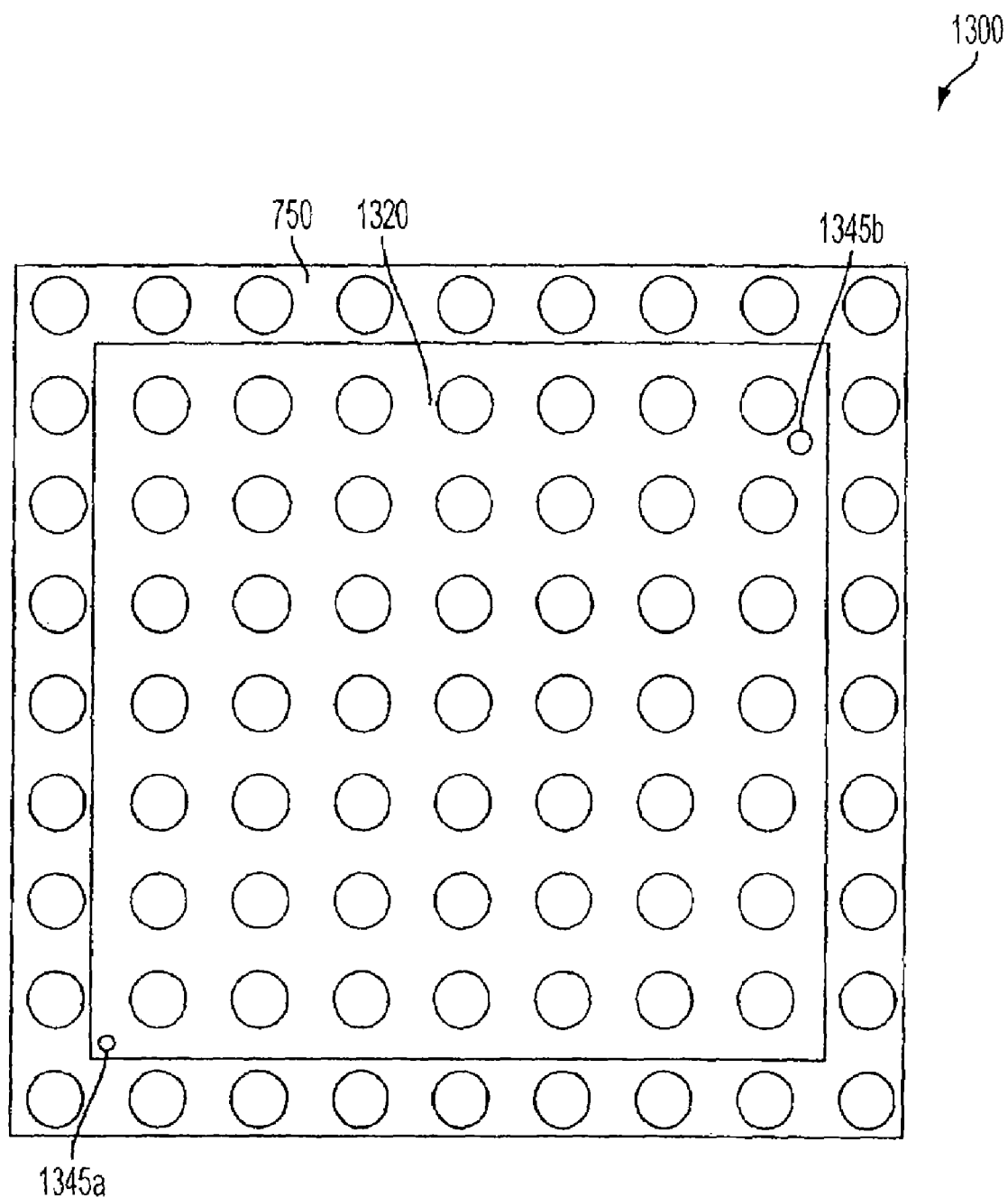
FIG. 13 illustrates a bottom view of an exemplary flip chip BGA package having no gaps between a substrate and a heat spreader according to an embodiment of the present invention.

In FIG. 13, all four edges of a substrate 1320 are closely adjacent to or in contact with heat spreader 750, such that a gap is not present between substrate 1320 and heat spreader 750. In the embodiment of FIG. 13, substrate 1320 includes one or more openings, such as openings 1345a and 1345b (hereinafter 1345), through which encapsulate can be injected. For instance, openings 1345 can be drilled through substrate 1320 during fabrication of package 1300.

Figure 14A:
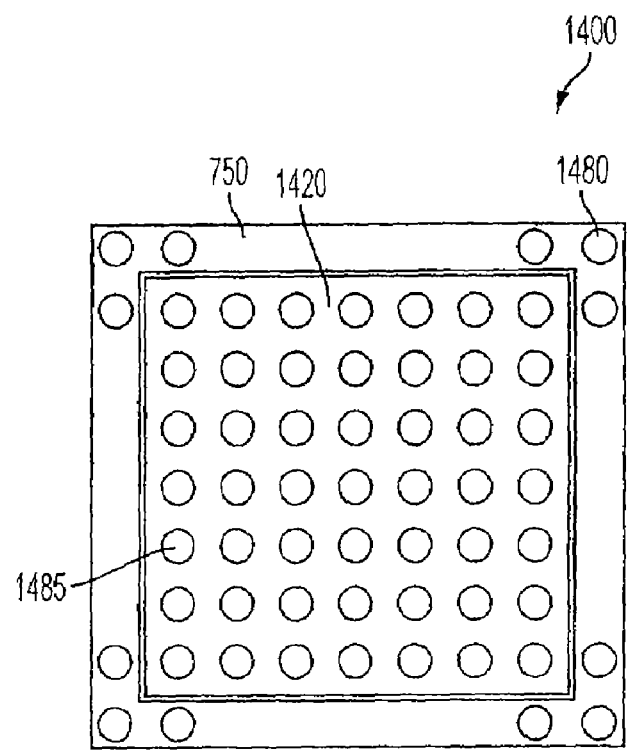
FIG. 14A illustrates a bottom view of an exemplary flip chip BGA package having three solder balls at each corner of a bottom surface of a heat spreader according to an embodiment of the present invention.

FIG. 14A illustrates a bottom view of an exemplary flip chip BGA package 1400 having three peripheral solder balls 1480 at each corner of a bottom surface of a heat spreader 750 according to an embodiment of the present invention. For example, solder balls can be uniformly attached along a perimeter of the bottom surface of package 1400. One or more of the solder balls can be removed (i.e., depopulated) from the perimeter to provide peripheral solder balls 1480 at each corner of the bottom surface. In another example, solder balls that are attached to the bottom surface include only the three peripheral solder balls 1480 at each corner of the bottom surface.

The embodiment of FIG. 14A can provide more space for board trace routing, as compared to embodiments having rows of solder balls along each edge of the bottom surface of a heat spreader. Solder balls 1485 on a substrate 1420 and peripheral solder balls 1480 on heat spreader 750 can be the same size, though the scope of the invention is not limited in this respect. For example, peripheral solder balls 1480 can be larger than solder balls 1485 to relieve stress imposed upon solder balls 1485. Peripheral solder balls 1480 can reduce the forces acting upon solder balls 1485.

Figure 14B:
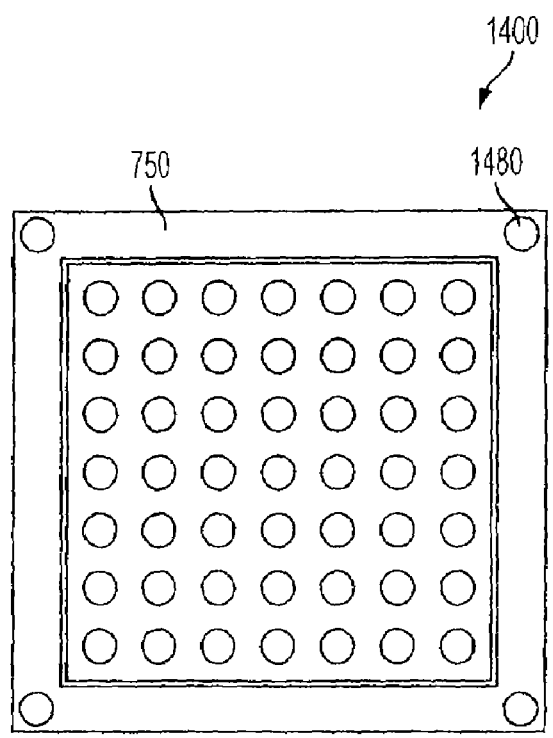
FIG. 14B illustrates a bottom view of an exemplary flip chip BGA package having one solder ball at each corner of a bottom surface of a heat spreader according to an embodiment of the present invention.

Referring to FIG. 14B, flip chip BGA package 1400 has one peripheral solder ball 1480 at each corner of the bottom surface of heat spreader 750 for illustrative purposes.

The corners of heat spreader 750 are farther from the center of package 1400 than the edges of heat spreader 750. If package 1400 is soldered to a board, for example, more expansion occurs at the corners of heat spreader 750, as compared to the edges of heat spreader 750. Thermal stress is greater at the corners of heat spreader 750, as compared to the edges of heat spreader 750. Thus, having a peripheral solder ball 1480 at an edge of the bottom surface of heat spreader 750, rather than at a corner of the bottom edge, can reduce the thermal stress on peripheral solder balls 1480.

Figure 15A:
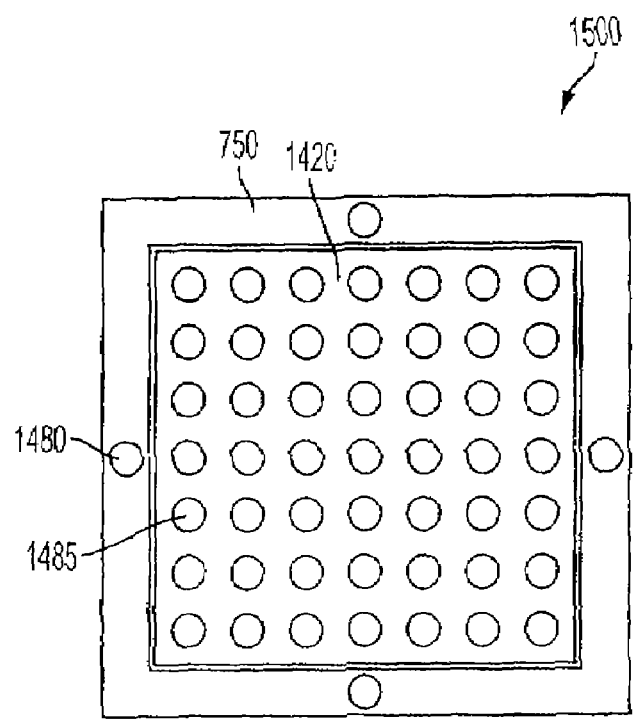
FIG. 15A illustrates a bottom view of an exemplary flip chip BGA package having a solder ball at approximately a midpoint of each edge of a bottom surface of a heat spreader according to an embodiment of the present invention.

FIG. 15A illustrates a bottom view of an exemplary flip chip BGA package 1500 having a peripheral solder ball 1480 at approximately a midpoint of each edge of the bottom surface of heat spreader 750 according to an embodiment of the present invention. A peripheral solder ball 1480 at an edge of the bottom surface of heat spreader 750 need not necessarily be approximately at a midpoint of the edge. The peripheral solder ball 1480 can be anywhere along the edge of the bottom surface.

Figure 15B:
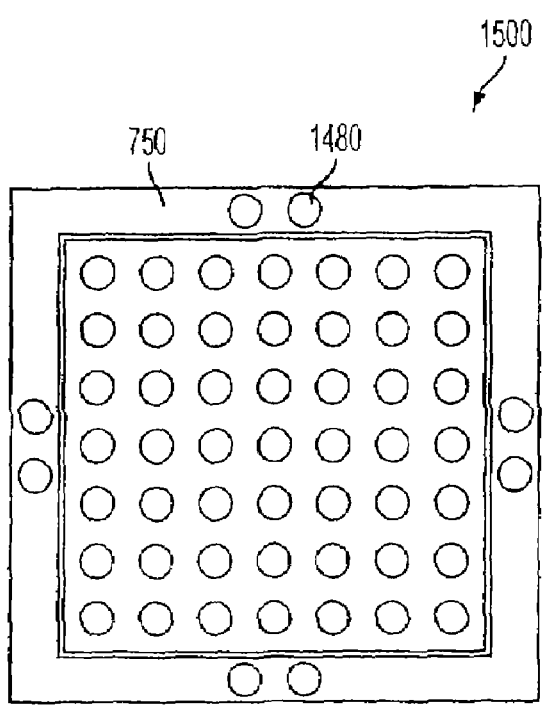
FIG. 15B illustrates a bottom view of an exemplary flip chip BGA package having two solder balls at approximately a midpoint of each edge of a bottom surface of a heat spreader according to an embodiment of the present invention.

Referring to FIG. 15B, flip chip BGA package 1500 has two peripheral solder balls 1480 at approximately a midpoint of each edge of the bottom surface of heat spreader 750 for illustrative purposes. Any number of peripheral solder balls 1480 can be provided at one or more corners and/or edges of the bottom surface of heat spreader 750.

Figure 16:
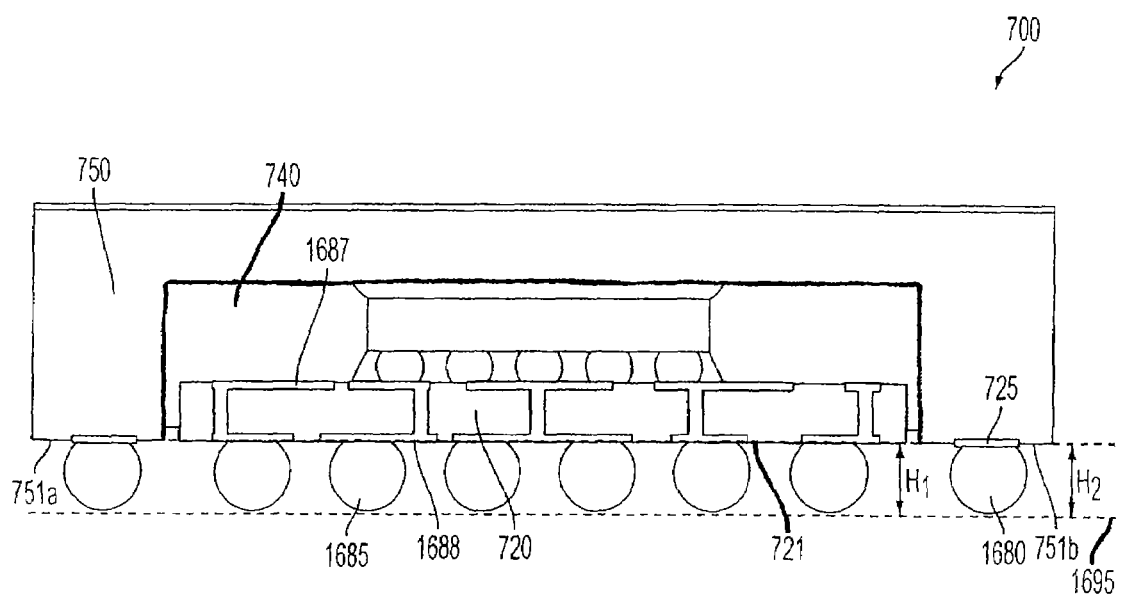
FIG. 16 illustrates a cross-sectional view of an exemplary flip chip BGA package indicating a substrate standoff height and a heat spreader standoff height according to an embodiment of the present invention.

FIG. 16 illustrates a cross-sectional view of an exemplary flip chip BGA package 700 indicating a substrate standoff height $H_1$ and a heat spreader standoff height $H_2$ according to an embodiment of the present invention. $H_1$ is defined as the perpendicular distance between a sitting plane 1695 of package 700 and surface 721 of substrate 720. Sitting plane 1695 is a plane at which solder balls 1685 and peripheral solder balls 1680 of package 700 can couple to a surface having electrically conductive contacts, such as a PCB. $H_2$ is defined as the perpendicular distance between sitting plane 1695 and surface 751.

Surface 721 of substrate 720 can be flush with surfaces 751 of heat spreader 750, as shown in FIG. 16, such that $H_1=H_2$. Alternatively, substrate 720 can be recessed within cavity 740, such that $H_1>H_2$. In another alternative embodiment, substrate 720 can protrude partially or entirely out of cavity 740, such that $H_1<H_2$. If $H_1 \geq H_2$, die 710 and substrate 720 are entirely laterally surrounded (contained) by heat spreader 750.

The relationship between $H_1$ and $H_2$ can affect whether heat spreader 750 and/or substrate 720 are properly coupled to a PCB, for example. If $H_1$ is too large with respect to $H_2$, then a gap may occur between solder balls 1685 and the PCB. For instance, substrate 720 may not be electrically coupled to the PCB. If $H_2$ is too large with respect to $H_1$, then a gap may occur between peripheral solder balls 1680 and the PCB. For example, heat spreader 750 may not be able to be soldered to the PCB in response to a reflow surface mount operation. Thus, heat spreader 750 may not be electrically coupled to the PCB.

$H_1$ and $H_2$ can be manipulated by changing the diameters of solder balls 1685 and peripheral solder balls 1680, changing the thickness of pads 725, 1687, and/or 1688 of package 700, and/or changing the thickness of pads on a surface to which package 700 is to be mounted. Thickness is measured perpendicular to sitting plane 1695. $H_1$ and $H_2$ are typically changed equally in order to facilitate proper connection of package 700 to a PWB, for example. Increasing the width of the openings of the solder mask that define the width of pads 725 can facilitate a reduction of $H_1$ and $H_2$.

Figure 17:
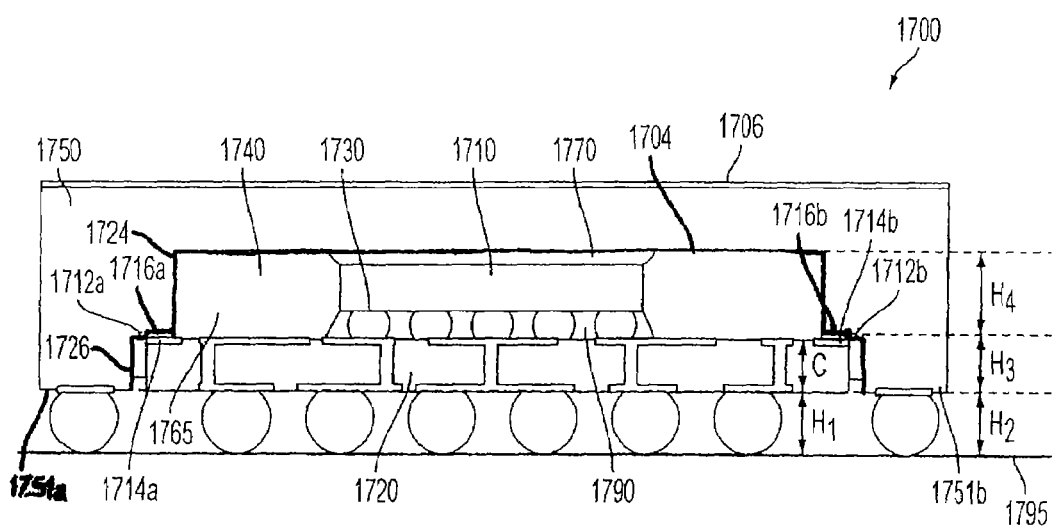
FIG. 17 illustrates a cross-sectional view of an exemplary flip chip BGA package that includes a heat spreader having at least one step according to an embodiment of the present invention.

FIG. 17 illustrates a cross-sectional view of an exemplary flip chip BGA package 1700, generally similar to package 700 of FIG. 7, that includes a heat spreader 1750 having at least one step 1712a and 1712b according to an embodiment of the present invention. Steps 1712a and 1712b can be separate steps or can be parts of a single continuous step 1712 in heat spreader 1750 surrounding a cavity 1740.

Steps 1712a and 1712b (hereinafter 1712) of heat spreader 1750 can be electrically, thermally, and/or mechanically coupled to substrate 1720. For instance, steps 1712 are generally electrically coupled to substrate 1720 via a conductive substance, such as solder paste, solder bumps, pre-plated solder, or a conductive adhesive. For example, the conductive adhesive can be an epoxy having electrically conductive filler particles, such as silver particles. The conductive substance can reduce electrical impedance and/or thermal resistance between heat spreader 1750 and substrate 1720.

At least one of steps 1712 can be connected to a ground connection of substrate 1720. For example, heat spreader 1750 can be a three-dimensional (3D) ground (or other voltage) potential. Heat spreader 750 can be connected to a printed wire board (PWB) or a printed circuit board (PCB), for example. Heat spreader 750 coupled to the PWB or PCB can form a three-dimensional ground (or other voltage) plane that wraps around die 1710 and substrate 1720. The electrical connection between step(s) 1712 and substrate 1720 can protect package 1700 against electromagnetic interference (EMI). Heat spreader 1750 can shield electromagnetic radiation emitted by and/or radiated toward die 1710. Referring to FIG. 17, a ground potential plane of substrate 1720 can be accessible at surface 1706 of heat spreader 1750. Having surface 1706 at approximately the same potential as the ground potential plane of substrate 1720 can reduce EMI radiation from an external heat sink coupled to surface 1706.

Substrate 1720 can include pads 1714a and 1714b (hereinafter 1714) to facilitate coupling of substrate 1720 to steps 1712. Step(s) 1712 can include pads 1716a and 1716b (hereinafter 1716) to facilitate coupling of step(s) 1712 to substrate 1720. Pads 1714 and/or pads 1716 can provide a low-impedance connection between heat spreader 1750 and substrate 1720. Although steps 1712, pads 1714 and 1716, and surfaces 1751, are depicted as two separate steps, pads, and surfaces, respectively, in the cross-sectional representation of FIG. 17, steps 1712, pads 1714 or 1716, or surfaces 1751 can represent a single, concentric step, pad, or surface, respectively. Flip chip package 1700 can include any suitable number of steps, pads, or surfaces.

Pads 1714 or 1716 can be a metal ring or metal bars that are or are not covered with solder mask. For instance, silver- or solder-plated rings or bars can be disposed along the periphery of substrate 1720 or along steps 1712. Pads 1714 can be coupled to electrically conductive traces of substrate 1720.

A step height $H_3$ is defined as a perpendicular distance between step 1712a or 1712b and surface 751a or 751b, as shown in FIG. 17. A substrate thickness C (i.e., the thickness of substrate 1720) and a thickness of the electrically conductive substance between step 1712a or 1712b and substrate 1720 are measured perpendicular to a sitting plane 1795. In the embodiment of FIG. 17, the substrate thickness C, the substrate standoff height $H_1$, the heat spreader standoff height $H_2$, the step height $H_3$, and the thickness of the electrically conductive substance are related in accordance with the following equation:

$$H_1 + C + \text{thickness of electrically conductive substance} = H_2 + H_3$$

$H_4$ represents a perpendicular distance from an upper surface 1704 of cavity 1740 to step 1712a or 1712b. $H_4$ can be greater than the sum of the thicknesses of die 1710, electrically conductive elements 1730, an underfill 1790, and a die-attach epoxy 1770, each of which is measured perpendicular to sitting plane 1795. $H_4$ can exceed the sum of the thicknesses by approximately 0.5 mil-4.0 mil, for example. (A mil is defined as one-thousandth of an inch.) The thickness of die-attach epoxy 1770 can be based on the material dispansion volume associated with a flip chip BGA package assembly process, for example.

Figure 18:
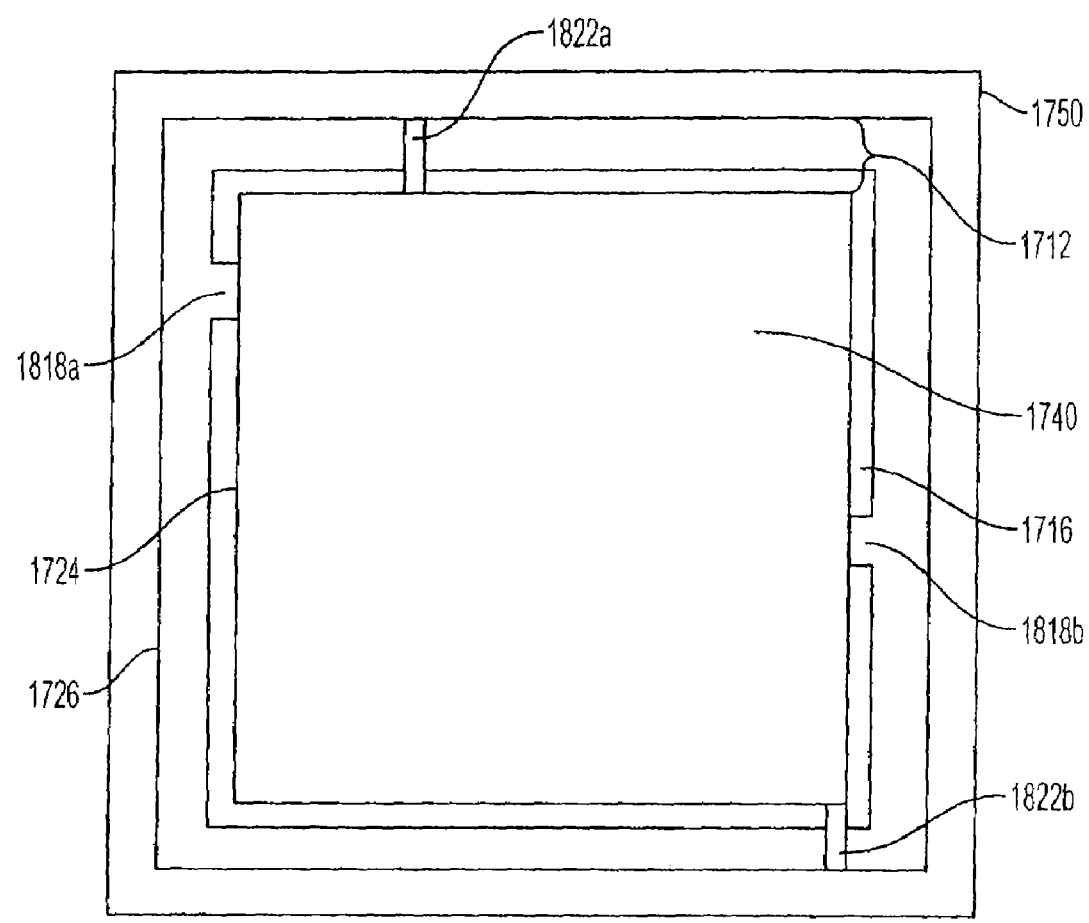
FIG. 18 illustrates a bottom view of the heat spreader of FIG. 17 according to an embodiment of the present invention.

FIG. 18 illustrates a bottom view of heat spreader 1750 of FIG. 17 according to an embodiment of the present invention. Pads 1716 are shown as a silver- or solder-plated ring in FIG. 18 for illustrative purposes. The silver- or solder-plated ring can include one or more gaps or openings 1818a and 1818b (hereinafter 1818). Heat spreader 1750 can include one or more grooves 1822a and 1822b (hereinafter 1822), which can also be referred to as channels. Grooves 1822 can allow encapsulate 1765 to be injected into cavity 1740. In the embodiment of FIG. 18, grooves 1822 are perpendicular to surfaces 1724 and 1726 of heat spreader 1750, though the scope of the invention is not limited in this respect.

Figure 19:
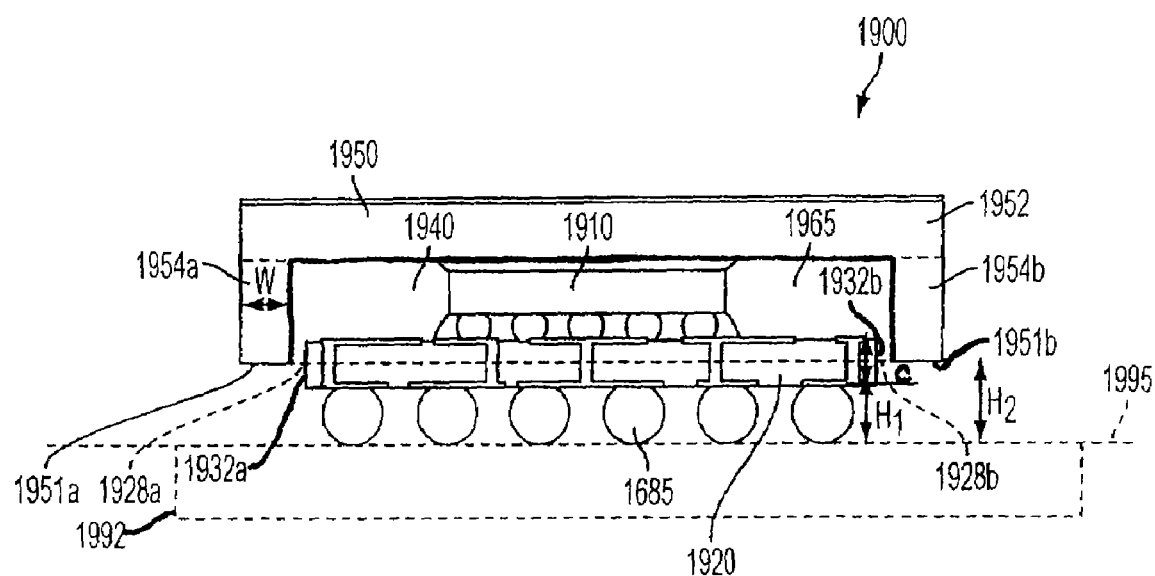
FIG. 19 illustrates a cross-sectional view of an exemplary flip chip BGA package having through-hole openings for encapsulate injection according to an embodiment of the present invention.

FIG. 19 illustrates a cross-sectional view of an exemplary flip chip BGA package 1900 having through-hole openings 1928a and 1928b (hereinafter 1928) for encapsulate injection according to an embodiment of the present invention. Package 1900 is shown coupled to a PWB 1992 via solder balls 1685 for illustrative purposes. In the embodiment of FIG. 19, a heat spreader 1950 is not electrically coupled to a PWB 1995 via one or more peripheral solder balls, as shown in FIG. 7, for example.

In FIG. 19, heat spreader 1950 has a top portion 1952 and side portions 1954a and 1954b (hereinafter 1954). Heat spreader 1950 does not include a pad at surface 1951a of side portion 1954a or at surface 1951b of side portion 1954b, as shown in FIG. 17, for example. Including a pad, such as pad 725a or 725b in FIG. 7, at surface 1951a or 1951b generally requires the width W of side portion 1954a or 1954b, respectively, to be greater than the width W necessary in the absence of the pad. For instance, side portions 1954 of heat spreader 1950 typically can be thinner than corresponding side portions of heat spreader 750 in FIG. 7. Heat spreader 1950 having thinner side portions 1954, as compared to heat spreader 750, can be manufactured more easily and/or can cost less. For example, a metal forming process, such as stamping, can be performed more easily to form heat spreader 1950, as compared to forming heat spreader 750 in FIG. 7.

Through-hole openings 1928 are generally gaps between heat spreader 1950 and substrate 1920. According to the embodiment of FIG. 19, substrate 1920 partially protrudes out of cavity 1940, such that $H_1 < H_2 < H_1 + C$. Heat spreader 1950 entirely laterally surrounds flip chip die 1910 and laterally surrounds a portion of the thickness C of substrate 1920.

Figure 20:
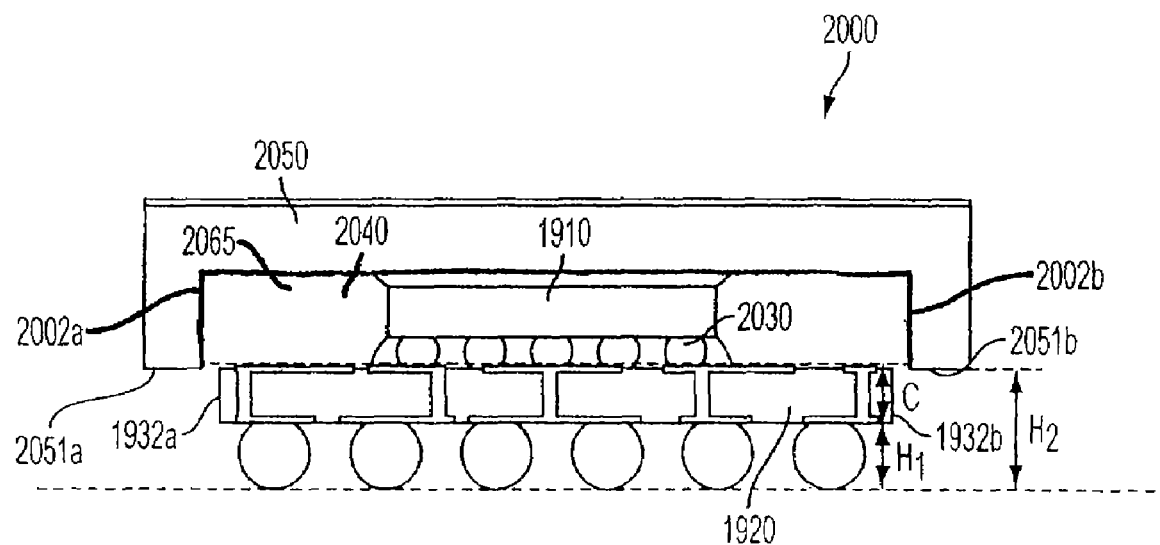
FIG. 20 illustrates a cross-sectional view of an exemplary flip chip BGA package having an encapsulate-filled cavity according to an embodiment of the present invention.

In the embodiment of FIG. 20, a surface of a substrate 1920 that is coupled to die 1910 via solder bumps 2030 is flush with a plane that is flush with a bottom surface 2051 of heat spreader 2050, such that $H_2 = H_1 + C$. Heat spreader 2050 entirely laterally surrounds flip chip die 1910 and does not laterally surround substrate 1920.

Figure 21:
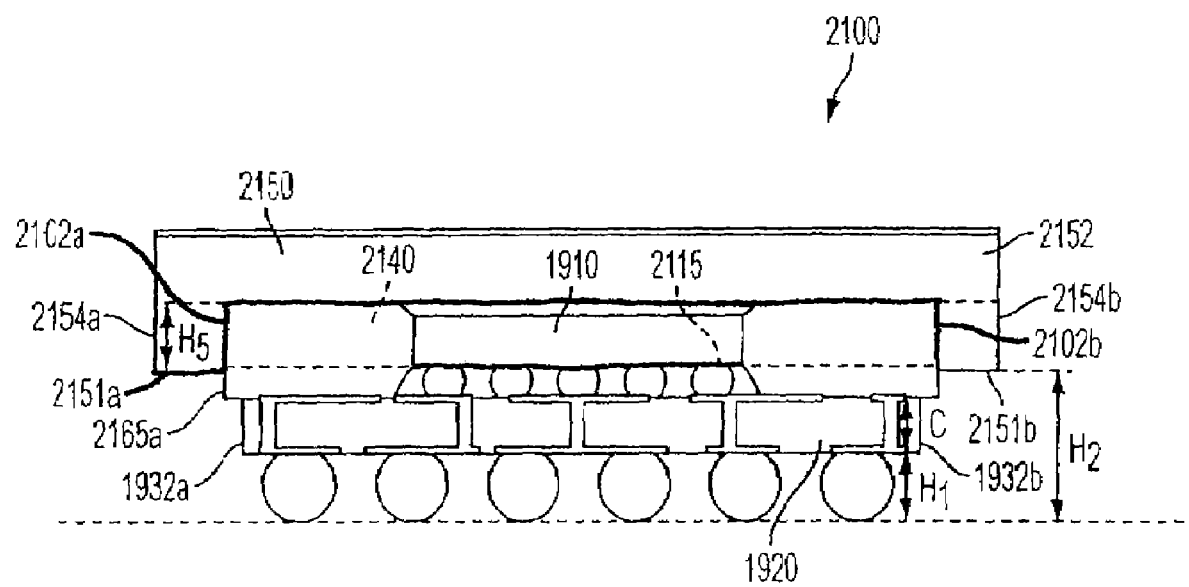
FIG. 21 illustrates a cross-sectional view of another exemplary flip chip BGA package having an encapsulate-filled cavity according to an embodiment of the present invention.

FIG. 21 shows an example package 2100, in which substrate 1920 is completely outside a cavity 2140 and is not in contact with cavity 2140, such that $H_2 > H_1 + C$. A plane at a bottom surface 2115 of a heat spreader 2150 is flush with an active surface 2115 of a flip chip die 2110. Heat spreader 2150 partially laterally surrounds flip chip die 1910 and does not laterally surround substrate 1920 in the 2-dimensional representation of FIG. 21. For instance, having heat spreader 2150 that does not laterally surround substrate 1920 can reduce the mass of package 2100 and/or provide a larger opening through which encapsulate 2165 may be injected into package 2100, as compared to packages in which a heat spreader laterally surrounds a substrate.

Heat spreader 1950, 2150 has four outer side portions 1954, 2154 around its periphery, between a top portion 1952, 2152 and a bottom surface 1951, 2151 of the heat spreader 1950, 2150. Side portions 1954a and 1954b (hereinafter 1954) of heat spreader 1950 in FIG. 19 or side portions 2154a and 2154b (hereinafter 2154) of heat spreader 2150 in FIG. 21 can be any suitable height $H_5$, as shown in FIG. 21. Heat spreader 1950 or 2150 can surround any portion of flip chip die 1910 and/or substrate 1920.

In FIGS. 19-21, cavity 1940, 2040, 2140 of respective package 1900, 2000, 2100 is respectively filled with encapsulate 1965, 2065, 2165, though the scope of the invention is not limited in this respect. For instance, cavity 1940, 2040, 2140 need not include encapsulate 1965, 2065, 2165. Substrate 1920 has four outer side portions around its periphery. Side portions 1932a and 1932b (hereinafter 1932) are shown in FIG. 19. Encapsulate 1965, 2065, 2165 can partially or entirely cover side portions 1932 of substrate 1920. In FIG. 19, for example, encapsulate 1965 partially covers side portions 1932 of substrate 1920.

3.2 Flip Chip Package Having Cavity Not Filled with Encapsulate

Figure 22:
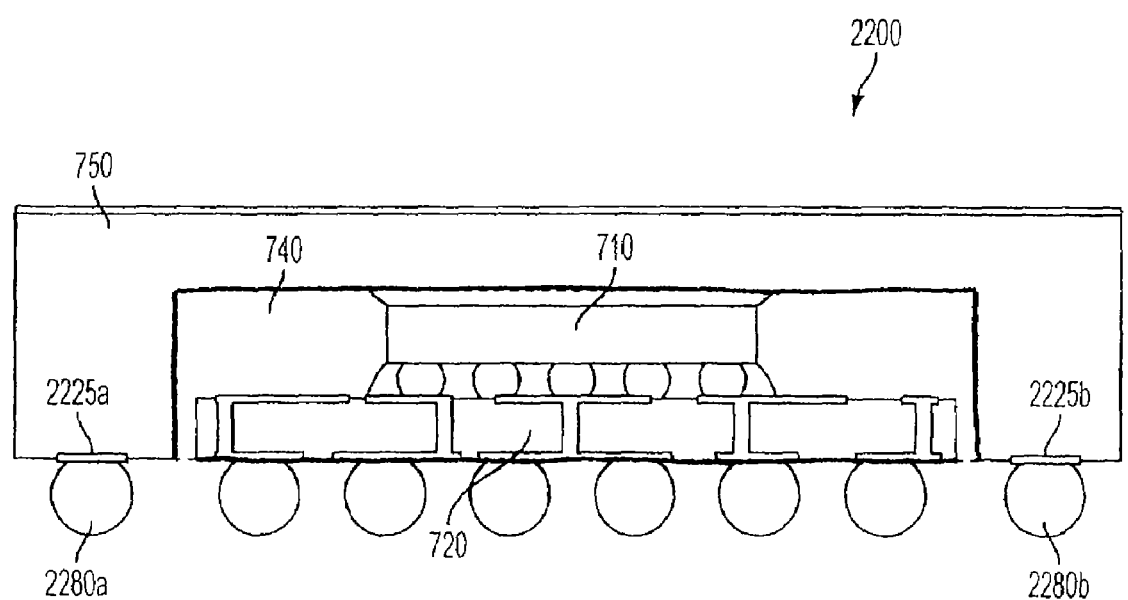
FIG. 22 illustrates a cross-sectional view of an exemplary flip chip BGA package having a cavity that is not filled with encapsulate according to an embodiment of the present invention.

The present invention includes any of the foregoing flip chip BGA packages regardless whether the flip chip BGA package includes encapsulate or not. FIG. 22 illustrates a cross-sectional view of an exemplary flip chip BGA package 2200 having a cavity 740 that is not filled with encapsulate according to an embodiment of the present invention. Package 2200 is similar to package 700 in FIG. 7, though package 2200 does not include encapsulate. Package 2200 includes a heat spreader 750 electrically coupled to peripheral solder balls 2280a and 2280b (hereinafter 2280) through pads 2225a and 2225b (hereinafter 2225), respectively. A solder ball 2280 generally is located at each corner of heat spreader 750 to maintain structural symmetry of package 2200.

Figure 23:
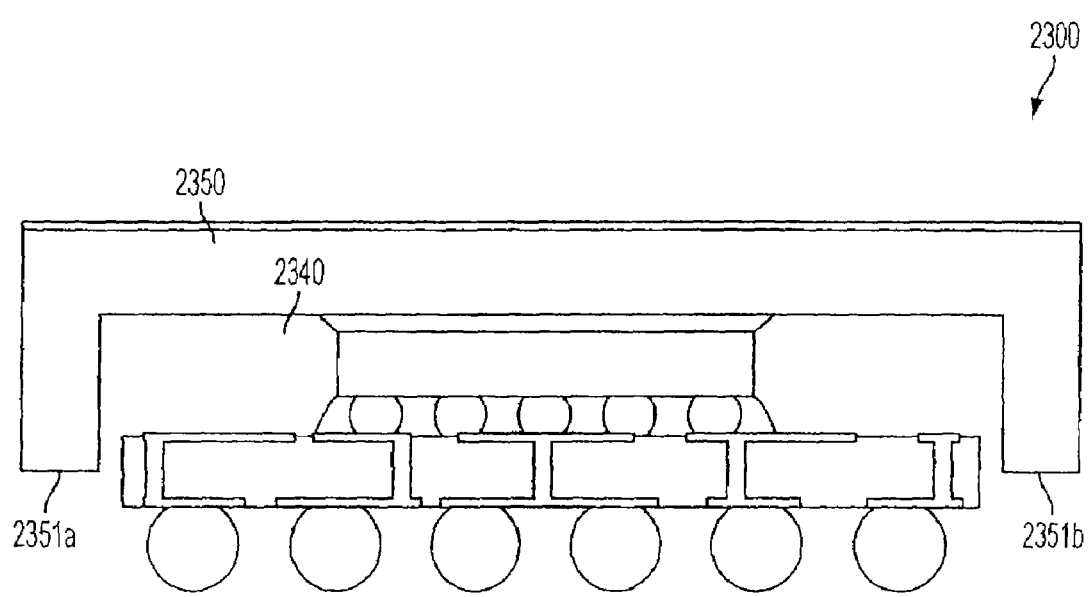
FIG. 23 illustrates a cross-sectional view of another exemplary flip chip BGA package having a cavity that is not filled with encapsulate according to an embodiment of the present invention.

FIG. 23 illustrates a cross-sectional view of another exemplary flip chip BGA package 2300 having a cavity 2340 that is not filled with encapsulate according to an embodiment of the present invention. Package 2300 is similar to package 1900 in FIG. 19, though package 2300 does not include encapsulate. Package 2300 does not include pads coupled to surface 2351a or 2351b of a heat spreader 2350. Neither surface 2351a nor surface 2351b is coupled to a peripheral solder ball.

Figure 24:
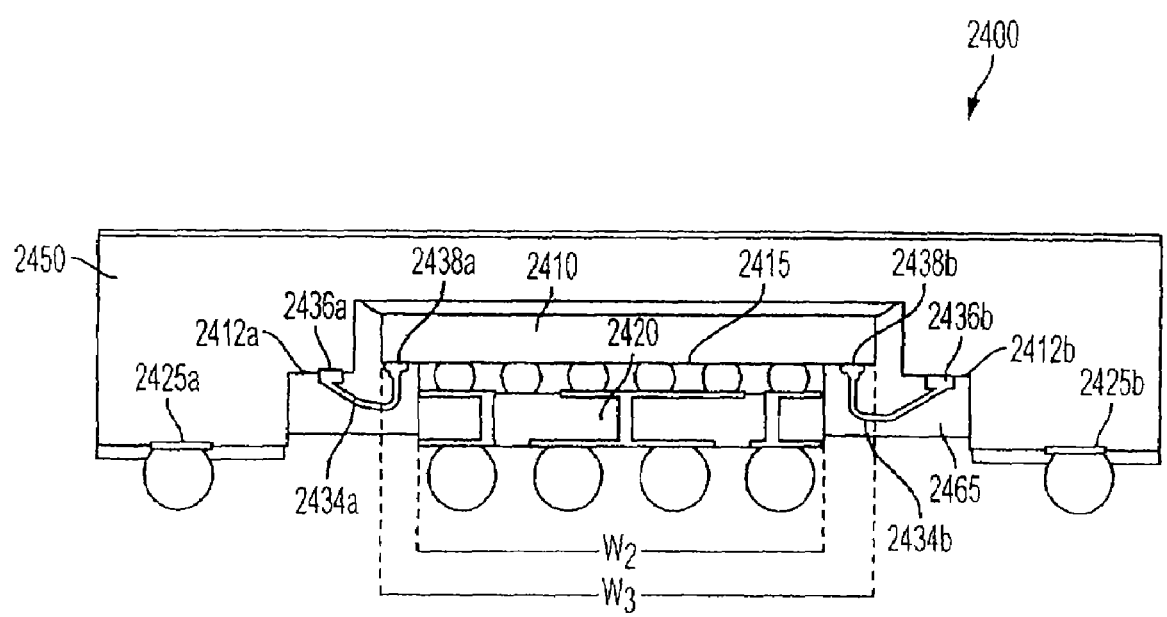
FIG. 24 illustrates a cross-sectional view of an exemplary flip chip BGA package having at least one wirebond between a heat spreader and a flip chip die according to an embodiment of the present invention.

3.3 Flip Chip Package Having Wirebond(s) Between Heat Spreader and Flip Chip Die FIG. 24 illustrates a cross-sectional view of an exemplary flip chip BGA package 2400 having at least one wirebond, such as wirebond 2434a or 2434b, connecting a heat spreader 2450 and a flip chip die 2410 according to an embodiment of the present invention. In FIG. 24, heat spreader 2450 includes ledges or steps 2412a and 2412b (hereinafter 2412). Steps 2412 are coupled to flip chip die 2410 via wirebonds 2434a and 2434b (hereinafter 2434). Wirebonds 2434 are coupled to heat spreader 2450 through pads 2436a and 2436b (hereinafter 2436) for illustrative purposes. Wirebonds 2434 are coupled to pads 2438a and 2438b (hereinafter 2438) of die 2410. Pad 2438a or 2438b can be electrically connected to a power supply, ground, or other signal of die 2410. According to an embodiment, package 2400 does not include pads 2436 and/or 2438. For instance, wirebonds 2434 can be directly connected to heat spreader 2450 and/or die 2410. Wirebond 2434a or 2434b can be directly electrically connected to a power supply connection or a ground connection at a circuitized surface 2415 of die 2410, for example.

A width $W_3$ of die 2410 is greater than a width $W_2$ of substrate 2420. For example, having $W_3 > W_2$ can facilitate coupling wirebonds 2434 to die 2410.

Figure 25:
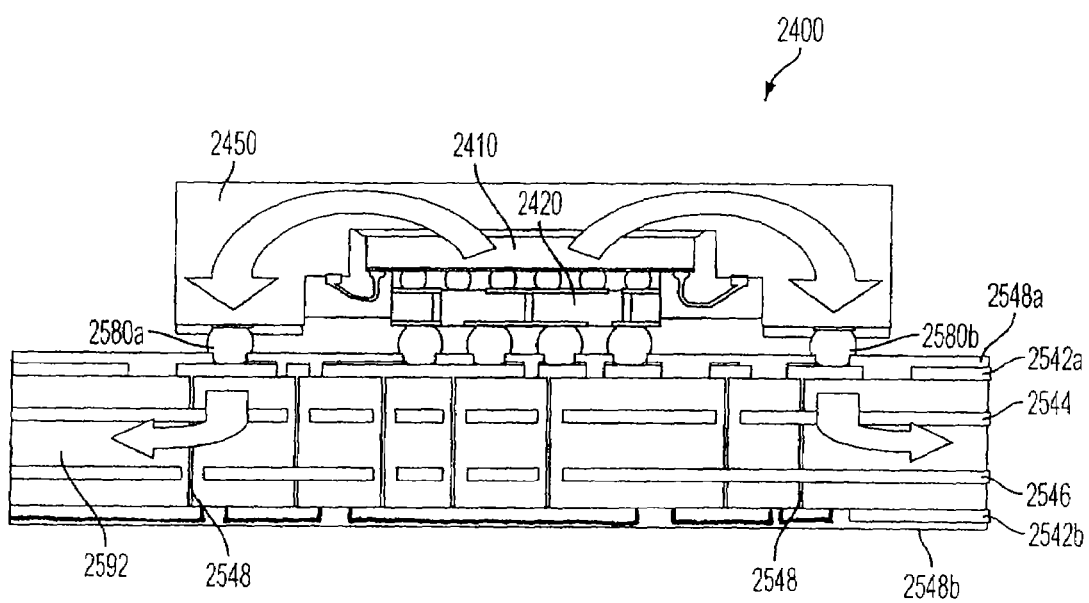
FIG. 25 illustrates a cross-sectional view of the flip chip BGA package in FIG. 24 coupled to a PWB according to an embodiment of the present invention.

FIG. 25 illustrates a cross-sectional view of flip chip BGA package 2400 in FIG. 24 coupled to a PWB 2592 according to an embodiment of the present invention. PWB 2592 includes example signal planes 2542a and 2542b (hereinafter 2542), a ground plane 2544, and a power plane 2546. Portions of signal planes 2542 are covered and separated by solder masks 2548a and 2548b (hereinafter 2548), respectively.

Peripheral solder balls 2580a and 2580b (hereinafter 2580) are coupled to portions of signal plane 2542a. These portions of signal plane 2542a are electrically coupled to ground plane 2544 and to signal plane 2542b through vias 2548. Electrically coupling peripheral solder balls 2580 to ground plane 2544 or power plane 2546 can reduce an inductance associated with ground current return or power delivery.

A heat dissipation path of flip chip BGA package 2400 can include peripheral solder balls 2580. As shown in FIG. 25, heat can dissipate from die 2410 through heat spreader 2450. The heat can further dissipate to PWB 2592 through peripheral solder balls 2580.

Flip chip BGA package 2400 has many advantages, as compared to conventional flip chip BGA packages. For example, flip chip dice having medium (500+) or high (1000+) I/O pin-counts are often coupled to high-density organic substrates, which typically have a thin metal trace layer to enable fine pitch. Having the thin metal trace layer may hinder heat dissipation.

Build-up substrates commonly used in flip chip BGA packages can have high-density circuitry layers on both surfaces of the build-up substrate. The build-up layer metal thickness is typically in a range from approximately 10 microns (μm) to 15 μm. Thick core substrates can be used for build-up substrates to provide rigidity to the build-up substrate. Thick core substrates can include dielectric centers having a thickness in a range from approximately 800 μm to 1000 μm, for example. A lamination substrate that is often included in wire bond plastic BGA (PBGA) packages, for example, can include first and second substrate layers, each having a thickness of approximately 27 μm, and a core layer disposed between the first and second substrate layers having a thickness in a range of approximately 100 μm to 250 μm.

Dielectric core materials can have a thermal conductivity of approximately 0.2 W/m·K, for example. Metal trace layers can include a high proportion of copper. Many trace layers have a thermal conductivity of approximately 400 W/m·K. The relatively low thermal conductivity of the dielectric core material, as compared the thermal conductivity of the metal trace layers, can negatively affect the ability of thick core substrates to dissipate heat. Thermal resistance between a conventional flip BGA package and a PWB, for example, (i.e., junction-to-board thermal resistance) is generally high, regardless whether the conventional flip chip BGA package includes a heat spreader.

However, by utilizing flip chip BGA package 2400 in FIG. 25, for example, the junction-to-board thermal resistance can be reduced to be approximately the same as the junction-to-case thermal resistance. Junction-to-case thermal resistance indicates how effectively heat can be dissipated from a die (e.g., die 2410) to an outer surface of a package (e.g., package 2400). The junction-to-board thermal resistance of flip chip BGA package 2400 can be in a range from approximately 0.1° C./W to approximately 1° C./W, for example. Heat spreader 2450 can improve heat dissipation from die 2410 by reducing the junction-to-board thermal resistance and the junction-to-case thermal resistance. Connecting heat spreader 2450 to PWB 2592, can reduce the amount of heat flowing toward substrate 2420 in flip chip BGA package 2400. For example, the heat flow can bypass substrate 2420 through heat spreader 2450.

Figure 26:
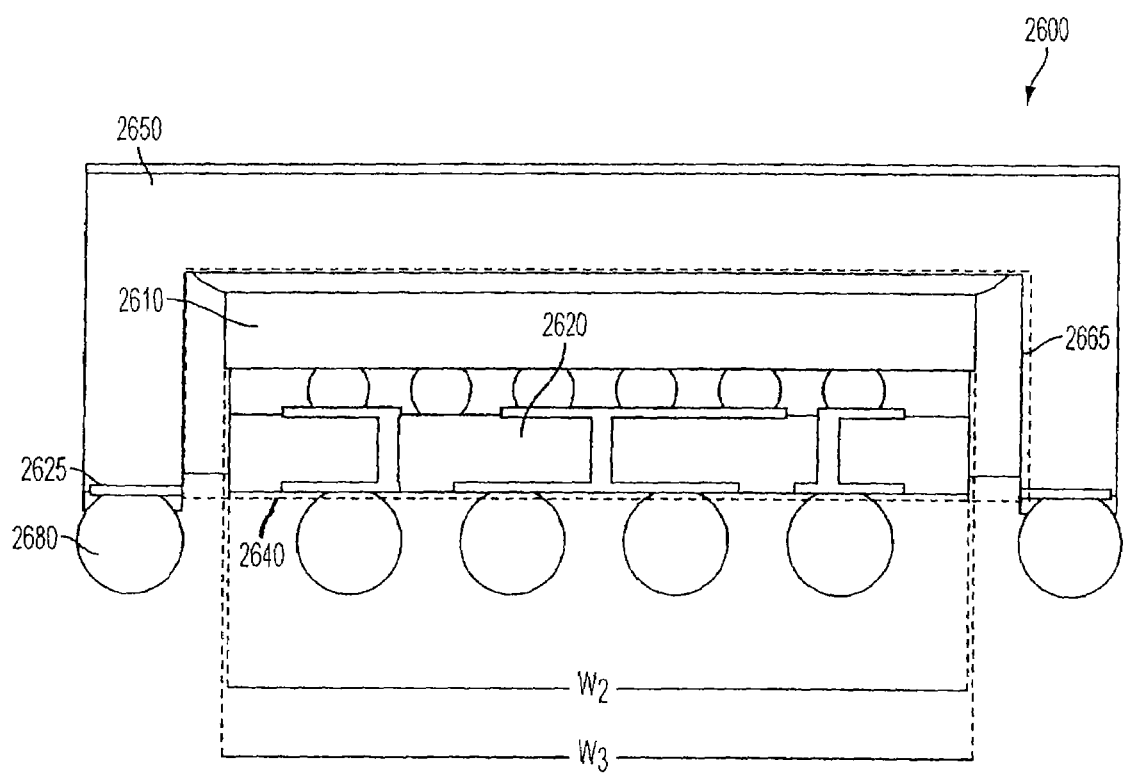
FIG. 26 illustrates a cross-sectional view of an exemplary flip chip BGA package including a flip chip die and a substrate having approximately the same area according to an embodiment of the present invention.

3.4 Flip Chip Package Including Flip Chip Die and Substrate Having Approximately Same Width FIG. 26 illustrates a cross-sectional view of an exemplary flip chip BGA package 2600 including a flip chip die 2610 and a substrate 2620 having approximately the same area according to an embodiment of the present invention. Referring to FIG. 26, the width $W_2$ of substrate 2620 is approximately the same as the width $W_3$ of die 2610. A heat spreader 2650 completely laterally surrounds die 2610 and substrate 2620, such that die 2610 and substrate 2620 fully reside in a cavity 2640 of heat spreader 2650. Heat spreader 2650 is coupled to peripheral solder balls 2680 through pads 2625 for illustrative purposes. Encapsulate 2665 provides environmental protection for die 2610 and substrate 2620. Metal can be integrated into substrate 2620 for EMI shielding, for example. For instance, substrate 2620 can include a metal plane layer.

Figure 27:
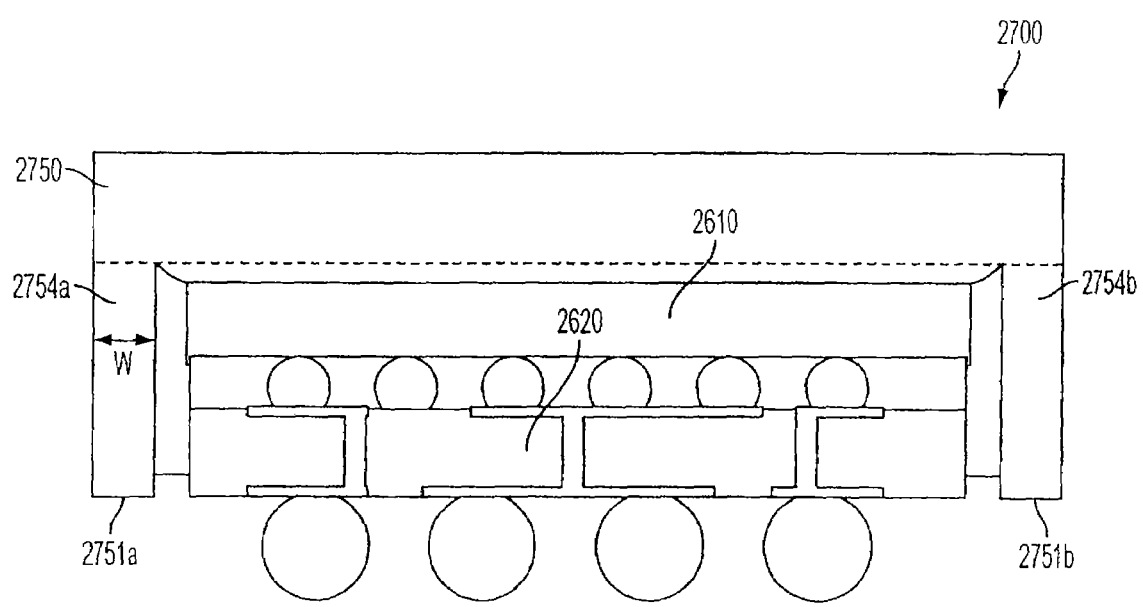
FIG. 27 illustrates a cross-sectional view of another exemplary flip chip BGA package including a flip chip die and a substrate having approximately the same width according to an embodiment of the present invention.

FIG. 27 illustrates a cross-sectional view of another exemplary flip chip BGA package 2700 including a die 2610 and a substrate 2620 having approximately the same width according to an embodiment of the present invention. Flip chip BGA package 2700 in FIG. 27 does not include peripheral solder balls or pads at surfaces 2751a and 2751b (hereinafter 2751) of a heat spreader 2750. The absence of the peripheral solder balls and the pads can allow side portions 2754a and 2754b (hereinafter 2754) of heat spreader 2750 to be thinner (as described above with respect to package 1900 of FIG. 19 and package 2100 of FIG. 21). For instance, the width W of side portions 2754 can be reduced.

A reduction of W can facilitate a reduction in the size and/or weight of heat spreader 2750. Thinner side portions 2754 can reduce the volume displaced by heat spreader 2750.

Figure 28:
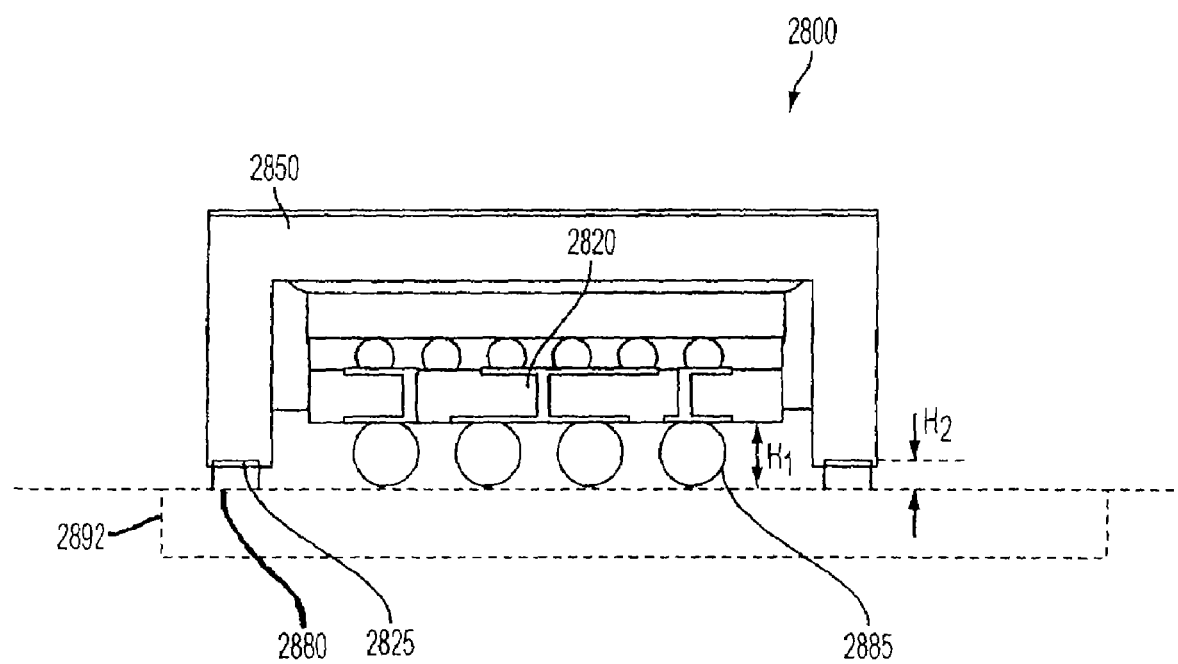
FIG. 28 illustrates a cross-sectional view of yet another exemplary flip chip BGA package including a flip chip die and a substrate having approximately the same width according to an embodiment of the present invention.

FIG. 28 shows a package 2800 where a heat spreader 2850 can be electrically coupled to a PWB 2892, for example, through an electrically conductive adhesive substance 2880, such as solder paste or epoxy (such as a silver or gold filled epoxy). Electrically conductive adhesive substance 2880 can be deposited on PWB 2892 prior to coupling heat spreader 2850 to PWB 2892, though the scope of the invention is not limited in this respect. Electrically conductive adhesive substance 2880 is electrically coupled to heat spreader 2850 through pads 2825 for illustrative purposes. For instance, pads 2825 can facilitate wetting and/or centering molten solder during a reflow surface mount of flip chip BGA package 2800.

Figure 29:
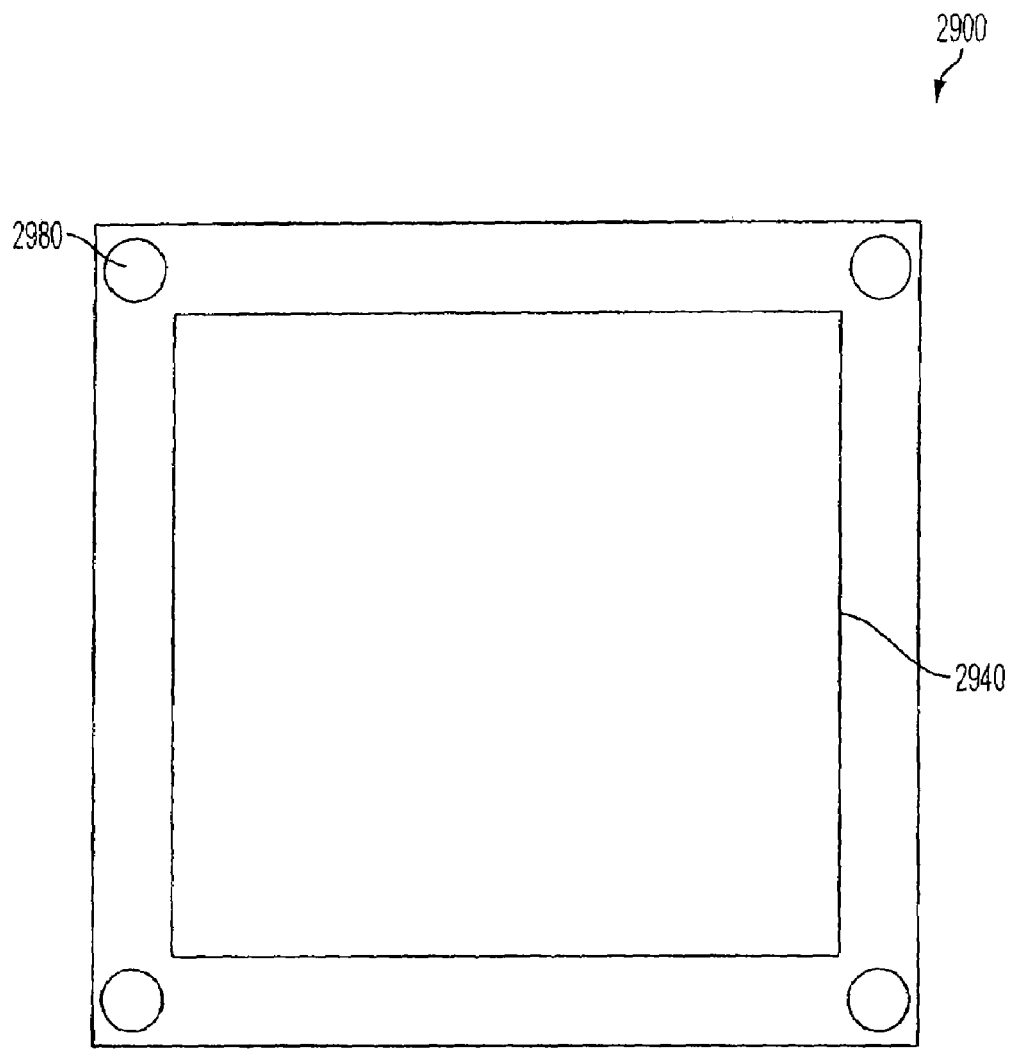
FIG. 29 illustrates a bottom view of an exemplary heat spreader according to an embodiment of the present invention.
Figure 30:
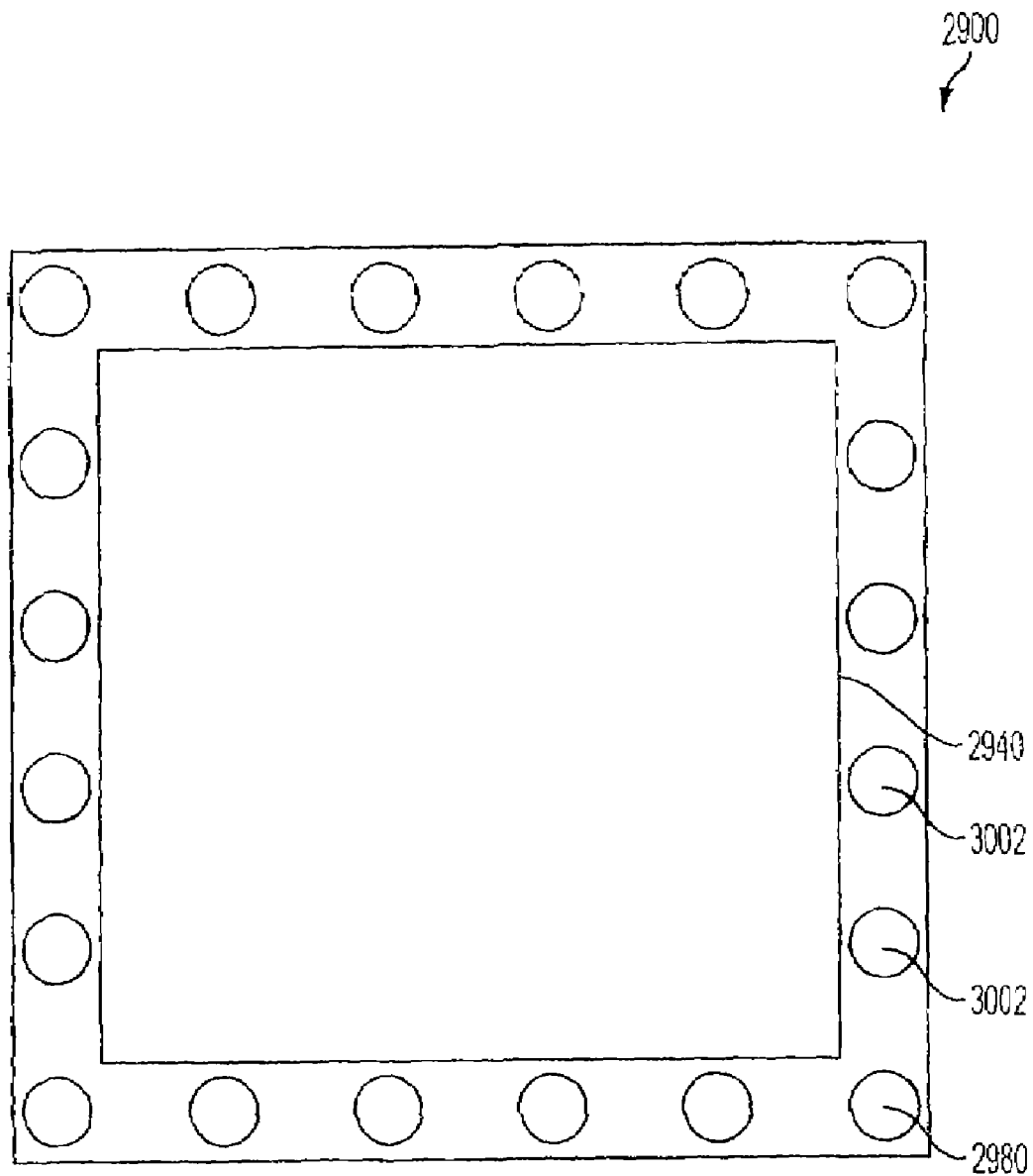
FIG. 30 illustrates a bottom view of another exemplary heat spreader according to an embodiment of the present invention.

FIGS. 29 and 30 illustrate bottom views of exemplary heat spreaders 2900 having a cavity 2940, according to embodiments of the present invention. As shown in FIG. 29, peripheral solder balls 2980 or electrically conductive adhesive substance 2880 can be disposed at locations 2980 in each of the four corners of a heat spreader 2900. Peripheral solder balls 2980 or electrically conductive adhesive substance 2880 can be any suitable shape, such as square, hexagonal, octagonal, etc. In FIG. 30, solder balls or an electrically conductive substance can be disposed at more than two locations along each edge of heat spreader 2900. For instance, peripheral solder balls 2980 can be disposed at approximately the center of the edges. Referring to FIG. 30, solder balls 3002 are disposed at locations other than corner locations 2980 of heat spreader 2900.

Disposing peripheral solder balls 2980 or electrically conductive adhesive substance 2880 at only the corners of heat spreader 2900 can mitigate obstruction of board trace routing for input/output (I/O) signals. For example, board trace routing can pass through the spaces between the locations on the board corresponding to corner locations 2980. Disposing peripheral solder balls 2980 at the center of the edges of heat spreader 2900 can reduce stress at the corners of heat spreader 2900. Stress concentration at the corners of heat spreader 2900 can produce solder joint fatigue and/or failure.

Figure 31:
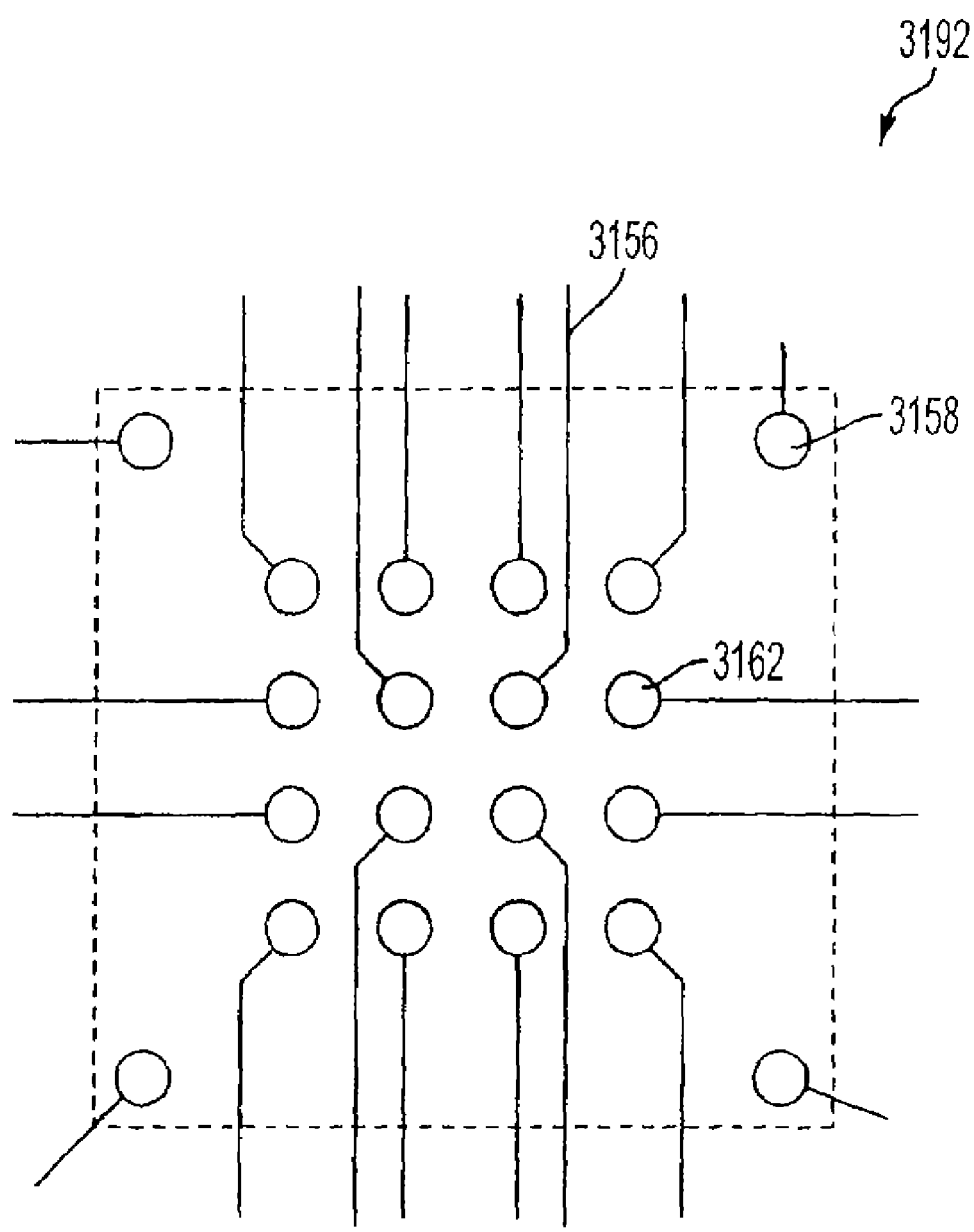
FIG. 31 illustrates trace routing on a PWB according to an embodiment of the present invention.

For instance, FIG. 31 illustrates trace routing 3156 on a PWB 3192 according to an embodiment of the present invention. Pads 3158 are disposed toward the four corners of a PWB 3192 to couple to a heat spreader of a flip chip BGA package. Pads 3162 are disposed toward the center of PWB 3192 to couple to a substrate of the flip chip BGA package. Traces of trace routing 3156 extend from pads 3162 toward the edges of PWB 3192 between corner pads 3158 of PWB 3192.

Figure 32:
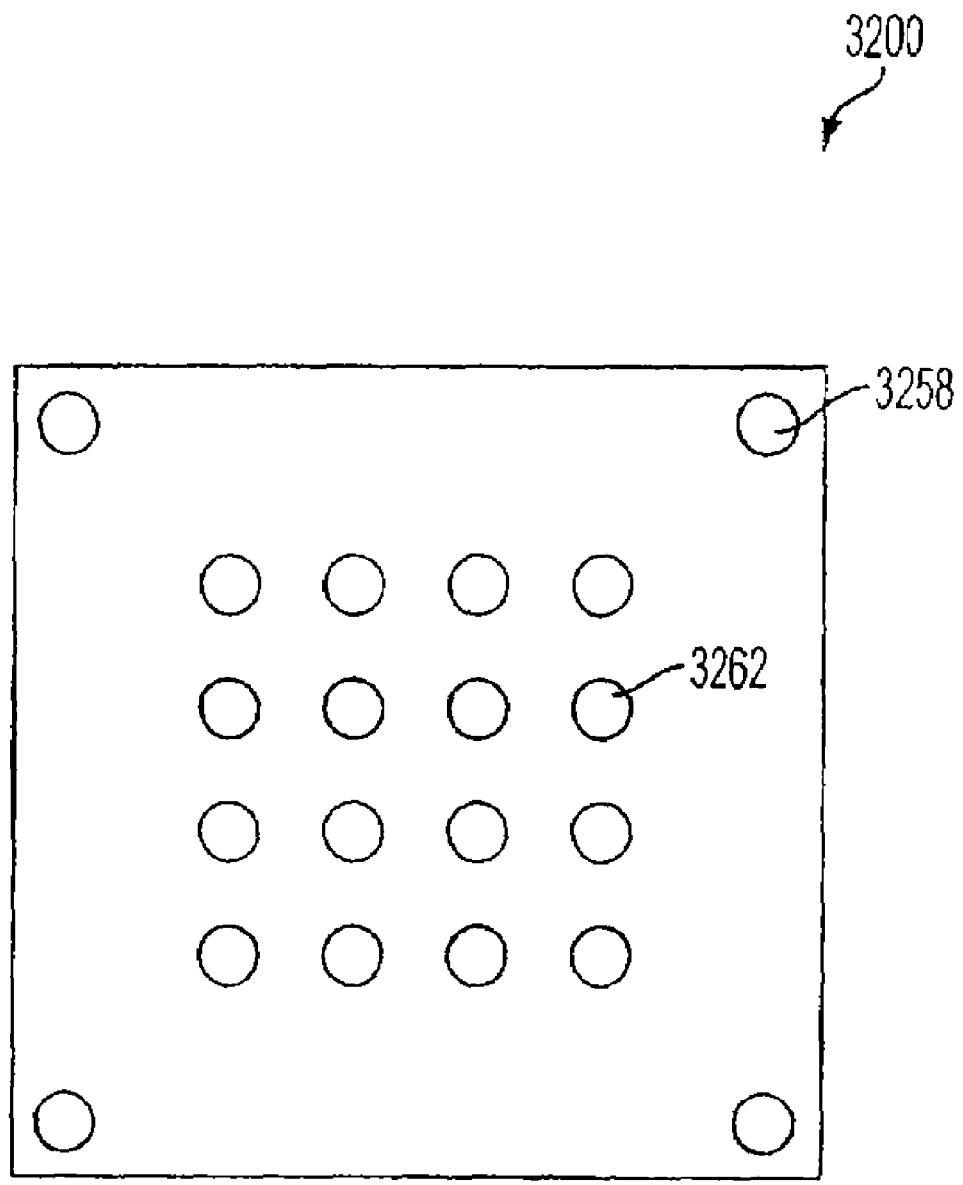
FIG. 32 illustrates a stencil having openings that correspond with pads of the PWB in FIG. 31 according to an embodiment of the present invention.

FIG. 32 illustrates a stencil 3200 having openings 3258 and 3262 that correspond with pads 3158 and 3162 of PWB 3192 in FIG. 31 according to an embodiment of the present invention. Stencil 3200 is used for soldering a package (e.g., package 2800) to PWB 3192. For instance, solder can be provided through openings 3258 and 3262 to a surface of the package or PWB 3192.

Referring back to FIG. 28, the heat spreader standoff height $H_2$ can be dependent on the diameter of solder balls 2885. For example, if solder balls 2885 have a diameter of 0.6 mm before attachment to substrate 2820, then $H_2$ is typically in a range of approximately 0.05 mm to 0.2 mm, though the scope of the invention is not limited in this respect. If $H_2$ is outside the aforementioned range, heat spreader 2850 of flip chip package 2800 may be adequately coupled to PWB 2892. For instance, the thickness of stencil 3200, which dictates the thickness of electrically conductive adhesive substance 2880, can be manipulated to electrically connect heat spreader 2850 to PWB 2892.

3.5 Flip Chip Package Including Heat Spreader Having at Least One Stud

Figure 33:
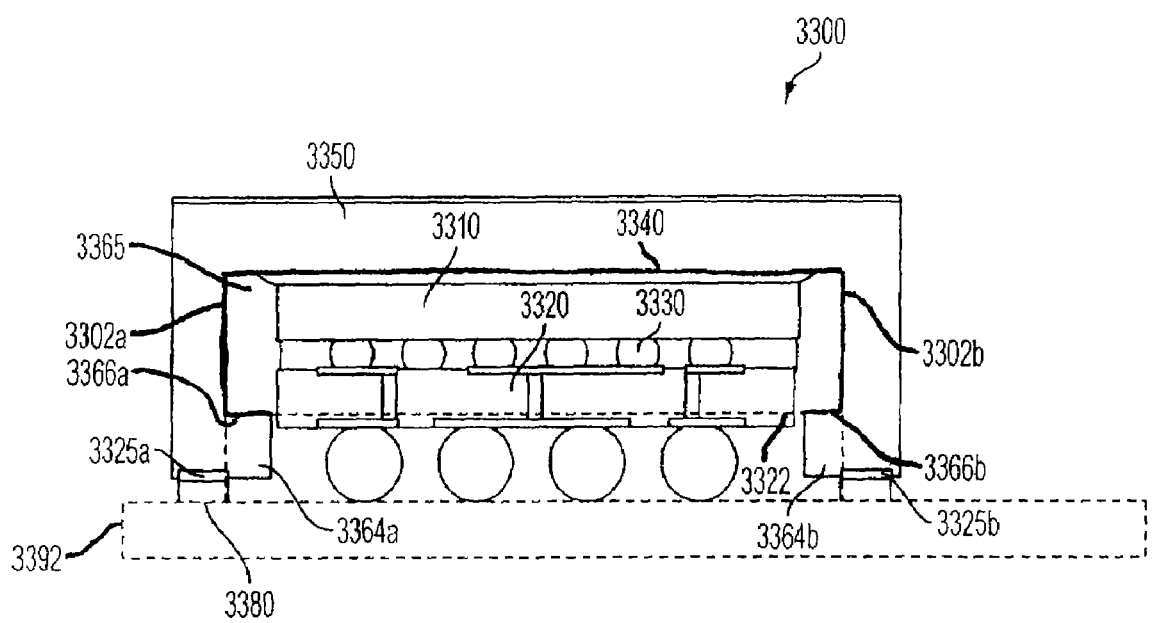
FIG. 33 illustrates a cross-sectional view of an exemplary flip chip BGA package including a heat spreader having studs according to an embodiment of the present invention.

FIG. 33 illustrates a cross-sectional view of an exemplary flip chip BGA package 3300 including a heat spreader 3350 having studs 3364a and 3364b (hereinafter 3364) according to an embodiment of the present invention. Heat spreader 3350 can have any suitable number of studs 3364. Studs 3364 generally are tabs that extend perpendicular to lateral surfaces 3302a and 3302b (hereinafter 3302) of heat spreader 3350, as shown in FIG. 33, though the scope of the invention is not limited in this respect.

Studs 3364 can protect flip chip die 3310 and/or substrate 3320 from the environment. Studs 3364 can secure encapsulate 3365 in a cavity 3340. For instance, an upper surface 3366a or 3366b of respective stud 3364a or 3364b can be in contact with encapsulate 3365.

In the embodiment of FIG. 33, cavity 3340 is defined by laterally opposed surfaces 3302, an upper surface 3304, and a plane 3322 that extends between the intersection of surfaces 3302a and 3366a and the intersection of surfaces 3302b and 3366b of heat spreader 3350. In an embodiment, cavity 3340 is further defined as excluding those spaces occupied by a component of flip chip BGA package 3300, such as flip chip die 3310, substrate 3320, solder bumps 3330, etc. Two other lateral surfaces of cavity 3340 are not shown in FIG. 33.

Heat spreader 3350 is coupled to a PWB 3392 for illustrative purposes. For example, heat spreader 3350 includes pads 3325 that are coupled to PWB 3392 via solder paste 3380.

Figure 34:
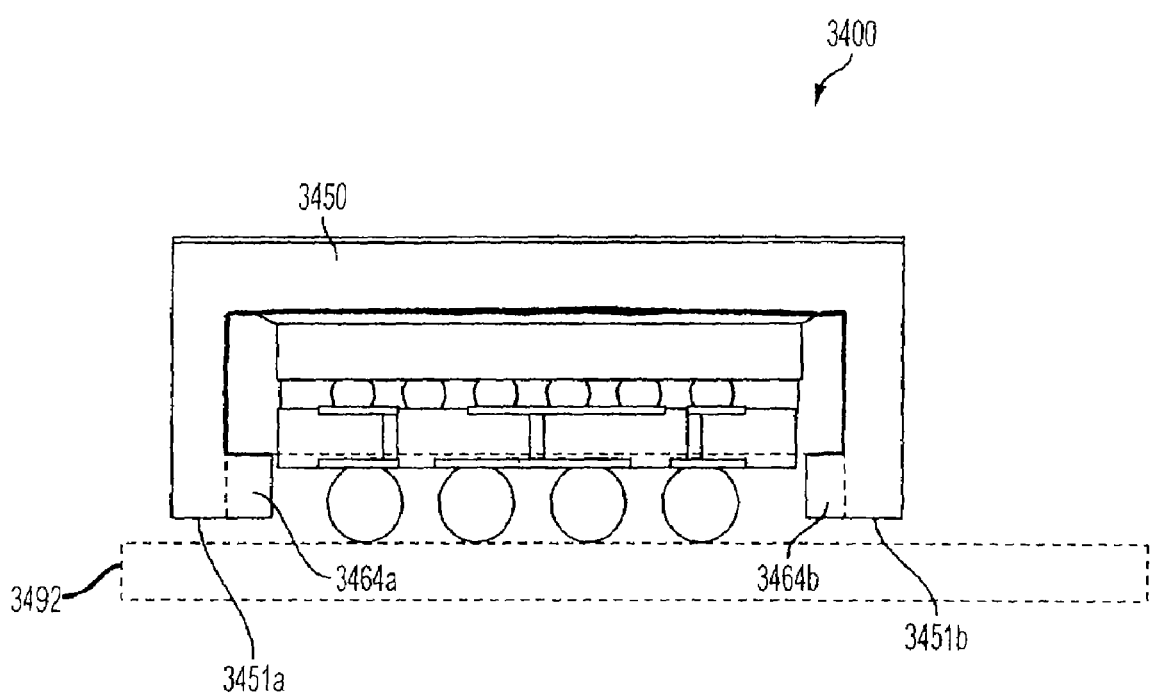
FIG. 34 illustrates a cross-sectional view of another exemplary flip chip BGA package including a heat spreader having studs according to an embodiment of the present invention.

FIG. 34 illustrates a cross-sectional view of another exemplary flip chip BGA package 3400 including a heat spreader 3450 having studs 3464a and 3464b (hereinafter 3464) according to an embodiment of the present invention. Heat spreader 3450 in FIG. 34 does not include pads at surfaces 3451a and 3451b (hereinafter 3451). Heat spreader 3450 is not electrically coupled to a PWB 3492 via solder paste, for example.

4.0 Heat Spreader

A heat spreader can be made using any of a variety of processes. For instance, the heat spreader can be made using one or more metal forming processes, such as hot stamping, cold stamping, forging, etching, etc. In an embodiment, metal etching can be used to make the heat spreader.

Figure 35A:
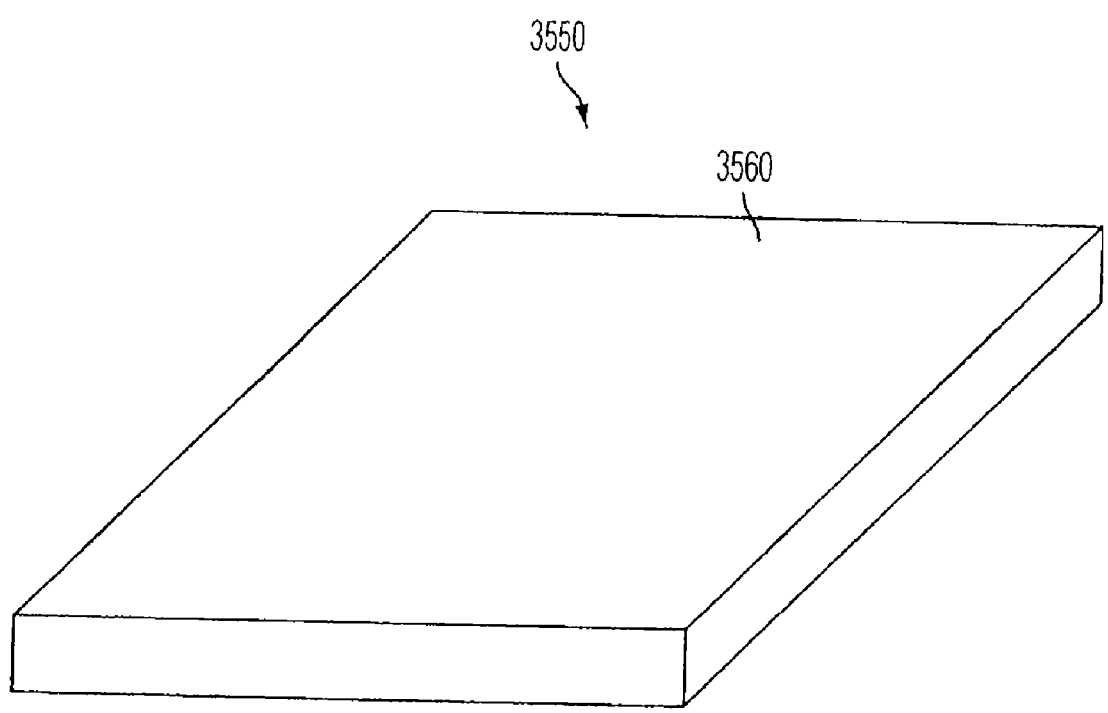
FIG. 35A illustrates a top view of an exemplary heat spreader having a cavity according to an embodiment of the present invention.
Figure 35B:
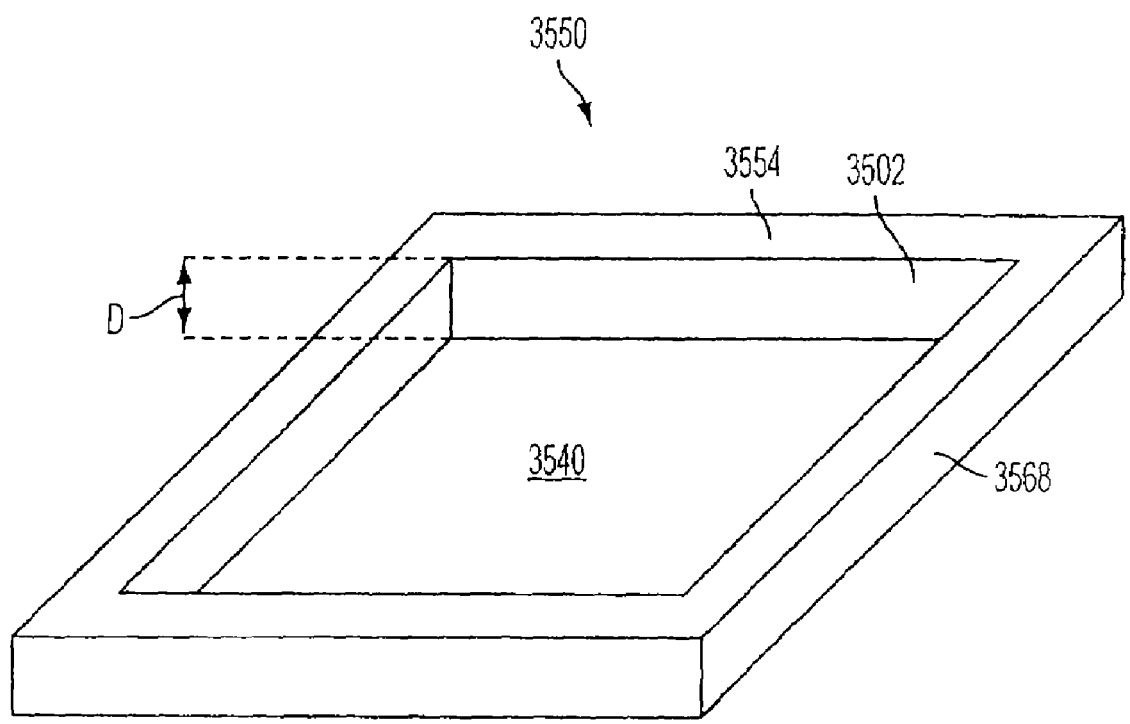
FIG. 35B illustrates a bottom view of the exemplary heat spreader in FIG. 35A according to an embodiment of the present invention.

FIGS. 35A and 35B illustrate top and bottom views respectively of an exemplary heat spreader 3550 having a cavity 3540, according to an embodiment of the present invention. Heat spreader 3550 has a planar top surface 3560, though the scope of the invention is not limited in this respect. In FIG. 35B, a cavity 3540 has a substantially uniform depth D. The perimeter of cavity 3540 can be defined by an inner edge 3502 of wall 3554 surrounding cavity 3540. In FIGS. 35A and 35B, an outer edge of heat spreader 3550 is the same as an outer edge 3568 of wall 3554. For instance, heat spreader 3550 does not extend beyond wall 3554 in a direction perpendicular to surface 3568.

Figure 36A:
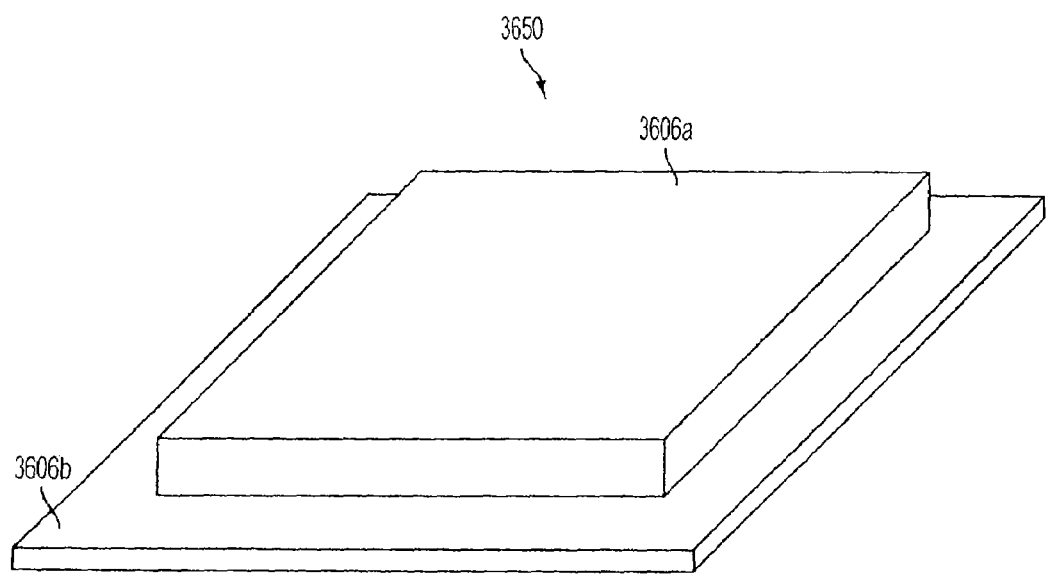
FIG. 36A illustrates a top view of another exemplary heat spreader having a cavity according to an embodiment of the present invention.
Figure 36B:
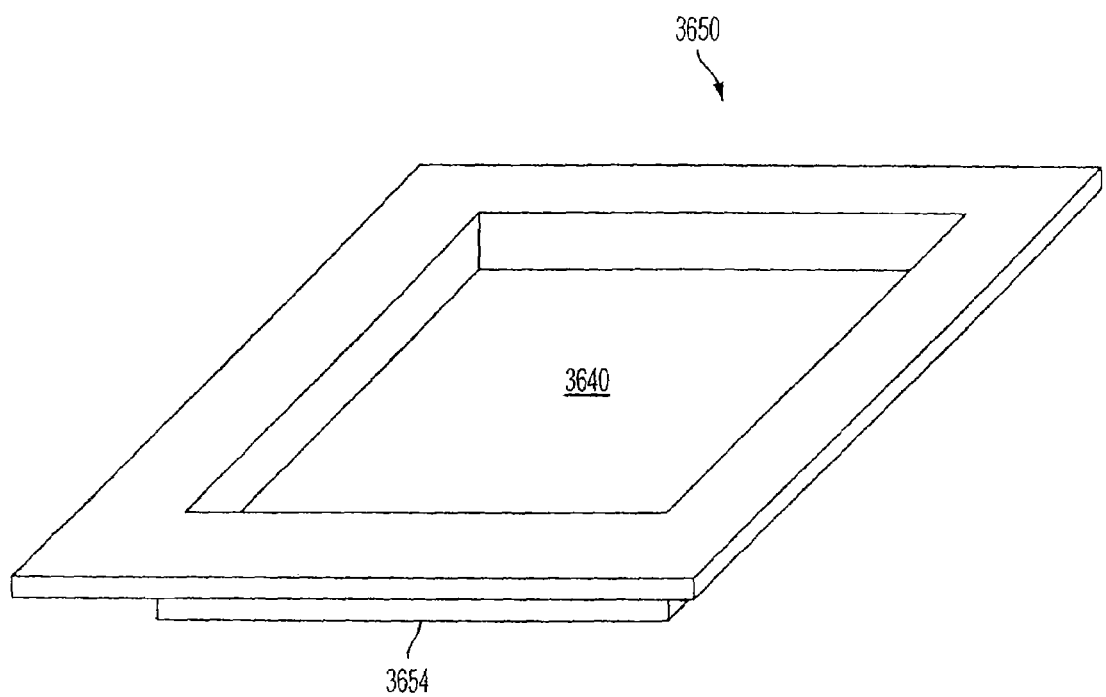
FIG. 36B illustrates a bottom view of the exemplary heat spreader in FIG. 36A according to an embodiment of the present invention

FIGS. 36A and 36B illustrate top and bottom views respectively of another exemplary heat spreader 3650 having a cavity 3640, according to an embodiment of the present invention. The top of heat spreader 3650 has first and second surfaces 3606a and 3606b (hereinafter 3606). First surface 3606a is square for illustrative purposes and can be any shape. Second surface 3606b is a ledge or a step that surrounds first surface 3606a. First and second surfaces 3606 are in different, parallel planes. Cavity 3640 is capable of receiving a flip chip die and a substrate. In FIGS. 36A and 36B, an outer edge of heat spreader 3650 extends beyond an outer edge of a wall 3654 that defines cavity 3640. Heat spreader 3650 can include one or more steps, such as step 1712a or 1712b, as described with respect to FIG. 17.

Figure 37A:
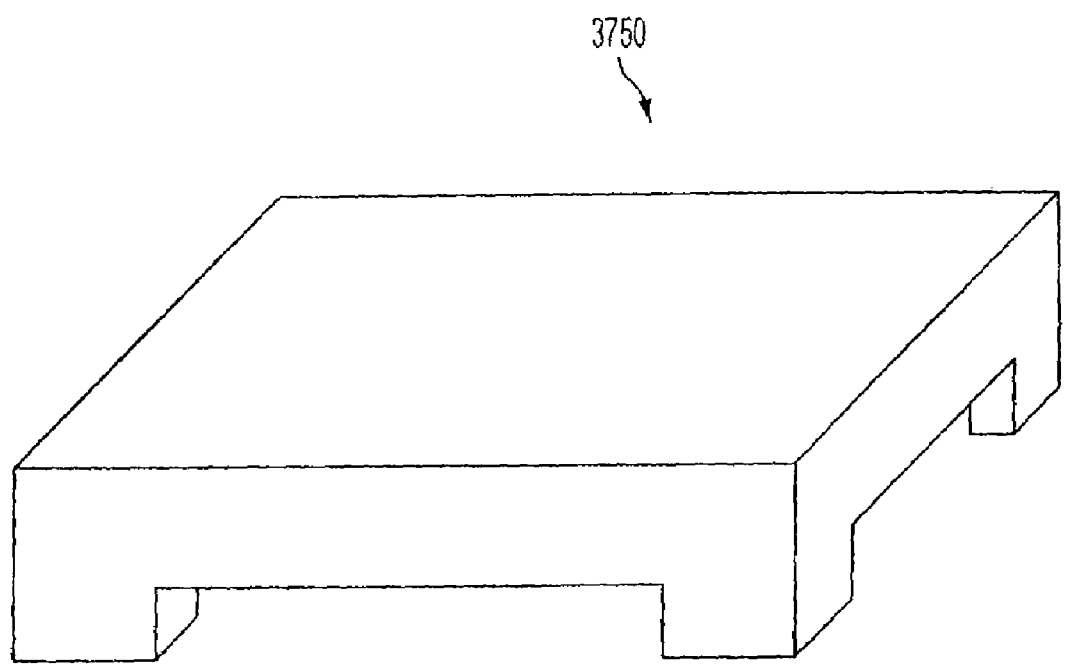
FIG. 37A illustrates a top view of an exemplary heat spreader having a cavity with at least one opening according to an embodiment of the present invention.
Figure 37B:
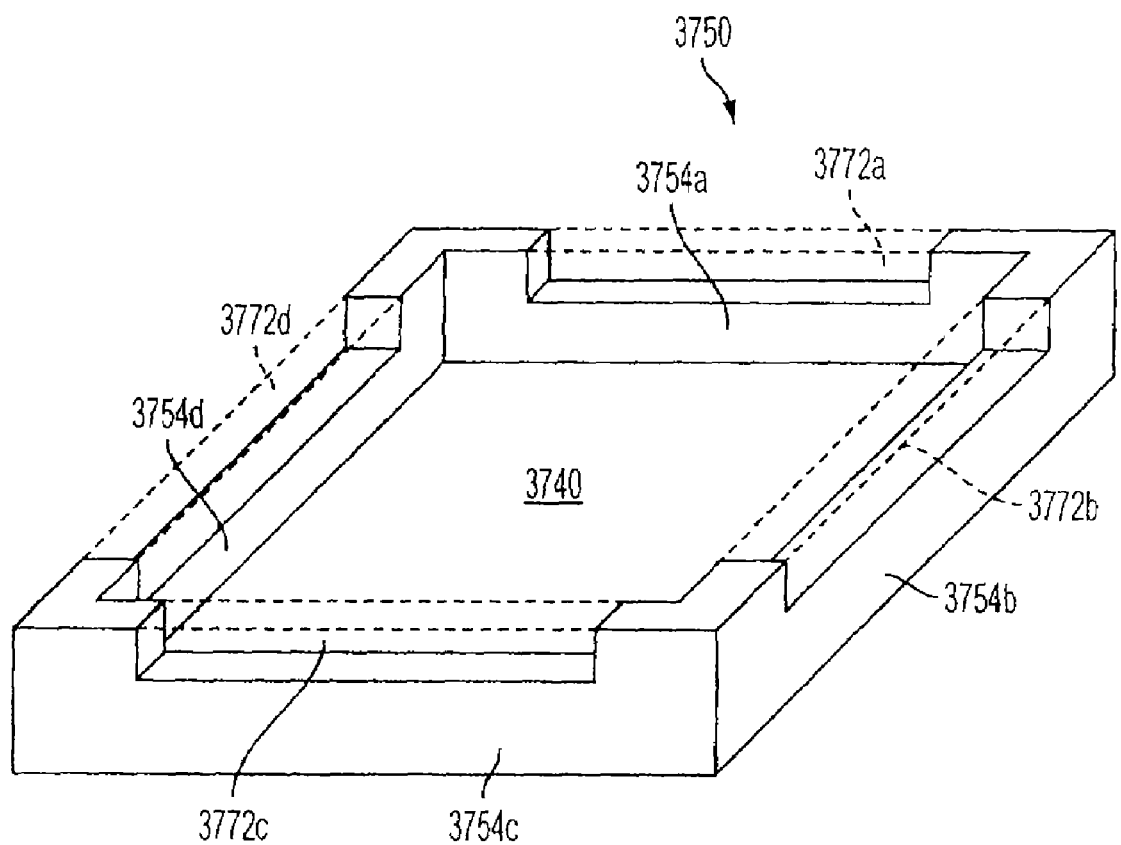
FIG. 37B illustrates a bottom view of the exemplary heat spreader in FIG. 37A according to an embodiment of the present invention.

FIGS. 37A and 37B illustrate top and bottom views of an exemplary heat spreader 3750 having a cavity 3740 with at least one recessed edge portion 3772a, 3772b, 3772c, or 3772d (hereinafter 3772) according to an embodiment of the present invention. Each wall 3754a, 3754b, 3754c, or 3754d (hereinafter 3754) of a complete rim around cavity 3740 includes a recessed edge portion 3772a, 3772b, 3772c, or 3772d, respectively, for illustrative purposes.

Persons skilled in the art will recognize that heat spreader 3750 can include any suitable number of recessed edge portions 3772. For instance, a recessed edge portion 3772 need not necessarily be included in each wall 3754 of heat spreader 3750. Any suitable number of walls 3754 can include a recessed edge portion 3772. According to an embodiment, at least one wall 3754 of heat spreader 3750 includes more than one recessed edge portion 3772.

Figure 37C:
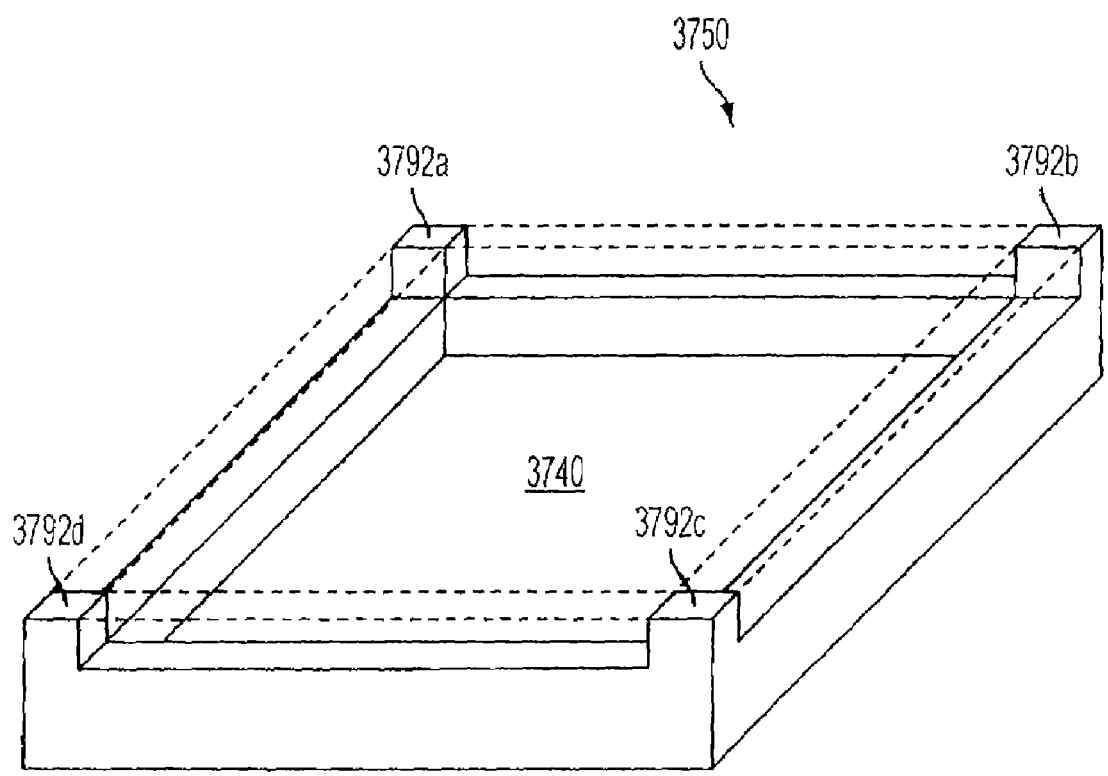
FIG. 37C illustrates an alternative bottom view of the exemplary heat spreader in FIG. 37A according to another embodiment of the present invention.

In FIG. 37B, recessed edge portions 3772 do not extend to adjacent walls 3754 of heat spreader 3750. For example, recessed edge portion 3772b in wall 3754b does not contact wall 3754a or wall 3754c. FIG. 37C illustrates an alternative bottom view of exemplary heat spreader 3750 in FIG. 37A according to another embodiment of the present invention. In FIG. 37C, recessed edge portions 3772 extend to adjacent walls 3754 of heat spreader 3750. For example, recessed edge portion 3772a in wall 3754a extends to wall 3754b and to wall 3754d. Because of this, heat spreader 3750 is considered to have first, second, third, and fourth corner posts 3792a-d.

A heat spreader 3750 having a recessed edge portion 3772 can facilitate inclusion of surface mounted components on a PWB, for example. A component, such as a capacitor, a resistor, or an inductor, can be mounted on a PWB in close proximity to heat spreader 3750. Recessed edge portion 3772a can increase the surface area of the PWB to which the component can be mounted. In the absence of recessed edge portion 3772a, wall 3754a may hinder the component from being mounted on the surface of the PWB. A recessed edge portion 3772 can allow visual inspection of solder joints, for example.

Figure 38A:
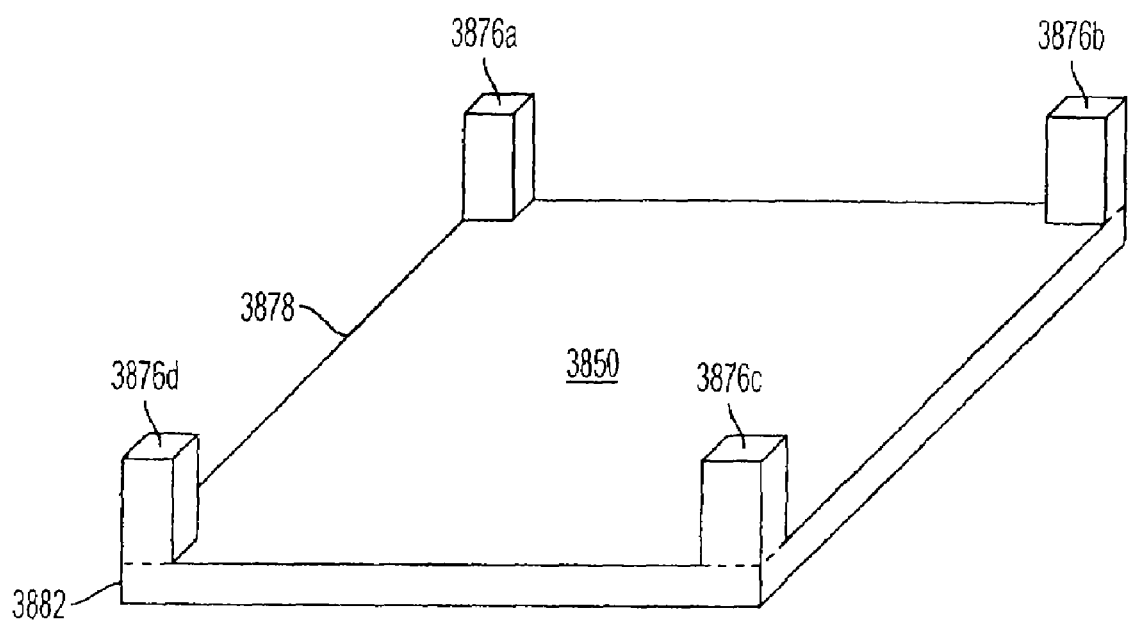
FIG. 38A illustrates a bottom view of an exemplary heat spreader having stands according to an embodiment of the present invention.

FIG. 38A illustrates a bottom view of an exemplary heat spreader 3850 having stands 3876a, 3876b, 3876c, and 3876d (hereinafter 3876), which are also referred to as posts, elongated members, or connecting members, according to an embodiment of the present invention. Stands 3876 are generally disposed along edges 3878 of heat spreader 3850. For instance, stands 3876 can be disposed at corners 3882 of heat spreader 3850, as shown in FIG. 38A. Heat spreader 3850 can include any suitable number of stands 3876. Stands 3876 can structurally support heat spreader 3850, though the scope of the present invention is not limited in this respect. For instance, one or more of stands 3876 can be coupled to a PCB or a PWB. One or more of stands 3876 can be electrically coupled to a ground connection or a power connection of the PCB or the PWB.

Figure 38B:
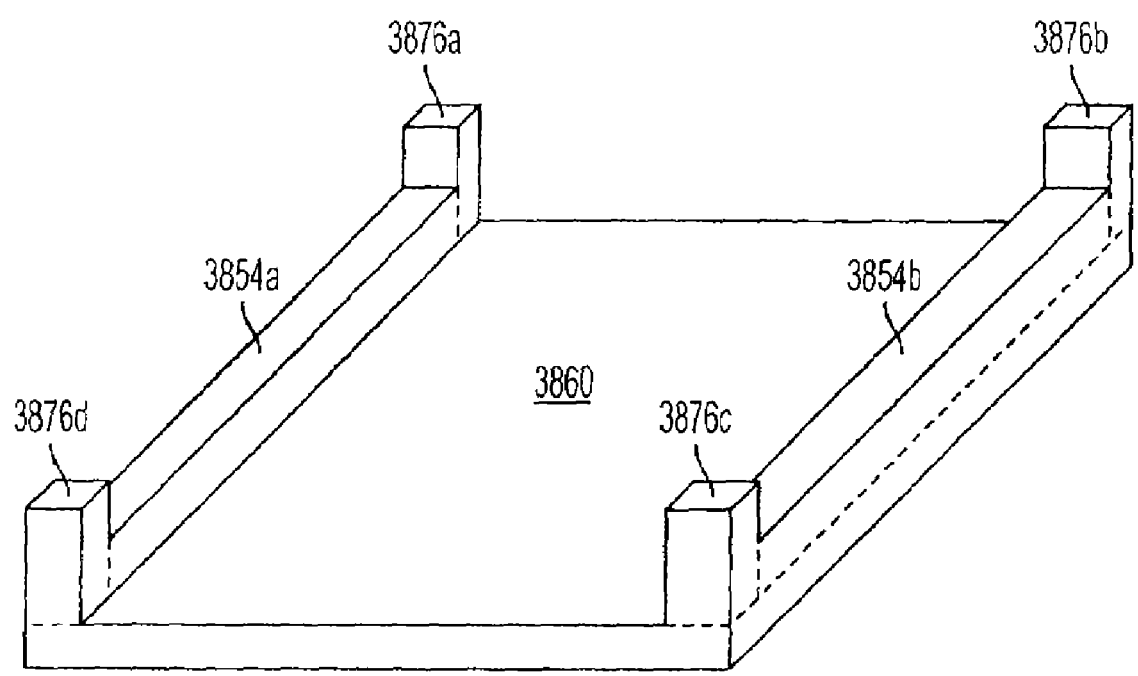
FIG. 38B illustrates a bottom view of the exemplary heat spreader in FIG. 38A having at least one wall according to another embodiment of the present invention.

FIG. 38B illustrates a bottom view of an exemplary heat spreader 3860 similar to heat spreader 3850 in FIG. 38A, having at least one wall 3854 between stands 3876 according to another embodiment of the present invention. In the embodiment of FIG. 38B, heat spreader 3850 includes two walls 3854a and 3854b for illustrative purposes. Heat spreader 3850 can include any suitable number of walls 3854.

Referring to FIG. 38B, wall 3854a is coupled between stands 3876a and 3876d. Wall 3854a need not be coupled to stands 3876a and 3876d. For instance, wall 3854a can be coupled to one of stands 3876a or 3876d, such that a gap is included between wall 3854a and the other of stands 3876a and 3876d. Wall 3854a may not be coupled to either of stands 3876a and 3876d. For example, a first gap can be included between wall 3854a and stand 3876a, and a second gap can be included between wall 3854a and stand 3876d.

Figure 39:
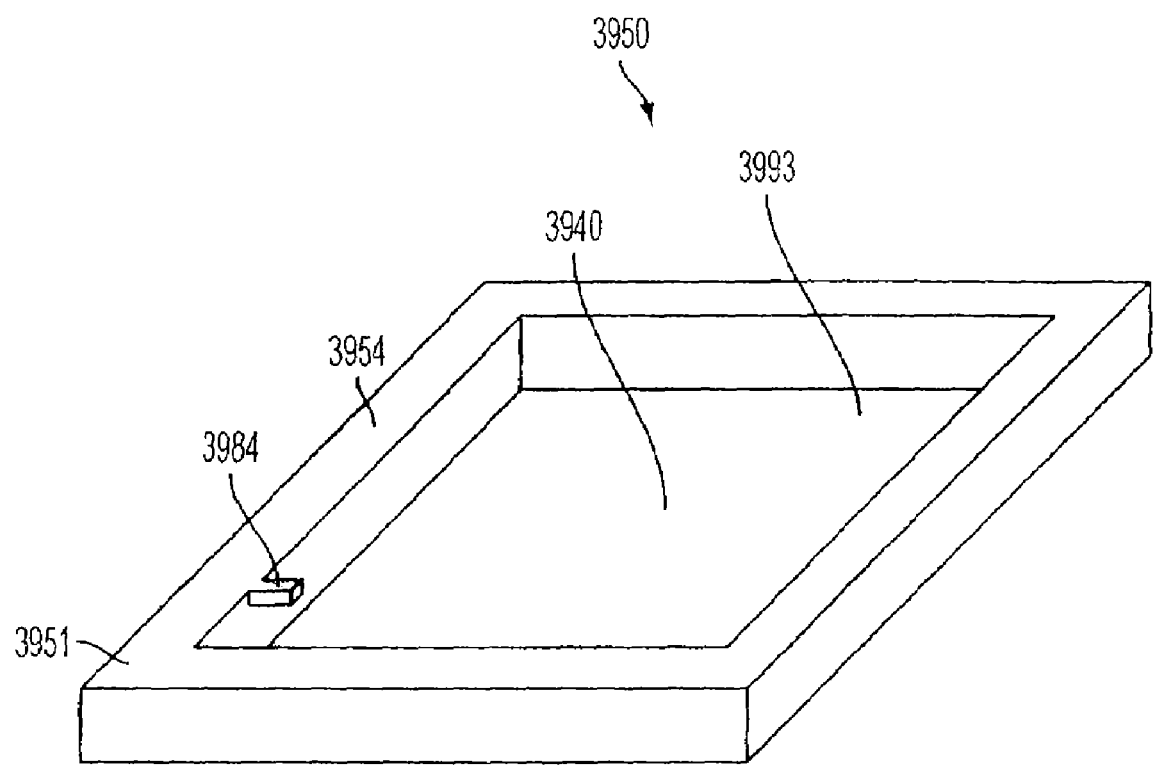
FIG. 39 illustrates a bottom view of an exemplary heat spreader having a stud according to an embodiment of the present invention.

FIG. 39 illustrates a bottom view of an exemplary heat spreader 3950 having a stud 3984 according to an embodiment of the present invention. Stud 3984 is coupled to a wall 3954 of heat spreader 3950. Thus, heat spreader 3950 is generally similar to heat spreader 3350 shown in FIG. 33. Inner surfaces of heat spreader 3950 define a cavity 3940. Stud 3984 generally extends into cavity 3940 or along an edge of cavity 3940. For example, stud 3984 can secure an encapsulate in cavity 3940. The encapsulate can be disposed between stud 3984 and surface 3993 of heat spreader 3950. The encapsulate can extend from a surface 3993 beyond stud 3984. For instance, the encapsulate can surround stud 3984. Any suitable number of studs can be coupled to wall 3954 of heat spreader 3950.

Figure 40:
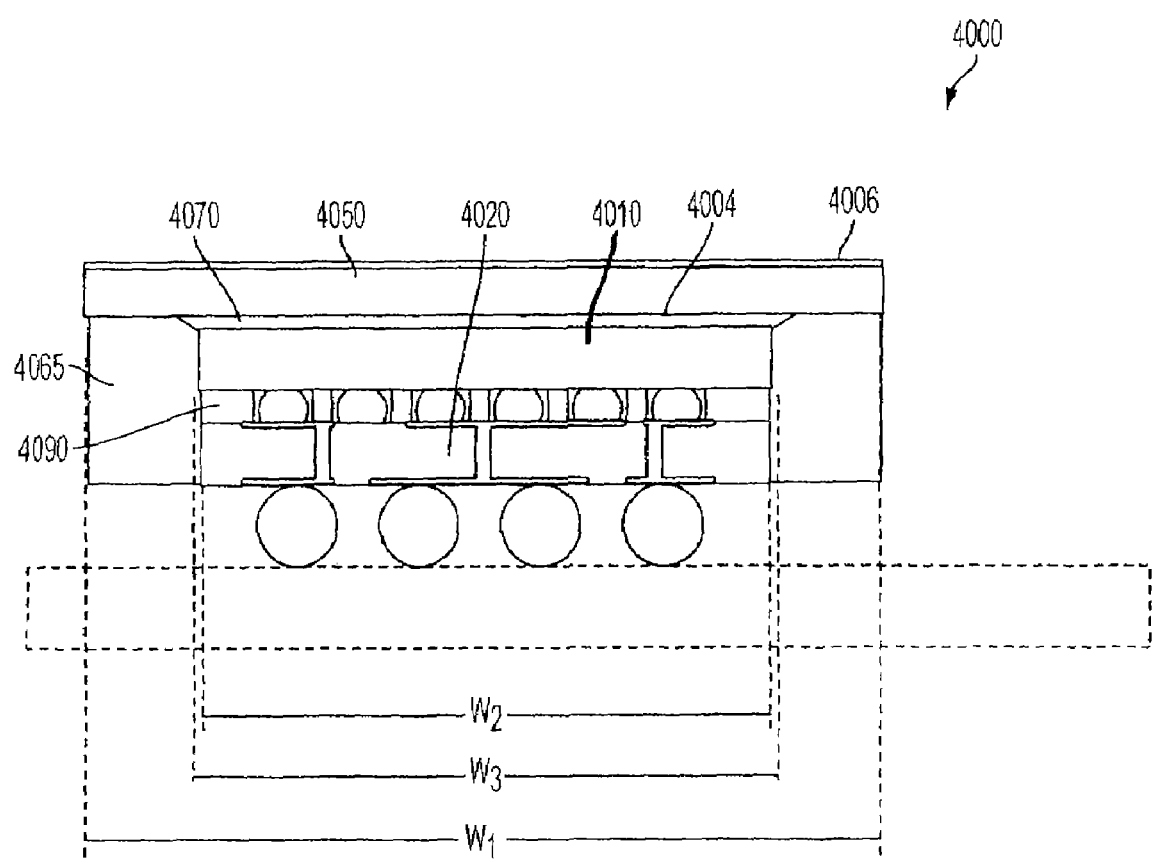
FIG. 40 illustrates a cross-sectional view of an exemplary flip chip BGA package having a planar heat spreader according to an embodiment of the present invention.

FIG. 40 illustrates a cross-sectional view of an exemplary flip chip BGA package 4000 having a planar heat spreader 4050 according to an embodiment of the present invention. Heat spreader 4050 has an upper surface 4006 and a lower surface 4004. Upper surface 4006 is generally substantially flat or planar, though the scope of the invention is not limited in this respect. A black oxide material or oxidation can be formed at lower surface 4004 of heat spreader 4050. The black oxidation can enhance adhesion between heat spreader 4050 and a flip chip die 4010 and/or between heat spreader 4050 and an encapsulate 4065. At least a portion of heat spreader 4050 can be plated with a metal (e.g., nickel, chromium, etc.) or an alloy. For instance, the metal plating can protect heat spreader 4050 against corrosion and/or enhance the appearance of heat spreader 4050.

Referring to FIG. 40, a width $W_1$ of heat spreader 4050 is greater than a width $W_2$ of flip chip die 4010. The width $W_1$ of heat spreader 4050 is greater than the width $W_2$ of a substrate 4020. Flip chip die 4010 and substrate 4020 have approximately the same width for illustrative purposes. In FIG. 40, flip chip BGA package 4000 includes encapsulate 4065 in contact with flip chip die 4010, substrate 4020, surface 4004 of heat spreader 4050, thermally conductive adhesive substance 4070, and underfill 4090, though the scope of the present invention is not limited in this respect. Encapsulate 4065 can be in contact with any one or more of the components (e.g., flip chip die 4010, substrate 4020, etc.) of flip chip BGA package 4000. Encapsulate 4065 can be injected from the underside of flip chip BGA package 4000.

Figure 41A:
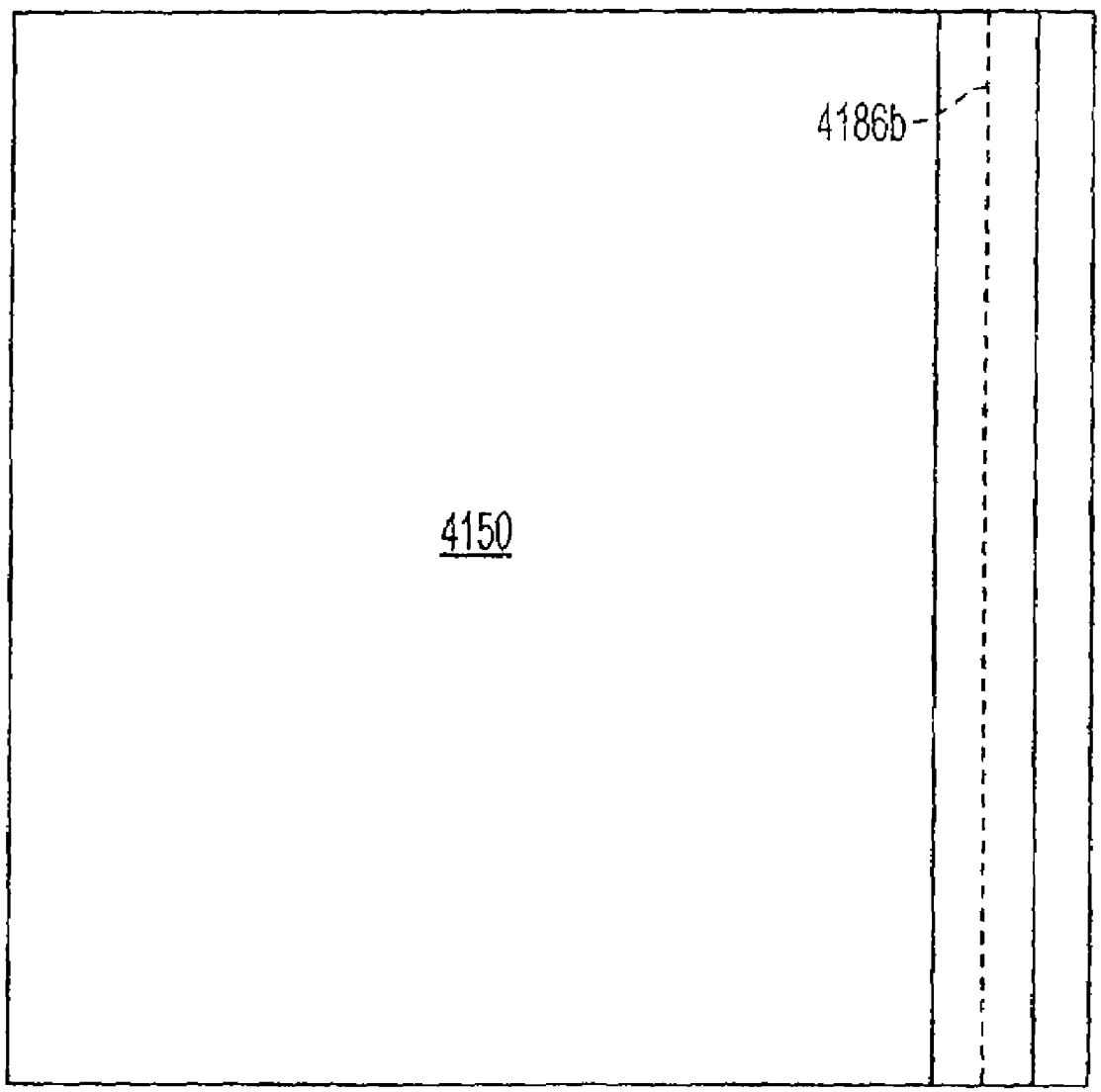
FIG. 41A illustrates a top view of an exemplary heat spreader having one or more securing features according to an embodiment of the present invention.
Figure 41B:
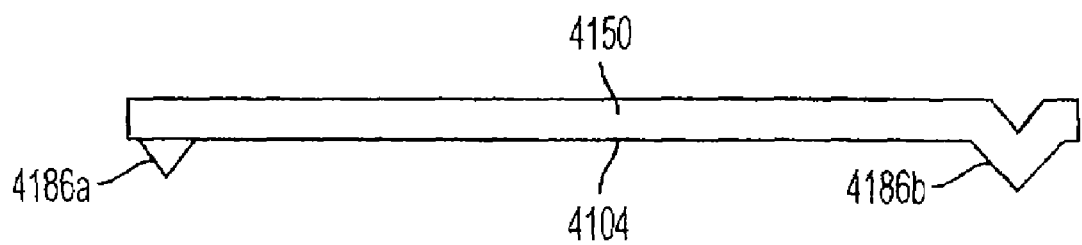
FIG. 41B illustrates a cross-sectional view of the heat spreader in FIG. 41A according to an embodiment of the present invention.

FIGS. 41A and 41B illustrate top and cross-sectional views of an exemplary heat spreader 4150 having one or more securing features 4186, according to an embodiment of the present invention. For instance, securing feature 4186 can facilitate coupling an encapsulate to heat spreader 4150. Heat spreader 4150 is square for illustrative purposes, though heat spreader 4150 (and all other heat spreaders described herein) can be any shape. For instance, heat spreader 4150 can be rectangular, circular, octagonal, spoke-like, etc. Heat spreader 4150 can have cut-outs, notches, steps on one or more edges of heat spreader 4150, etc. Utilizing heat spreader 4150 can reduce the cost of assembling a flip chip BGA package, improve reliability of the flip chip BGA package, and/or enhance mechanical, thermal, electrical, or second-level (i.e., board level) reliability, to provide some examples.

As shown in FIG. 41B, securing feature 4186 can be a protruding tab 4186a or an indentation 4186b. Tab 4186a and/or indentation 4186b can beneficially hinder an encapsulate from moving laterally with respect to heat spreader 4150. In FIG. 41B, tab 4186a is shown having a protruding triangular cross-section, and indentation 4186b is shown having an indented triangular cross-section. Tab 4186a or indentation 4186b can be any suitable shape, including triangular, square, rectangular, hexagonal, etc. Securing features 4186a and 4186b (hereinafter 4186) are often disposed at or near edges or corners of heat spreader 4150, though securing features 4186 can be located anywhere at surface 4104 of heat spreader 4150. Furthermore, securing features 4186 can extend the length of heat spreader 4150 (as shown in FIG. 41A) or any portion thereof.

Figure 42:
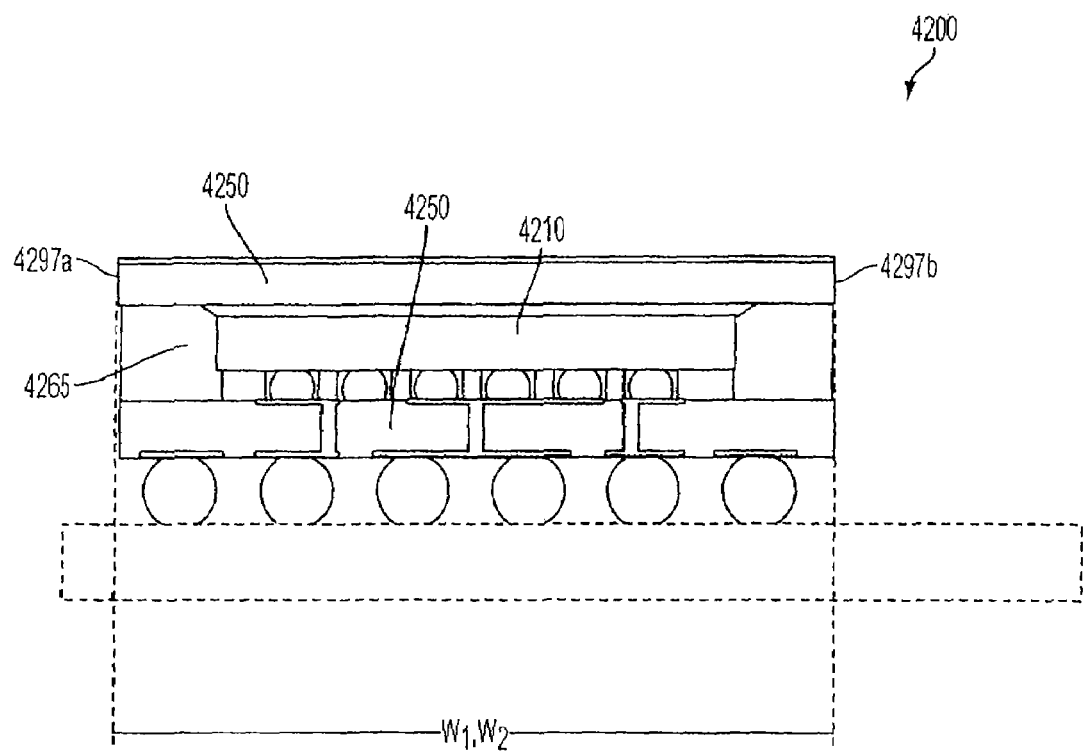
FIG. 42 illustrates a cross-sectional view of another exemplary flip chip BGA package having a planar heat spreader according to an embodiment of the present invention.

FIG. 42 illustrates a cross-sectional view of another exemplary flip chip BGA package 4200 having a planar heat spreader 4250 according to an embodiment of the present invention. In FIG. 42, the width $W_1$ of heat spreader 4250 and the width $W_2$ of a substrate 4220 are approximately the same. One advantage of heat spreader 4250 and substrate 4220 having the same width is that heat spreader 4250 and substrate 4220 can both be made in strip format during a packaging process, for example. However, no opening is shown in heat spreader 4250 or in substrate 4220 through which encapsulate 4265 can be injected (when formed in a strip format).

Figure 43:
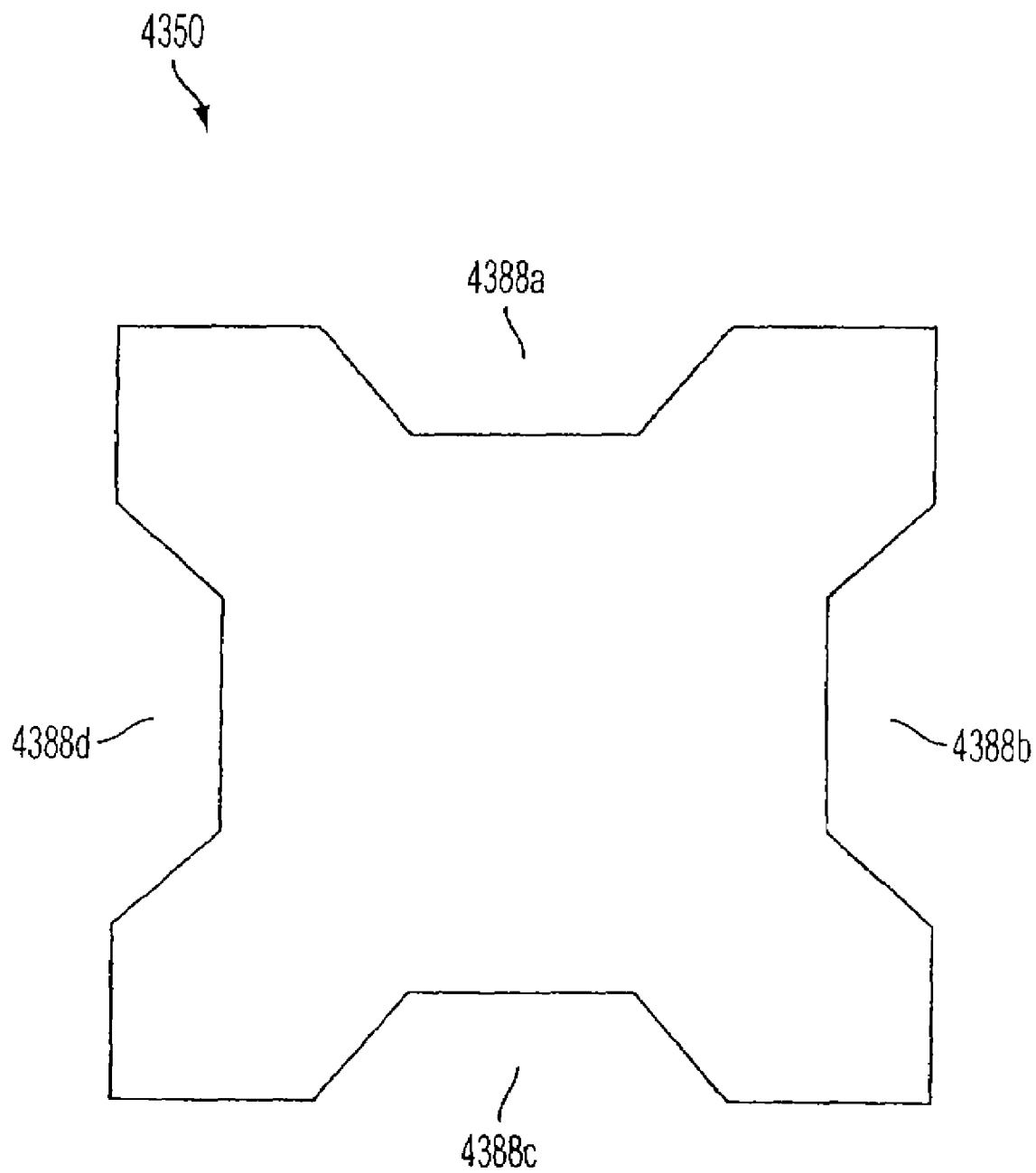
FIG. 43 illustrates a top view of an exemplary heat spreader having at least one opening according to an embodiment of the present invention.

FIG. 43 illustrates a top view of an exemplary heat spreader 4350 having at least one recessed edge portion 4388a, 4388b, 4388c, or 4388d according to an embodiment of the present invention. Recessed edge portions 4388a, 4388b, 4388c, and 4388d (hereinafter 4388) can allow encapsulate to be injected into a flip chip BGA package, such as flip chip BGA package 4200 in FIG. 42. A recessed edge portion 4388 is generally at or near an edge of heat spreader 4350. However, alternatively, one or more non-edge openings can be formed through heat spreader 4350 for insertion of encapsulate. In the embodiment of FIG. 43, heat spreader 4350 includes a recessed edge portion 4388 at each of its four edges. Heat spreader 4350 can include any suitable number of recessed edge portions 4388. Recessed edge portions 4388 can be any shape.

Figure 44:
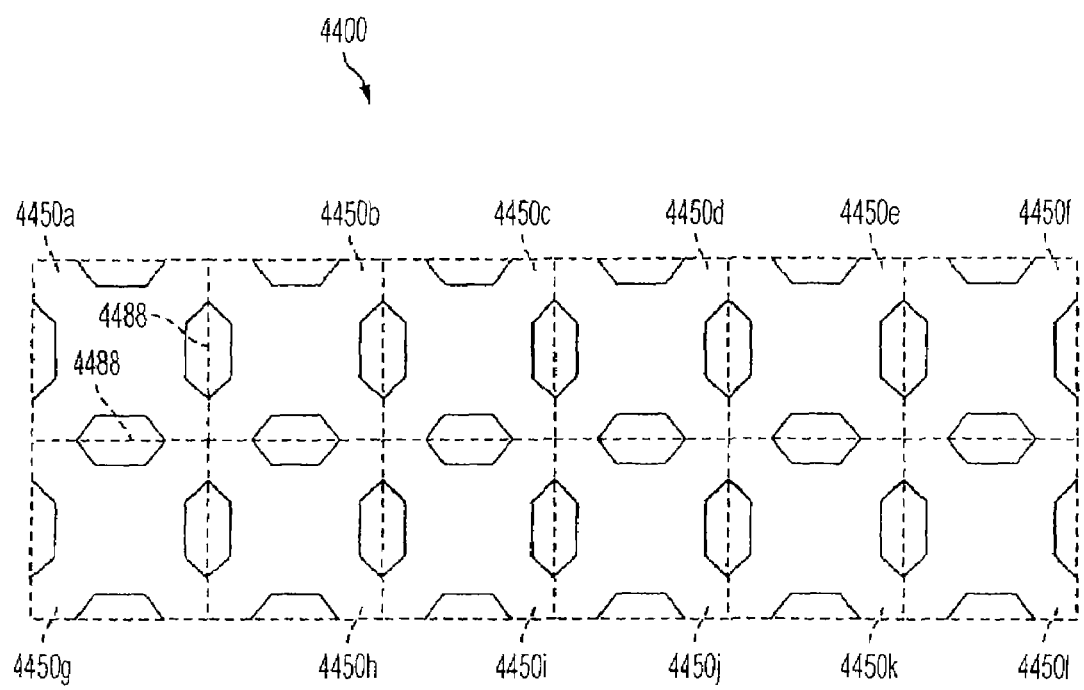
FIG. 44 illustrates a top view of an exemplary panel of heat spreaders according to an embodiment of the present invention.

Recessed edge portions 4388 can facilitate singulation/separation of flip chip BGA packages manufactured in strip or panel format, for example. In the embodiment of FIG. 44, a panel 4400 of heat spreaders 4450a-4450l (hereinafter 4450) includes openings 4488 between heat spreaders 4450. However, openings 4488 need not necessarily be between heat spreaders 4450. Openings 4488 can be made by drilling, punching, cutting, or etching, to provide some examples. As shown in FIG. 44, each opening 4488 forms a pair of recessed edge portions, one for each of two adjacent heat spreaders 4350.

Figure 45:
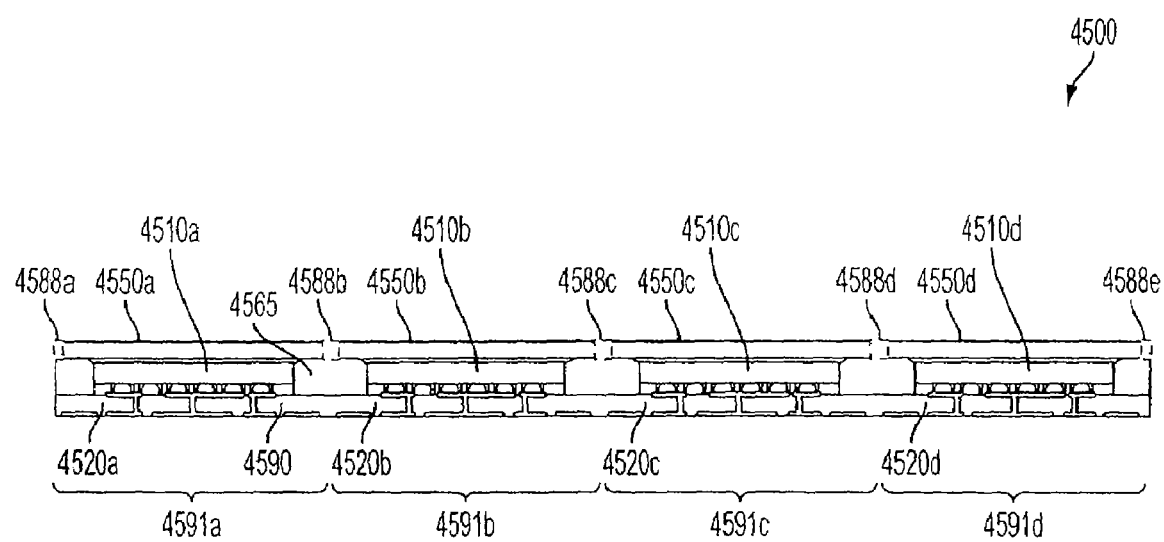
FIG. 45 illustrates a cross-sectional view of an exemplary strip or panel of flip chip BGA packages according to an embodiment of the present invention.

FIG. 45 illustrates a cross-sectional view of an exemplary strip 4500 of flip chip BGA packages 4591a, 4591b, 4591c, and 4591d (hereinafter 4591) according to an embodiment of the present invention. Strip 4500 includes a strip of heat spreaders 4550a, 4550b, 4550c, and 4550d (hereinafter 4550) and a strip of corresponding substrates 4591a, 4591b, 4591c, and 4591d (hereinafter 4591). Utilizing strips or panels of heat spreaders 4550 and/or substrates 4591 can improve assembly efficiency or reduce assembly cost.

Dice 4510a, 4510b, 4510c, and 4510d (hereinafter 4510) are disposed between respective heat spreaders 4550 and substrates 4591. For instance, flip chip BGA package 4591a includes die 4510a coupled between heat spreader 4550a and substrate 4520a. Flip chip BGA package 4591b includes die 4510b coupled between heat spreader 4550b and substrate 4520b, and so on. Openings 4588a-4588e (hereinafter 4588) are shown between flip chip BGA packages 4591.

The cross-sectional view of FIG. 45 shows four flip chip BGA packages 4591 for illustrative purposes. Strip 4500 can include any number of flip chip BGA packages 4591. For example, strip 4500 can be part of a panel, which includes multiple strips of flip chip BGA packages. Note that any BGA package described herein, or any combination thereof, can be formed in a strip format.

5.0 Example Embodiments for Forming BGA Packages

Figure 46:
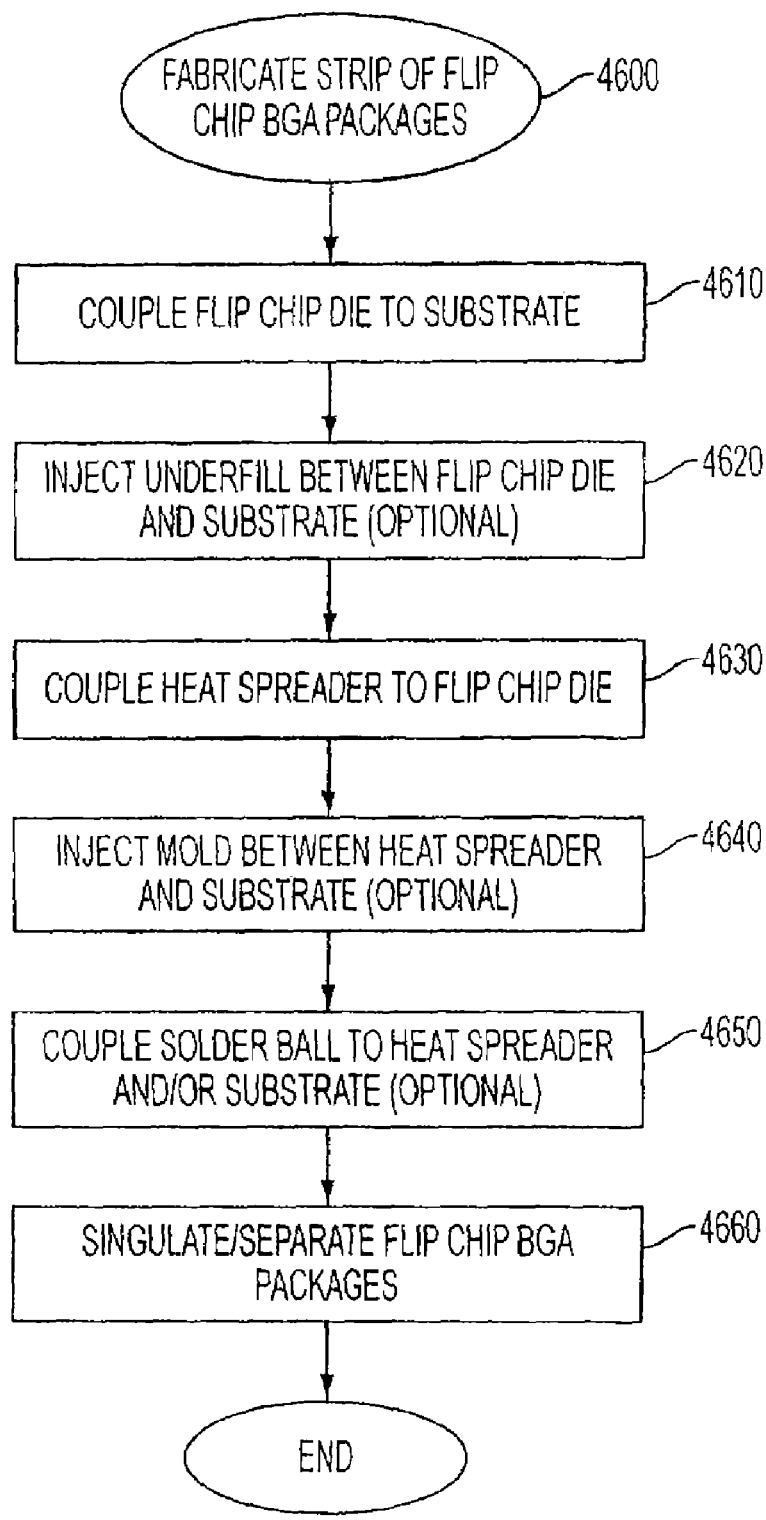
FIG. 46 illustrates a flow chart of a method of fabricating a strip or panel of flip chip BGA packages according to an embodiment of the present invention.
Figure 47:
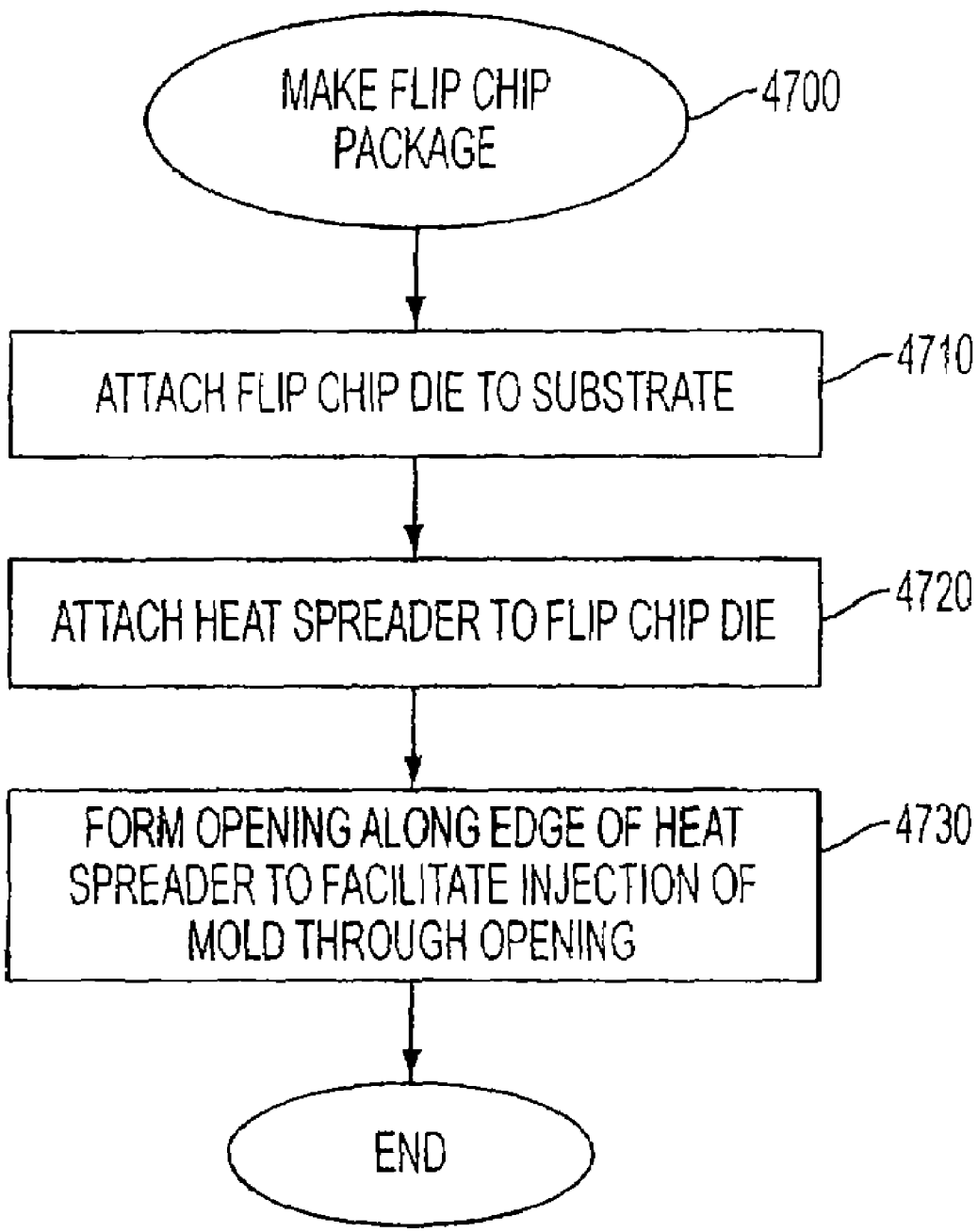
FIG. 47 illustrates a flow chart of a method of making a flip chip package according to an embodiment of the present invention.

FIGS. 46 and 47 illustrate example flowcharts for forming BGA packages according to embodiments of the present invention. The invention, however, is not limited to the description provided by flowcharts 4600 or 4700. Rather, it will be apparent to persons skilled in the relevant art(s) from the teachings provided herein that other functional flows are within the scope and spirit of the present invention. Steps 4610-4660 of flowchart 4600 and steps 4710-4730 of flowchart 4700 need not necessarily be performed in any particular order.

Flowcharts 4600 and 4700 will be described with continued reference to example strip 4500 or flip chip BGA package 4200 described above in reference to FIG. 45 or 42, respectively. The invention, however, is not limited to these embodiments. In fact, flowcharts 4600 and 4700 can be applied and/or adapted to forming any of the BGA packages (or combinations thereof) described herein.

FIG. 46 illustrates a flow chart 4600 of a method of fabricating a strip or panel of a flip chip BGA packages according to an embodiment of the present invention. Flow chart 4600 can show steps of fabricating strip 4500 of flip chip BGA packages 4591 in FIG. 45, for example. Referring to FIG. 46, a flip chip die 4510 is coupled at block 4610 to a substrate 4520. Flip chip die 4510 can be coupled to substrate 4520 via solder bumps, for example. Substrate 4520 can be part of a strip or panel of substrates. For instance, a plurality of flip chip dice can be coupled to the strip or panel of substrates. Underfill 4590 can be injected at block 4620 between flip chip die 4510 and substrate 4520.

A heat spreader 4550 is coupled at block 4630 to flip chip die 4510. Heat spreader 4550 can be part of a strip or panel of heat spreaders. For instance, the strip or panel of heat spreaders can be coupled to a plurality of flip chip dice.

An encapsulate 4565 can be injected at block 4640 between heat spreader 4550 and substrate 4520. For example, encapsulate 4565 can be injected into a cavity defined by heat spreader 4550 and substrate 4520. Encapsulate 4565 can be injected through one or more openings 4588 in heat spreader 4550. According to an embodiment, steps 4620 and 4640 are switched. For instance, step 4640 can be performed before 4620. One or more solder balls can be coupled at block 4650 to heat spreader 4550 and/or substrate 4520.

Flip chip BGA packages 4591 are singulated/separated at block 4660. For example, flip chip BGA packages 4591 can be singulated/separated by sawing, punching, and/or cutting. According to an embodiment, the strips or panels of heat spreaders and substrates are singulated/separated at approximately the same time. For example, the strips or panels of heat spreaders and substrates can be singulated/separated in response to encapsulate 4565 being injected or in response to solder balls being attached to substrate 4520.

Referring to FIG. 47, a flip chip die 4210 is attached at block 4710 to a substrate 4220. For example, flip chip die 4210 can be attached to substrate 4220 using a reflow process. Substrate 4220 can be part of a strip or panel of substrates, though the scope of the invention is not limited in this respect. For instance, substrate 4220 may not be coupled to another substrate. Substrate 4220 can include one or more contact pads at a first surface electrically coupled through substrate 4220 to one or more solder ball pads at a second surface of substrate 4220.

A heat spreader 4250 is attached at block 4720 to flip chip die 4210. According to a first embodiment, heat spreader 4250 is part of a strip or panel of heat spreaders. According to a second embodiment, heat spreader 4250 is not connected to another heat spreader. Heat spreader 4250 can at least partially laterally surround flip chip die 4210 and/or substrate 4220. Heat spreader 4250 can be electrically coupled to substrate 4220.

In FIG. 47, an opening is formed at block 4730 along an edge 4297a or 4297b of heat spreader 4250 to facilitate injection of an encapsulate 4265 through the opening. The opening need not necessarily be along edge 4297a or 4297b of heat spreader 4250. The opening can be at any suitable location of heat spreader 4250. The opening can be any suitable shape, such as a square, rectangle, circle, semicircle, hexagon, etc. The opening can have an edge that is parallel with an edge 4297a or 4297b of heat spreader 4250. According to an embodiment, the opening is formed between adjacent heat spreaders of a heat spreader strip. For instance, heat spreader 4250 can be part of a heat spreader panel. Encapsulate 4265 can be injected through the opening. For instance, encapsulate 4265 can be injected in response to attaching heat spreader 4250 to flip chip die 4210.

The method described above with respect to flow chart 4700 in FIG. 47 can be repeated to make other flip chip packages in a strip or panel of flip chip packages. Alternatively, flip chip BGA package 4200 may be made independently from other flip chip packages.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. An integrated circuit (IC) package, comprising:
   a substrate including a plurality of contact pads on a first surface electrically coupled through the substrate to a plurality of solder ball pads on a second surface of the substrate;
   an IC die having first and second opposing surfaces, wherein the second surface of the IC die is an active surface of the IC die, and wherein the second surface of the IC die is mounted to the first surface of the substrate; and
   a heat spreader, wherein the heat spreader includes a first portion that is coupled to the IC die and a second portion that at least partially laterally surrounds the IC die, and wherein the heat spreader further includes a stud that extends from the second portion of the heat spreader wherein the heat spreader defines a cavity that is configured to receive the IC die, and wherein the stud extends into the cavity.

2. The IC package of claim 1, wherein the stud extends substantially perpendicular to the portion that at least partially laterally surrounds the IC die.

3. The IC package of claim 1, wherein the heat spreader is in contact with the first surface of the substrate.

4. The IC package of claim 3, wherein the heat spreader includes a step that contacts the first surface of the substrate.

5. The IC package of claim 1, wherein the second portion of the heat spreader completely laterally surrounds the cavity.

6. The IC package of claim 1, wherein the portion at least partially laterally surrounds the substrate.

7. An integrated circuit (IC) package, comprising:
   a substrate including a plurality of contact pads on a first surface electrically coupled through the substrate to a plurality of solder ball pads on a second surface of the substrate;
   an IC die having first and second opposing surfaces, wherein the second surface of the IC die is an active surface of the IC die, and wherein the second surface of the IC die is mounted to the first surface of the substrate;
   an encapsulate; and
   a heat spreader including a first portion that is coupled to the first surface of the IC die and a second portion that at least partially laterally surrounds the IC die, wherein the heat spreader includes a tab or an indentation to secure the encapsulate, wherein the tab or indentation extends from the second portion of the heat spreader, wherein the heat spreader defines a cavity that is configured to receive the IC die, and wherein the tab or indentation extends into the cavity.

8. An integrated circuit (IC) package, comprising:
   a substrate including a plurality of contact pads on a first surface electrically coupled through the substrate to a plurality of solder ball pads on a second surface of the substrate, wherein the substrate has a first width;
   an IC die having first and second opposing surfaces, wherein the second surface of the IC die is an active surface of the IC die, and wherein the second surface of the IC die is mounted to the first surface of the substrate, and wherein the IC die has a second width that is less than or equal to the first width; and
   a heat spreader defining a cavity that is configured to receive the IC die and at least a portion of the substrate, wherein the heat spreader includes a first portion that is coupled to the first surface of the IC die and a second portion that at least partially laterally surrounds the IC die, wherein the heat spreader further includes a stud that extends from the second portion of the heat spreader, and wherein the stud extends into the cavity.

9. The IC package of claim 8, wherein the heat spreader is in contact with the first surface of the substrate.

10. The IC package of claim 9, wherein the heat spreader includes a step that contacts the first surface of the substrate.

11. The IC package of claim 8, wherein an encapsulate is included in the cavity.

12. The IC package of claim 8, wherein the IC package further includes means for electrically coupling the second portion to a printed circuit board or a printed wire board.

13. The IC package of claim 8, wherein the stud extends substantially perpendicular to the at least one wall that is adjacent to the cavity.

14. The IC package of claim 8, wherein one or more gaps between the heat spreader and the substrate facilitate injection of an encapsulate.

15. The IC package of claim 8, wherein the substrate includes one or more openings to facilitate injection of an encapsulate.

* * * * *